(12) United States Patent
Campanale et al.

(10) Patent No.: US 6,587,913 B2
(45) Date of Patent: Jul. 1, 2003

(54) INTERLEAVED MEMORY DEVICE FOR BURST TYPE ACCESS IN SYNCHRONOUS READ MODE WITH THE TWO SEMI-ARRAYS INDEPENDENTLY READABLE IN RANDOM ACCESS ASYNCHRONOUS MODE

(75) Inventors: Fabrizio Campanale, Bari (IT); Salvatore Nicosia, Palermo (IT); Francesco Tomaiuolo, Monte Sant' Angelo (IT); Luca Giuseppe De Ambroggi, Catania (IT); Promod Kumar, Motta S. Anastasia (IT); Luigi Pascucci, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 215 days.

(21) Appl. No.: 09/773,300

(22) Filed: Jan. 31, 2001

(65) Prior Publication Data

US 2001/0033245 A1 Oct. 25, 2001

(30) Foreign Application Priority Data

Jan. 31, 2000 (EP) .......................................... 00830068

(51) Int. Cl.$^7$ ............................................... G06F 12/00
(52) U.S. Cl. ...................... 711/5; 711/157; 365/230.09; 365/239; 365/230.03; 365/233.5; 365/233; 365/230.02
(58) Field of Search ................ 711/5, 157; 365/185.09, 365/230.09, 233, 239, 233.5, 230.03, 230.02

(56) References Cited

U.S. PATENT DOCUMENTS

| 5,559,990 | A | | 9/1996 | Cheng et al. | ................ | 395/484 |
|---|---|---|---|---|---|---|
| 5,572,463 | A | * | 11/1996 | Akaogi et al. | ......... | 365/185.01 |
| 5,596,539 | A | | 1/1997 | Passow et al. | ............... | 365/210 |
| 5,696,917 | A | | 12/1997 | Mills et al. | .................. | 395/401 |
| 5,966,724 | A | | 10/1999 | Ryan | .......................... | 711/105 |
| 6,130,853 | A | * | 10/2000 | Wang et al. | ........... | 365/230.06 |
| 6,470,431 | B2 | * | 10/2002 | Nicosia et al. | ............... | 711/157 |

FOREIGN PATENT DOCUMENTS

| EP | 0561370 | 9/1993 |
|---|---|---|
| EP | 0961283 | 12/1999 |

* cited by examiner

Primary Examiner—Do Hyun Yoo
Assistant Examiner—Ngoc V Dinh
(74) Attorney, Agent, or Firm—Allen, Dyer, Doppelt Milbrath & Gilchrist, P.A.; Lisa K. Jorgenson

(57) ABSTRACT

A multipurpose memory device suitable for a broader range of applications, whether requiring the reading of data in an asynchronous mode with random access (as in a standard memory) or in a synchronous sequential mode with sequential or burst type access, is capable of recognizing the mode of access and the mode of reading that is currently required by the microprocessor. The memory device self-conditions its internal circuitry as a function of such a recognition in order to read data in the requested mode without requiring the use of additional external control signals and/or implying a penalization in terms of access time and reading time compared to those which, for the same fabrication technology and state of the art design, may be attained with memory devices specifically designed for either one or the other mode of operation.

53 Claims, 38 Drawing Sheets

INTERLEAVED MEMORY DEVICE FOR BURST TYPE ACCESS IN SYNCHRONOUS READ MODE WITH THE TWO SEMI-ARRAYS INDEPENDENTLY READABLE IN RANDOM ACCESS ASYNCHRONOUS MODE

FIELD OF THE INVENTION

The present invention relates in general to memory devices, and, in particular, to an interleaved memory readable in a synchronous mode by successive locations with a sequential type of access commonly referred to as burst mode, and to a standard memory read in a random access asynchronous mode with fast access times.

BACKGROUND OF THE INVENTION

In a standard memory a read cycle is defined from a request of data effected by way of the input of a new address to the final output of the bits stored in the addressed location (byte, word, etc.). Internally, the reading process evolves through several steps. These steps include the acquisition of the new address to their decoding, to the generation of synchronizing pulses of the sensing circuits, to the output of the read data, and the like. The fundamental steps of a read cycle and the typical control signals that are used for managing it are depicted in FIG. 1.

The ATD (Address Transition Detection) signal recognizes a change of the address input by the external circuitry and, therefore, the new access request initiates a new read cycle. After enabling the sense amplifiers by way of the signal SAenable, an equalization of the sensing circuitry takes place at the end of which, as timed by the signal EQZ, the effective reading of the memory cells takes place. Finally, after a certain interval of time that may vary from device to device, by way of a signal SAlatch, the recording of the read data into the latches in cascade to the sense amplifiers takes place. This is from where the read word may be transferred to the output buffers.

In memory devices designed for a synchronous read mode with a sequential type (burst) of access, the reading process exploits the fact that the reading takes place by successive locations. That is, the subsequent memory location to be read and, therefore, its address is predictable from the address of the location being currently read. A subgroup of these sequential (burst) synchronous read mode memories is represented by the so-called interleaved memories. A burst access interleaved memory is described in U.S. Pat. No. 5,559,990, for example.

In this type of memory, the cell array is divided in two semi-arrays or banks, each having its own read circuitry. The read streams of the two banks are thereafter superimposed though, according to one of the most commonly followed approaches. They are outphased from each other, while on one of the two banks or semi-arrays the steps of evaluation and transfer of the data to the output are being performed. On the other bank or semi-array (the next location to be addressed) a new read cycle may be started without waiting for the conclusion of the current read cycle that involves the first semi-array.

In interleaved memories, a basic scheme of which is depicted in FIG. 2, the array is divided in two independent banks or semi-arrays, EVEN and ODD, respectively, each having its own independent read path. Typically, there are two counters, one for each bank, containing the address of the currently pointed memory location. In case of simultaneous reading processes evolving respectively on the two semi-arrays, the least significant bit of the address (A0) supports the multiplexing between the EVEN and the ODD banks. If A0=0, the data coming from the EVEN semi-array will be made available at the output. If A0=1, the data coming from the ODD semi-array will be made available at the output.

As it is commonly known, the reading of the two semi-arrays is carried out according to one of two different approaches: simultaneous readings and multiplexing of the outputs; or time outphased readings.

According to the first approach, the readings are simultaneous on the two banks. The data read are stored in respective output registers and made available to the outside world in synch with an external clock signal. According to the second approach, the readings on the two semi-arrays have an alternate and interleaved evolution on a time base.

The first approach, though offering a simpler hardware implementation, limits the minimization of the start times of synchronous read cycles. For a better comprehension, it is necessary to consider the basic steps that are performed when passing from an asynchronous read mode to a synchronous read mode. With reference to the scheme of FIG. 2, and supposing a start of the reading from an address X, the latter will be loaded on the EVEN bank counter and on the ODD bank counter, less the least significant bit (A0) of the address. The two counters will point to the same location X of the respective bank or semi-array.

If A0=0: the first read data is relative to the address X of the bank EVEN and the successive read data is the data X of the bank ODD.

If A0=1: the first read data is relative to the address X of the bank ODD and the successively read data is relative to the X+1 address of the bank EVEN.

In the first case, it is sufficient to perform a simultaneous reading of the two banks and multiplex the outputs. In the second instance, it is necessary to increment the counter before starting the reading on the bank EVEN.

Usually, known synchronous memory devices do not make any initial increment and wait for the successive cycle for incrementing both counters, and therefore, read the location X+1 of the banks EVEN and ODD. This makes the times of the first read cycle and of the second sequential read cycle at best equal to the asynchronous read mode time of the memory.

In general, it may be stated that the efficient management of the read processes has a direct influence of the performance of the memory device. Many read path architectures have been proposed. Known read path architectures have generally been conceived for responding efficiently to either one or the other of the two modes of operation: asynchronous or synchronous.

If a memory device is designed to be read in an asynchronous mode, it will be generally provided with a rather simple control circuitry of the read data streams. This allows for the use of adaptive structures, such as dummy wordlines and dummy sense amplifiers, while leaving the reading circuitry free to evolve as fast as possible to achieve the shortest asynchronous access delays.

In contrast, in memory devices designed to function in a burst access mode or in a synchronous read mode, the possibility of making available in output a certain number of words read and stored in advance, permits, after a first asynchronous access, as long as it may be, a series of extremely fast read cycles. In this case though, the control logic must intervene heavily to manage the sense amplifiers which should not be left to evolve freely but be enabled, equalized and read at precise instants established by the control system. Prior European Patent Application Serial No. EP-98830801, filed on Dec. 30, 1998, and Italian Patent Application Serial No. MI99A00248, filed on Nov. 26, 1999, describe burst mode EPROM devices with the above characteristics. These patent applications are both incorporated herein by reference in their entirety, and are assigned to the assignee of the present invention.

SUMMARY OF THE INVENTION

An object of the present invention is provide a multipurpose memory device that can be used in a broader range of applications, whether requiring the reading of data from the memory in an asynchronous mode with random access (as in a standard memory) or the reading of data from the memory in a synchronous mode with sequential or burst type access. The multipurpose memory device should be capable of recognizing the mode of access and the reading that is currently required by the microprocessor. The multipurpose memory device should also self-condition its internal control circuitry as a function of such a recognition in order to read data in the requested mode without requiring the use of additional external control signals and/or implying a penalization in terms of access time and reading time of data compared to those which, for the same fabrication technology and state of the art design, may be attained with memory devices specifically designed for either one or the other mode of operation.

This and other objects, features and advantages in accordance with the present invention are provided by a memory architecture, according to which two totally independent and uncorrelated read paths of data stored in the two semi-arrays of an interleaved memory (named EVEN and ODD) are established. These independent and uncorrelated read paths are provided while making compatible the functioning of the memory device according to an asynchronous mode of one and/or of the other semi-array by using a special generator of ATD signals (Address Transition Detector) that may be stimulated by events different from transitions in the input circuitry of acquisition of the addresses from outside. In addition, the requested mode to the control circuit is rendered recognizable to the memory by way of a specific protocol using two of the commonly used external commands, namely the address latch enabling signal ALE and the read stimulation signal RD.

The counters of the two semi-arrays or banks or, according to a preferred embodiment, the counter of the first bank and a more simpler register with functions of an address counter for the second bank, are incremented distinctly from one another, and are thus outphased from the reading on the two banks already from the first (asynchronous) read cycle. This is different from what is commonly done in interleaved memory devices. Therefore, the memory device of the invention is perfectly able to switch to a synchronous mode reading phase at any time, while practically halving the access time to such a mode.

The two different reading processes, according to an asynchronous random access mode and according to a synchronous burst access mode remain perfectly congruent with each other and have an alternate and interleaved evolution in time. The architecture of the invention provides for optimal performances, uncompromised in any measure by the bivalent character of the device, whether commanded to function as a standard asynchronous random access memory or as a synchronous burst access memory.

The control circuit of the memory recognizes the type of access and reading mode that is required by way of a specific protocol of use of two external commands, namely the ALE and RD signals. The start of a standard read cycle (asynchronous mode) takes place as customary when the ALE signal assumes a high logic level 1. Upon the switching to a logic 1 of the ALE signal, the memory acquires (in its input latches) the desired address and simultaneously starts up the sense circuitry of both banks. Of course, a first cycle will always be asynchronous and the independent arrays of sense amplifiers of the two banks are simultaneously activated.

If the ALE signal does not return to its rest condition, that is to a logic 0 state, the two banks of sense amplifiers will complete their respective readings. Each reading evolves according to its own self-adapting circuits, in the same manner as it occurs in a standard asynchronous memory. At the end of these readings, only the bank currently in a condition of priority, determined by the value of the least significant bit of the address, will be enabled to place the read data on an internal data bus: with ADD<0>=0 establishing the priority of the EVEN bank and ADD<0>=1 establishing the priority of the ODD bank.

Under these conditions, the reading stimulation signal RD behaves as an active low Output Enable command, such that when at a logic 0 level, the data of the bank currently in priority is transferred to the output buffers and therefore made available to the external world. If, during the very first read cycle or thereafter during the $n^{th}$ asynchronous random access read cycle, the ALE signal switches back to a logic 0 level, the control circuit interprets such an occurrence as a request for a change to a burst mode of access and to a synchronous read mode of the memory.

In such a case, the control circuit generates a first increment pulse for the address counter (or optionally for the functionally equivalent register) of the bank which currently is not in priority. In so doing, the reading of the data on the bank currently in priority is left to evolve, considering that this bank will be the first to be called to provide its data to the output of the memory. Simultaneously the incremented address for the successive reading to be done on the other bank is prearranged (start of the synchronous burst interleaved reading mode).

According to an important aspect of the architecture, the same increment pulse for the address counter (or register) of the bank currently not in priority, stimulates also the respective reading circuitry of the bank. A specially modified ATD generator generates upon stimulation by the address counter incrementing pulses, including a dummy ATD pulse that is due to internal stimulation and which is exclusively conveyed to the bank not in priority and to its decoding and sensing circuits.

In this way, the array of sense amplifiers of the bank not in priority, the relative sense control circuit and equalization dummy structures, etc., will interpret the address counter incrementing pulse as a normal asynchronous read cycle request and will restart. This is while the sense amplifiers of the bank currently in priority, being completely independent from those of the other bank, will continue to evolve in their reading process.

The control circuit of the memory will continue to monitor the signals coming from the sense control of the bank in priority. As soon as the sense control circuit provides the SAlatch signal for transferring the read data to the latches immediately in cascade of the respective sense amplifiers, the control circuit will generate a pulse commanding the loading of data on the output, i.e., a LOAD pulse. In this way, the functioning enters in a burst interleaved access mode.

The end of the LOAD pulse establishes the availability of the bank that has just terminated a read cycle to start a new read cycle. Therefore, a new address counter incrementing signal will be generated only for the counter (or equivalent register) of such a bank. Beside stimulating the generation of a sequentially updated internal address, this will cause the generation of a new ATD pulse by internal stimulation (dummy) exclusively conveyed to the circuitry of such a bank.

These succession of address counter incrementing pulses have also the function of commuting the priority between the two banks in an alternate manner. In fact, because the first bank has terminated a read cycle and is about to start a new one, the bank that was not in a priority state and that in the meanwhile had restarted on its up-dated address, assumes priority.

Therefore, the control circuit of the memory will again wait for information coming from the asynchronous and self-adapting structures of sense control of such a bank as well as for an authorization by way of the external command RD to place in output the data of such a bank, by way of the generation of a new LOAD pulse. From hereon, the steps described above may repeat indefinitely, alternating the sequence.

According to a preferred embodiment, the circuit that detects transitions in the latches acquiring the externally requested addresses generates a detection signal ATD even upon a switching of the outputs. This is during a phase of reentering from a state of stand-by with the external command ALE=0, besides the acquisition of a new address from outside during a phase of random access, or upon the incrementing of one or of the other address counter of the two banks during a phase of sequential access. This provides for a useful resume and recovery functionality such to produce in output the last read data before entering the phase of stand-by or the data relative to the sequentially successive address, depending on the logic state of the RD command at the moment of interrupting the sequential reading and entering in a phase of stand-by of the memory.

According to another preferred embodiment, the memory comprises a special circuit for discriminating the impulses of the external command ALE intended for the memory from those intended to other devices of the system, coordinately with an enabling command of the memory device CEn that commonly filters the ALE command.

According to yet another preferred embodiment, the memory comprises a special circuit for accelerating the carry generation in the address counters of the two banks of the memory.

According to a further embodiment, the memory comprises a special circuit for generating synchronization signals on the basis of external commands and of internally generated signals in order to optimize the management of certain circuits that are shared by both banks of the memory.

BRIEF DESCRIPTION OF THE DRAWINGS

The different aspects and advantages of the invention will become clearer through the following description, by chapters, of the architecture of the invention, in which even particularly efficient embodiments will be illustrated, with reference to the annexed drawings, in which.

DETAILED DESCRIPTION OF THE PREFERRED EMBODIMENTS

Figure 1:
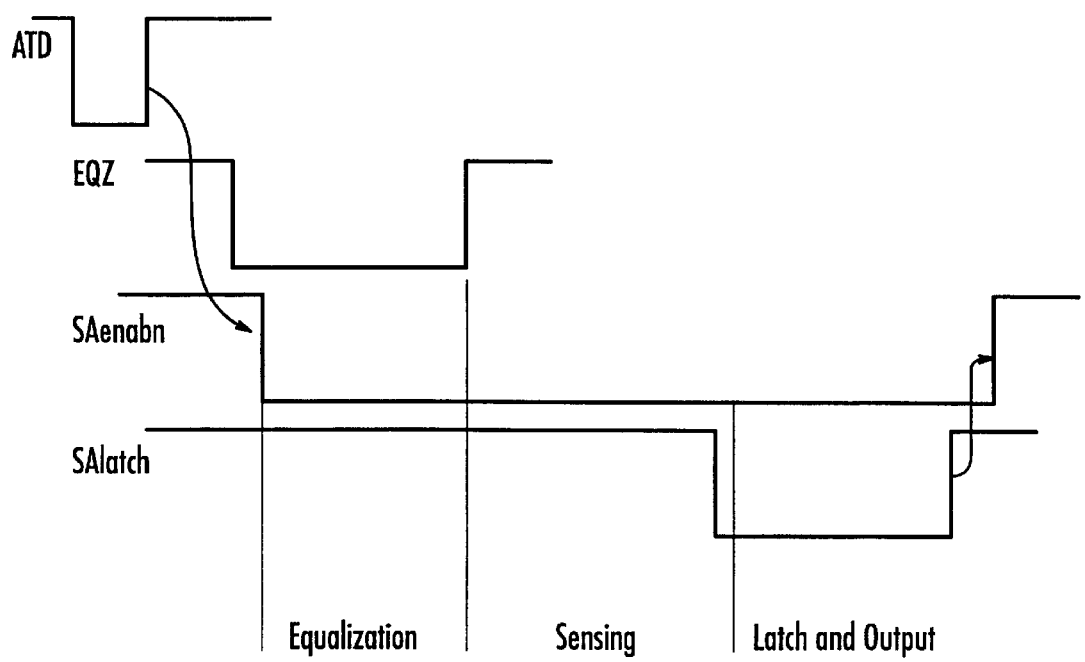
FIG. 1 depicts the fundamental access steps for reading a standard memory according to the prior art.
Figure 2:
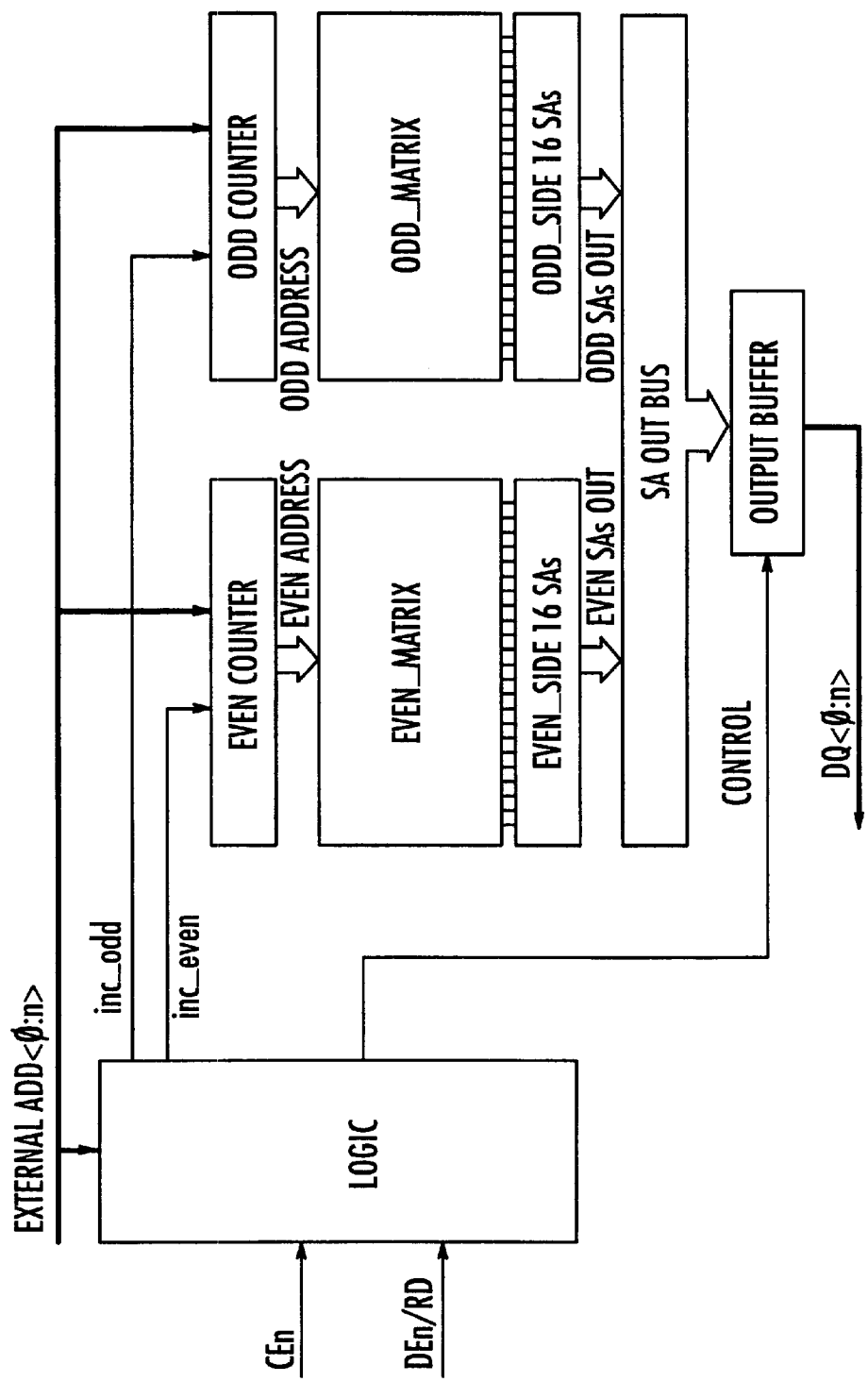
FIG. 2 is a basic diagram of an interleaved memory according to the prior art.
Figure 3:
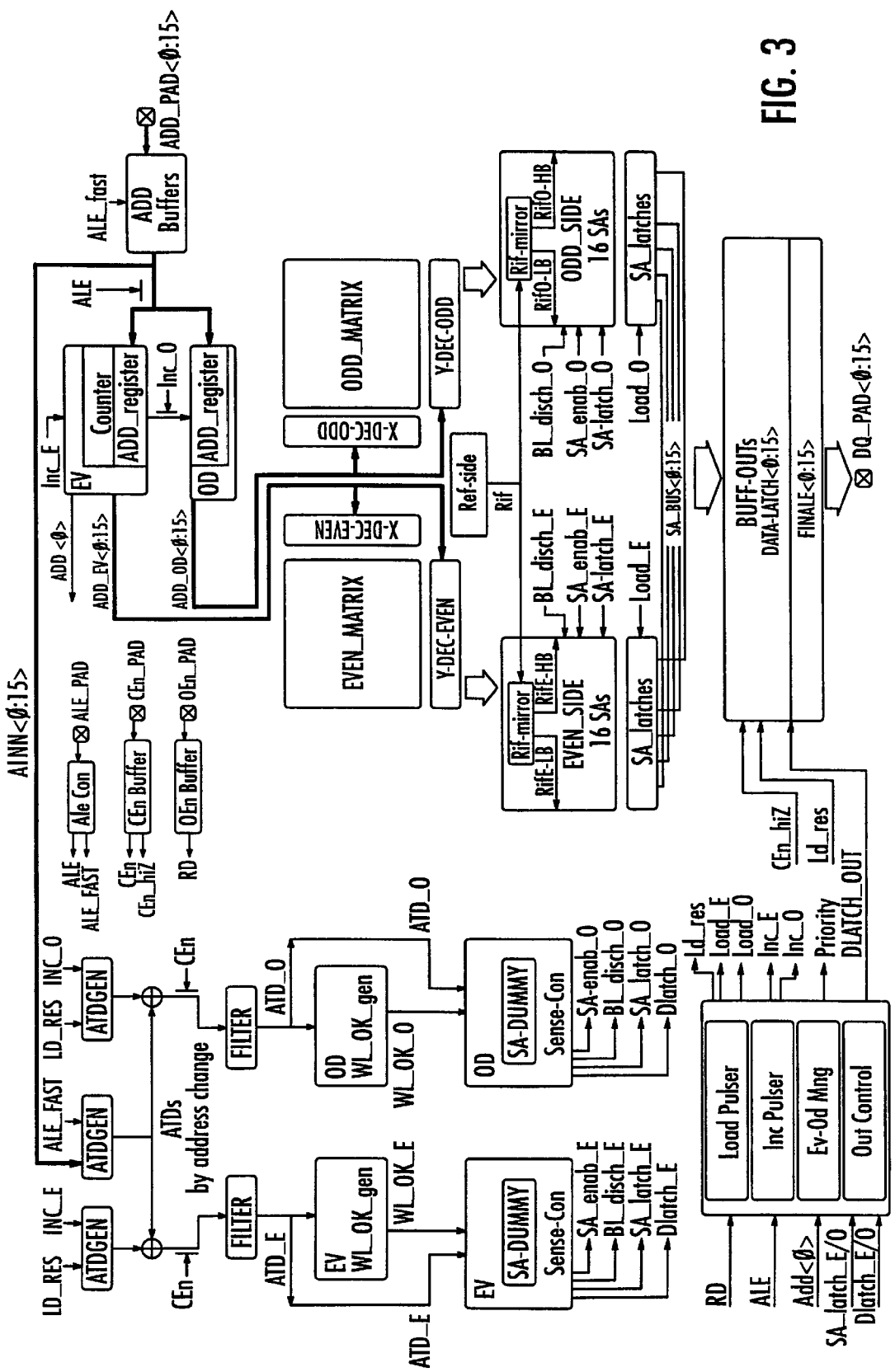
FIG. 3 is a block diagram of the memory architecture according to the present invention.
Figure 4:
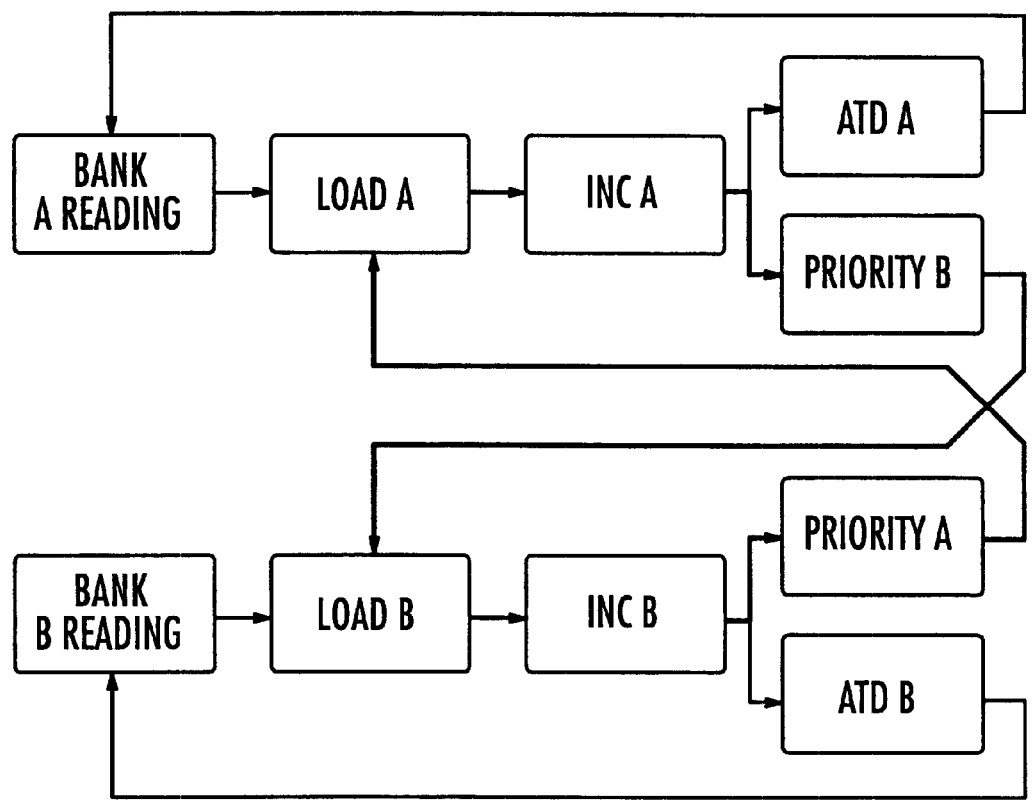
FIG. 4 is a scheme illustrating the operation in a burst interleaved mode the architecture according to the present invention.

With reference to the block diagram of FIG. 3, in terms of functional circuits, the memory architecture of the invention distinguishes itself from a common burst-interleaved memory architecture by a fundamental aspect represented by the fact that the architecture of the invention includes a circuit detecting external addresses transitions ATD GEN that is enabled in a phase of random access by the main external command ALE. This is done to generate an ATD signal upon the detection of a change of the memory address externally acquired.

In such a case, the ATD signal is sent to the circuitry of both banks EVEN_MATRIX and ODD_MATRIX in order to enable simultaneously the respective sensing structures, or alternatively stimulated, to generate a dummy ATD signal. The dummy ATD signal is specific for the circuitry of the bank not in priority by a respective increment pulse, INC_E or INC_O, of the address counter of the banks which is currently not in priority. This is during a phase of sequential access and is produced by a block INC PULSER of the control circuit of the memory, as will be described more in detail below.

A second fundamental aspect of distinction is represented by the fact that the decoding and reading structure of the two banks are completely distinct and independent from each other. Each includes its own array of sense amplifiers, EVEN_SIDE 16 SAs and ODD_SIDE 16 SAs, with relative arrays of buffers, SA_LATCHES, the output of which are enabled by distinct load signals LOAD_E and LOAD_O, its own dummy word line EV_WL_OK and OD_WL_OD, and its own dummy sense amplifier EV SA-DUMMY and OD SA-DUMMY for controlling the equalization of the sense amplifiers of the array of the block and of its own logic circuits EV SENSE-CON and OD SENSE-CON, for enabling the reading at the end of the sensing phase and the loading of the read data in the respective buffers (SA_LATCHES).

A third essential aspect is the ability of the control circuit of the memory of the invention for discriminating the type of read mode that is requested as a function of a specific protocol of use of the external commands ALE and RD and generating load signals LOAD_E and LOAD_O for the data on the internal data bus by way of a special block LOAD PULSER. This is done coordinately in order to operate a selection of the correct data to be conveyed toward the output. This is notwithstanding the fact that an ATD signal is being sent to the decoding and read structures of both banks during a phase of random access asynchronous mode of operation of the memory.

With reference to the diagram of FIG. 3, identifying generically with A and B the two banks in which the interleaved memory array is divided and recalling what was already discussed above, that the end of the load pulse, LOAD-A or LOAD-B, relative to the bank currently in a priority state, establishes the availability of the bank that has just terminated a read cycle to start a new read cycle. This is done by a dedicated block of the control circuit of the memory. A new address counter incrementing pulse, INC-A or INC-B, is generated only for the counter (or equivalent register) of such a bank that stimulates the generation of a new updated internal address by the generation by part of the dedicated circuit, ATD GEN, of a dummy ATD-A or ATD-B pulse, exclusively for such a bank.

These successive increment pulses, alternately INC-A and INC-B, have also the effect of commuting the priority state between the two banks A and B. In fact, because a bank has terminated a read cycle and is about to start a new one, the other bank that was not in priority and which in the meanwhile had restarted on the updated address, may now assume priority.

The control circuit of the memory remains waiting either for information coming from the asynchronous and self-adaptive structure of the sense control circuit of the other bank or the authorization, by way of the external command RD, to place in output the data of such a bank, through the generation of a respective new load pulse: LOAD-A or LOAD-B. Therefore, in such a phase of burst type access, the interleaved memory, stimulated by the external command RD, is able to read the whole array by alternating the reading on a bank with the reading on the other bank.

Figure 5:
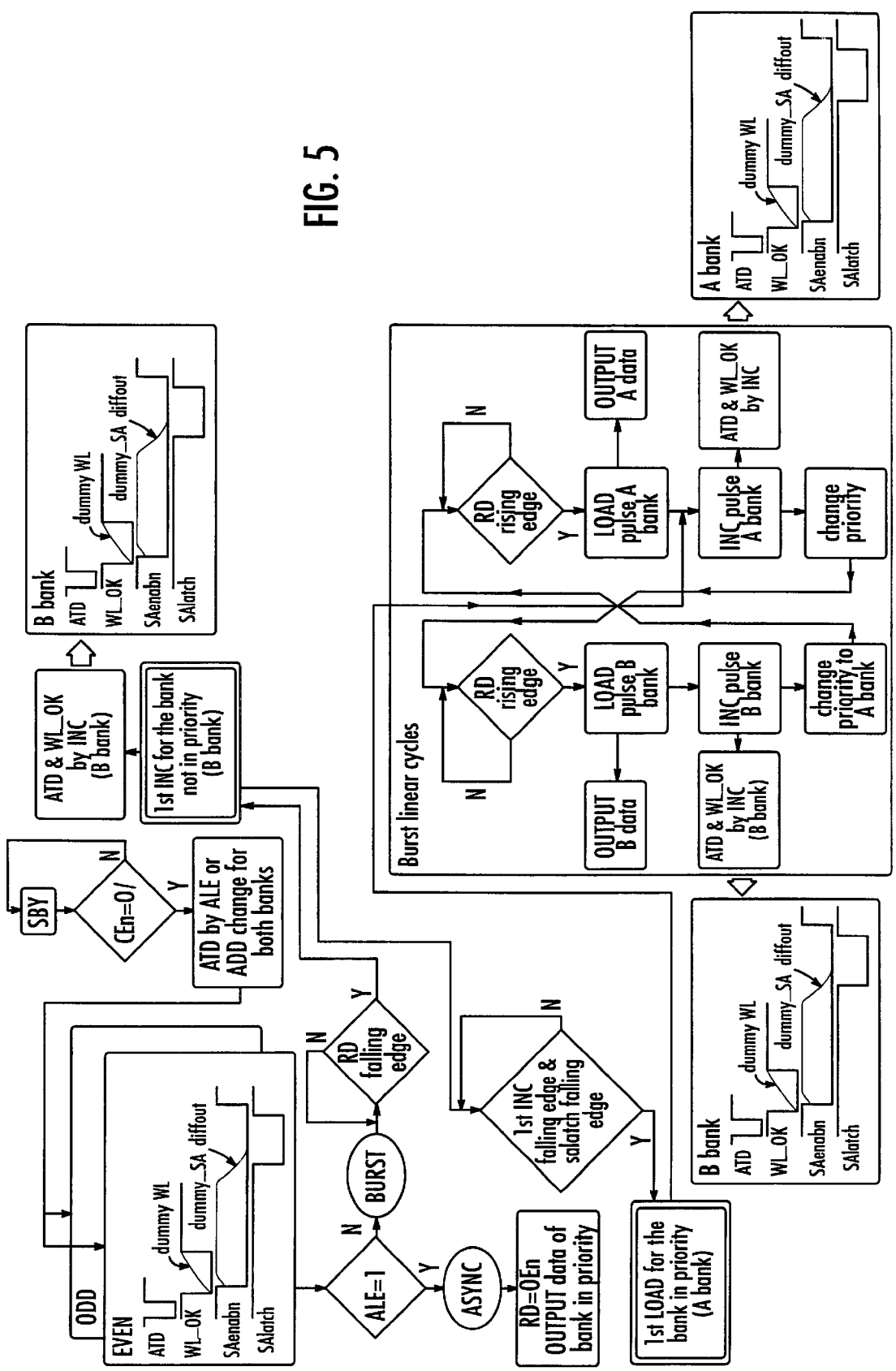
FIG. 5 is a flow chart illustrating the reading steps according to the present invention.

The entire operations which are performed within the memory device of the invention are a function of the external commands ALE, CEn, RD/OEn. These external commands are schematically illustrated in a thorough and complete manner in the flow sheet of FIG. 5 using commonly used notations of immediate interpretation by one skilled in the art.

Also, illustrated in the flow chart is the way the relative internally generated signals evolve for the case of an always present first random mode asynchronous access to one of the two banks, ODD or EVEN, as a function of the external acquisition of an address. This is for a random access asynchronous read mode that may indeed continue until the ALE signal remains high, with each bank of the interleaved memory array of the invention behaving as a standard asynchronous memory by virtue of a complete independence of its decoding and read structures. This is also true for the case of an eventual switching to a burst interleaved access mode upon the return of the ALE signal to a low state, by the generation of distinct dummy ADT pulses for one or the other bank that is currently not in a priority state.

Figure 6:
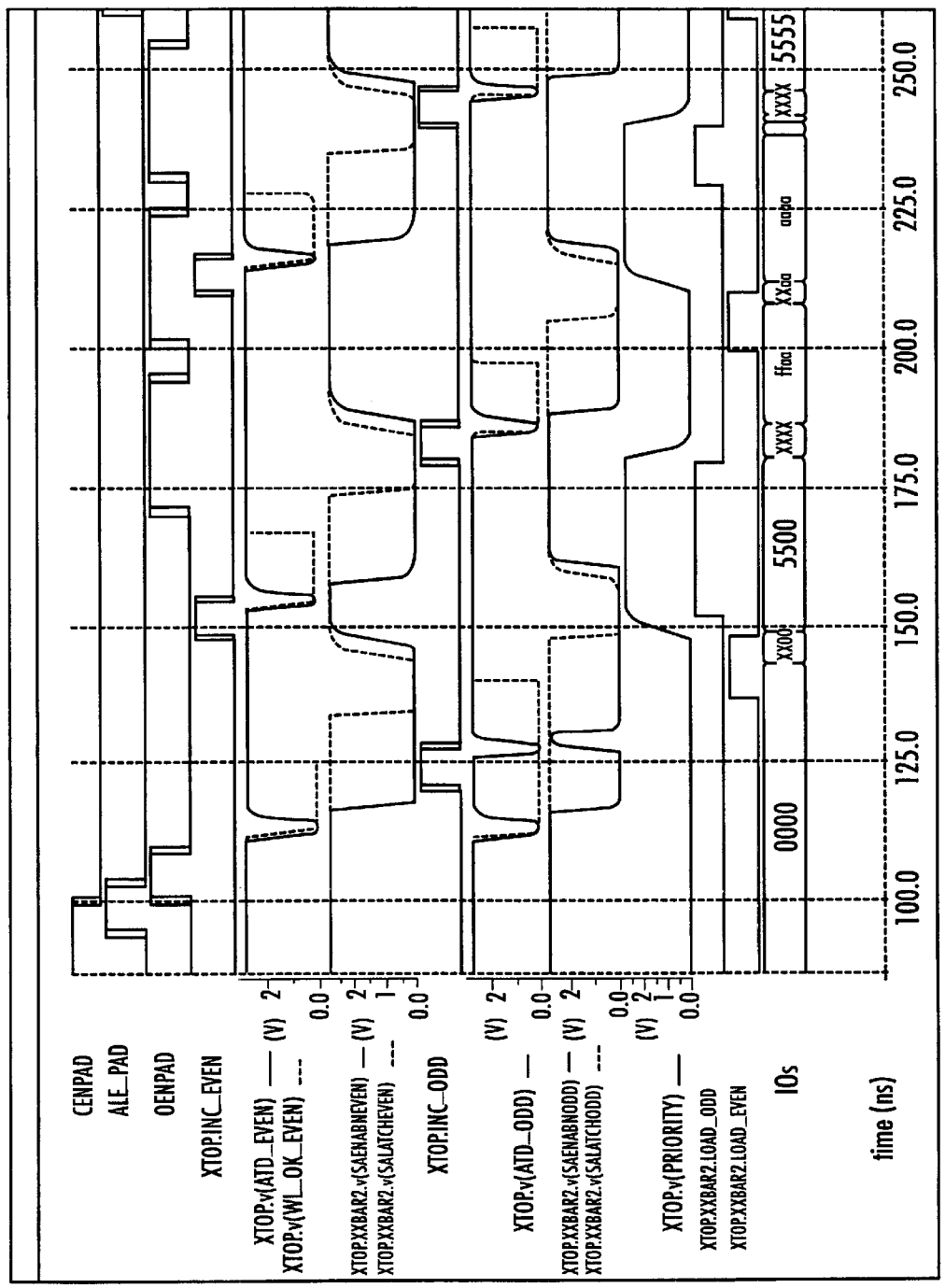
FIG. 6 shows all the main signals that are involved in a burst type access according to the present invention.

The fundamental signals involved in the operations of the interleaved memory during a burst access synchronous read mode phase of operation, according to a mixed (analog-digital) simulation, are depicted in FIG. 6, using a common notation to one skilled in the art. The external commands ALE, RD and CEn, control the functioning of the interleaved memory of the invention in the possible modes of operation according to the protocol illustrated in FIG. 7.

Figure 7:
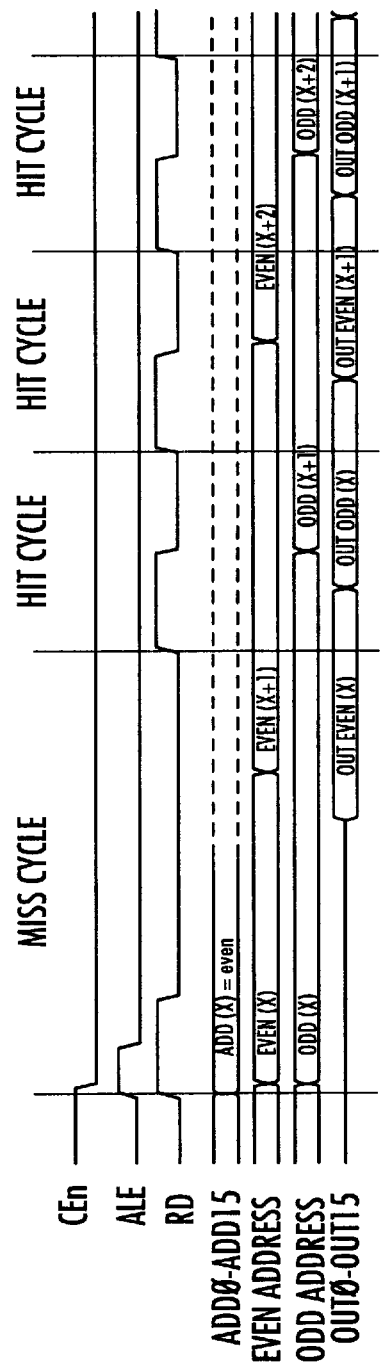
FIG. 7 depicts a protocol for the signals of an interleaved memory according to the present invention.

FIG. 7 shows clearly how, during a first read cycle that obviously is always of an asynchronous character and is commonly referred to as a MISS cycle, the capture of external addresses occurs in coincidence of the ALE pulse, and how subsequently during eventual synchronous read cycles, commonly referred to as HIT cycles, at each cycle of only the RD signal, the two banks EVEN and ODD self-increment their own (internal) address and carry out the consequent read cycle. This approach permits an effective halving of the cycling times.

Figure 8:
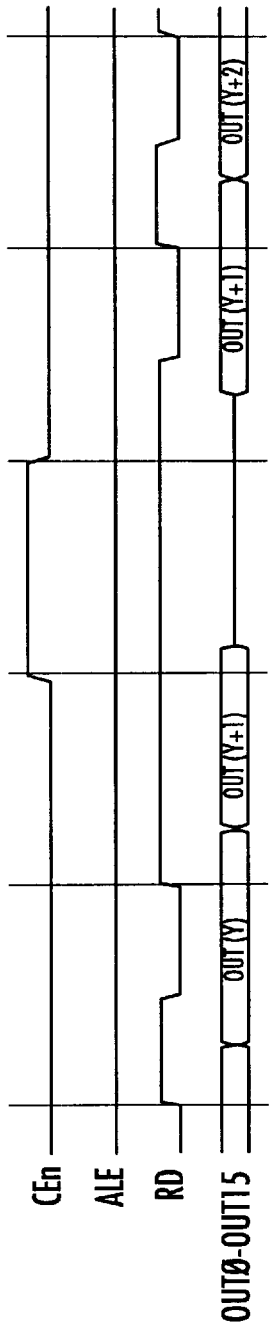
FIG. 8 illustrates a resume cycle with RD=1 according to the present invention.
Figure 9:
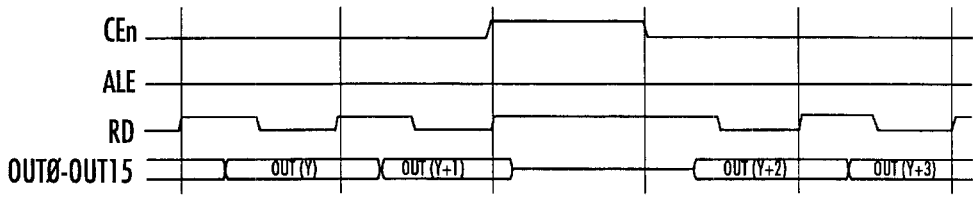
FIG. 9 illustrates a resume cycle with RD=0 according to the present invention.

According to a preferred embodiment, the memory device may permit interruption of a sequential read phase, that is, when the external signal ALE remains equal to zero, ALE=0, with one or several stand-by intervals. At the end of which the sequential reading may restart from the location in which it was interrupted (RESUME CYCLE). This advantageously places in output the last read data or the data relative to the successive address. This depends on the state of the RD signal preceding the entering in a stand-by condition. If before the start of the stand-by, RD=1, upon resuming the burst type access the last read data will be reproduced at the output, as depicted in FIG. 8. If before the start of the stand-by interval, RD=0, upon resuming the burst type access for the data successive to the last read will be loaded on the output, as depicted in FIG. 9.

In contrast, as long as the external signal ALE remains high, ALE=1. The memory of the invention is perfectly able to continue to function as a standard asynchronous memory. The management of all these different situations is carried out by a control circuit according to an internal protocol that prevents conflicts under all conditions of operation in which the memory device may be called to operate.

As discussed above, the two banks have independent and uncorrelated read paths and a full compatibility with an asynchronous mode of operation on the basis of a special logic algorithm implemented by the control circuit of the memory TIMING in combination with the asynchronous control of the read circuitry.

Control Circuit of the Memory (TIMING)

The control circuit TIMING of the memory, by recognizing the mode of operation in which the memory is requested to function by the external commands ALE and RD, performs the following main functions:

increments the EVEN bank counter and updates the address on the ODD bank register by generating distinct increment pulses INC_EVEN and INC_ODD;

generates the primary loading signal LOAD as a function of the signals coming from the sense controls and of the external signals ALE and RD;

processes the primary loading signal LOAD as a function of the priority in order to generate alternatively a specific loading command: LOAD_EVEN or LOAD_ODD, for the data read on the respective bank anticipating or extending them as a function of the state of the readings with respect of the external protocol signals (RD);

establishes the instant of visibility of the data contained in the output register from outside, by way of a command signal DLATCHN;

ensures compatibility of the memory with all the test modes of a standard asynchronous memory; and ensures compatibility with all of the internal algorithms.

Figure 10:
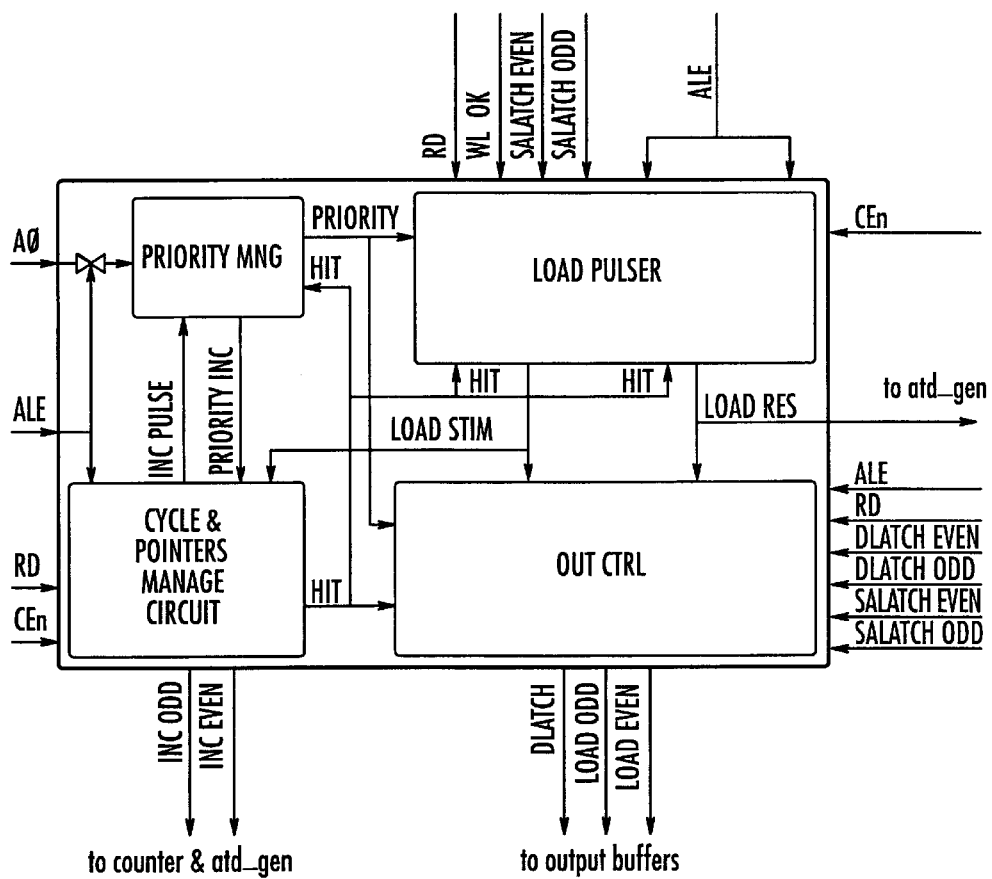
FIG. 10 is a functional block diagram of the control circuit of the memory according to the present invention.

FIG. 10 is a functional block diagram of the control circuit TIMING, wherein the main functional blocks and fundamental signals are indicated. A preliminary description of the functions performed by the single functional blocks and of the internally generated signals, before illustrating the internal protocol according to which the blocks interact with each other, is provided below.

Priority MNG

As mentioned above, the reading may take place on both semi-arrays EVEN and ODD simultaneously (asynchronous mode) or in an out of phase or alternate fashion (synchronous mode). Nevertheless, at any time only one of the two banks will be authorized to update the output data register if so requested by the protocol.

The block generates two signals, namely: PRIORITY INC and PRIORITY, which substantially have the function of pointing to the bank in which a reading is being performed. The main functions of the two signals are:

managing the pointing of the bank on which to update its internal address in order to start a new read cycle (PRIORITY INC); and checking the updating of the output data register under all modes of operation (PRIORITY).

It should be remarked that the updating produced by the signal PRIORITY takes place at instants (temporally preceding) different from the instants of increment (temporally successive). In particular:

PRIORITY INC: during the asynchronous mode of operation (ALE=1) this signal does not have any function; during a synchronous mode of operation (ALE=0) this signal alternately directs the increment pulses to the counters of the two banks EVEN COUNTER and ODD_REGISTER;

PRIORITY: during the asynchronous mode of operation (ALE=1) selects one of the two banks enabling it to write the read data in the output buffer; during an asynchronous mode of operation (ALE=0) the signal defines the bank currently in priority for the updating of the data in output.

The evolution of the two signals in the different modes of operation is as follows:

In asynchronous mode: PRIORITY INC disabled; PRIORITY=A0

MISS Cycle: HIT=0→PRIORITY INC≠A0→PRIORITY= A0

During the first asynchronous MISS cycle, the two signals start from different logic levels in order that the first data that is placed in output is relative to the bank pointed by the bit A0 (PRIORITY=A0). This is done while the increment of the internal address is done on the other bank (PRIORITY INC≠A0).

During a subsequent phase of synchronous cycles (HIT switches to a logic 1 at the end of the first increment), the switching of the two signals occur at slightly different instants, and precisely:

HIT Cycle:
PRIORITY INC switches at the end of each increment; and
PRIORITY switches starting from the second switching at the beginning of each increment, that is every time the loading of data in output has terminated and the successive data is required.

Fundamentally, both signals are used within the system for identifying the bank whose data must be placed in output (PRIORITY) and the bank on which a new read cycle must be started after having updated the internal address (PRIORITY INC).

Cycle & Pointers Manage Circuit (INC PULSER)

The main functions of this functional block of the control circuit of the memory are:
- generating an increment pulse INC of minimum duration though sufficient to stimulate the updating of the internal address counters of either the EVEN block or the ODD block;
- start new read cycles on the two banks EVEN and ODD;
- stimulating the updating of the pointing signals PRIORITY and PRIORITY INC; and
- managing the passage from a mode of operation to the other (MISS→HIT)

In an asynchronous mode of operation (MISS) address counter increment pulses are not generated and the signal HIT remains at a logic 0.

Load Pulser

The main function of the functional block LOAD PULSER is to generate the primary LOAD pulse necessary for loading the data read from either one of the two banks in the output buffers under the different modes of operation: MISS cycle and HIT cycle. Such a primary loading pulse is then processed by the functional block BUFFOUT_CTRL.

Buffout Control

The different conditions of operation: asynchronous, synchronous, recovery and resume are managed by an appropriate control of the read path of the memory.

The output latches in cascade to the sense amplifiers eventually transfer the read data through an internal data bus common to the two banks of the memory to an output data register that preserves the copy of the current output unless it is placed in a high impedance condition by external commands, for example CEn or OEn.

The function of the block BUFFOUT CTRL of the control circuit TIMING of the memory is that of producing the signals that manage, under all situations, the transfer of the data from the output of the sense amplifiers to the external output bus to which the memory device is coupled.

Moreover, the functional block BUFFOUT CTRL minimizes the propagation delays along critical read paths, imposes a correct synchronization in the succession of events, recognizes the current state in order to appropriately anticipate or posticipate the interleaved loading of data: LOAD_EVEN and LOAD_ODD, and harmonizes through the retaining and broadening of the control pulses overall functional compatibility among each other.

The block contains a state machine that synchronizes the information relative to the request of new data coming from outside with the state of progress of the internal read cycles. The signals generated by the BUFFOUT CTRL block are:
LOAD_EVEN and LOAD_ODD (mutually exclusive) that enable the respective banks to update the content of the registers of the output buffers with the content of the latches in cascade of the sense amplifiers;
DLATCHN that enables the transfer of the data present in the output data register toward the external output bus of the memory. It should be noted that this transfer remains conditioned by the state of the external commands CEn and OEn that may place the output buffers in a tristate condition (high impedance) keeping them disabled until such a time the read data must be made available to the external system.

In the different modes of operation, the block operates as follows.

Asynchronous Mode

In this mode, the block essentially performs a multiplexing function. From the signals DLATCH (EVEN and ODD) generated by the respective SENSE CONTROL (EVEN and ODD) blocks, it generates a specific loading pulse LOAD (EVEN or ODD) depending from the state of the priority (defined by the bit A0 of the address). In practice, the DLATCHN signal is a copy of the LOAD (EV or ODD) signal.

Synchronous Mode

Generation of the load signals in this mode depends on the configuration of the internal state machine, defined by the external signals RD and ALE and by the state of progress of the current reading.

In practice, the generation of the specific LOAD pulses (EVEN or ODD) is anticipated as much as possible with respect to the raising edge of the RD signal to transfer the data present in the latches in cascade of the sense amplifiers toward the output data register. This permits a reduction of the synchronous reading time.

The generation of the DLATCHN that enables the effective switching of the outputs is correlated exclusively to the load stimulation pulse produced by the LOAD PULSER block at each raising edge of the external read clock RD. Therefore, updating of the output is performed in a synchronous mode.

Recovery Mode

The switching of the CEn signal (1→0) during the execution of sequential synchronous readings leads the memory in a stand-by condition only after saving in the output data register the last read data (if RD=1) or of the successive data (if RD=0), as already explained. In this phase, the LOAD PULSER block produces a load stimulation command depending on the state of the external clock RD at the time of entering stand-by. From such a stimulation signal, specific load signals LOAD (EV or ODD) and the signal DLATCHN are generated, as in the asynchronous mode. Even during the active state of the signal DLATCHN, the output buffers remain in a high impedance condition if the external commands CEn and/or OEn are at a logic low state.

Resume Mode

In the phase of reentering from a stand-by interval, the LOAD PULSER block produces a LOAD RESUME pulse that permits an immediate generation of the DLATCHN signal in order to make the data present in the output data register available to the external system.

Counters Update and Mode Control Block

Figure 11:
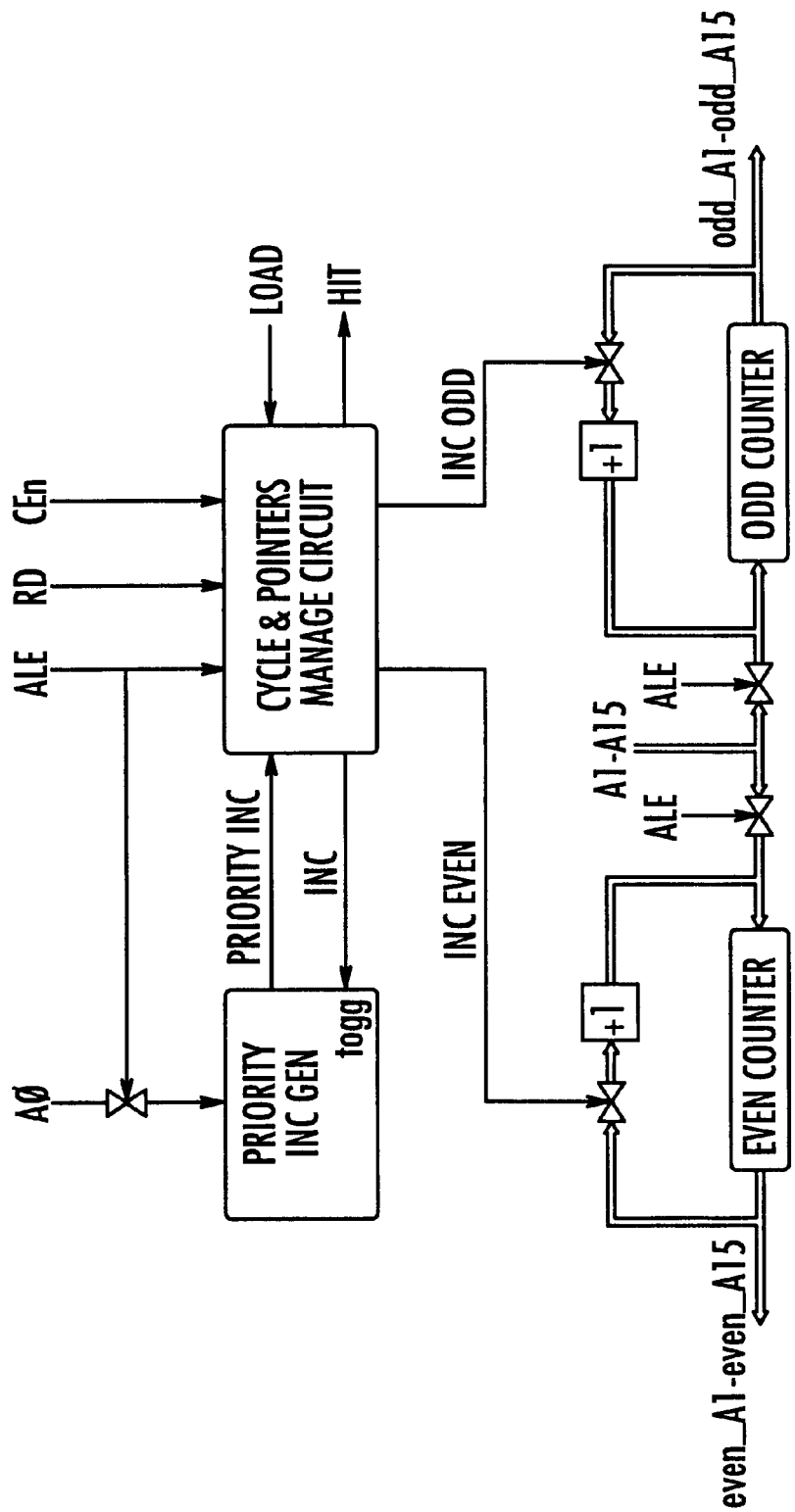
FIG. 11 is a functional block diagram of the circuit that generates the incrementing pulses for the counters of the two banks according to the present invention.

A preferred embodiment of the block Cycle & Pointers Manager Circuit of the control circuit TIMING of FIG. 10 is described in a more detailed manner. A block diagram of the circuit is depicted in FIG. 11, whose parts and their respective functions are specified below.
Cycle MNG generates the control signal HIT, which is a logic 0 each time an ALE (random mode) command pulse is received, and while it switches to a logic 1 at the end of a first pulse INC (burst mode).
MUX, depending on the value of HIT, decides whether the signal stimulating the block PULSER should be the signal LOAD (if HIT=1), or the OR of the signals ALE and RD (if HIT=0). In particular situations the stimulation signal is suppressed (ALE=1 and/or RD=1).

Constant Duty Pulser is a monostable circuit generating pulses having a pre-established minimum duration, substantially constant and independent from the supply voltage, each time the falling edge of the input signal is detected.

Voltage & Temperature Compensated Reference Generator produces a compensated control voltage, VCTR, in order to make independent from the supply voltage and from the temperature the duration of the pulses generated by the Constant Duty Pulser.

INC MNG, depending on the value of the control signal PRIORITY INC, directs the increment signal INC to the bank EVEN (if PRIORITY INC=0) or to the bank ODD (if PRIORITY INC=1).

Figure 12:
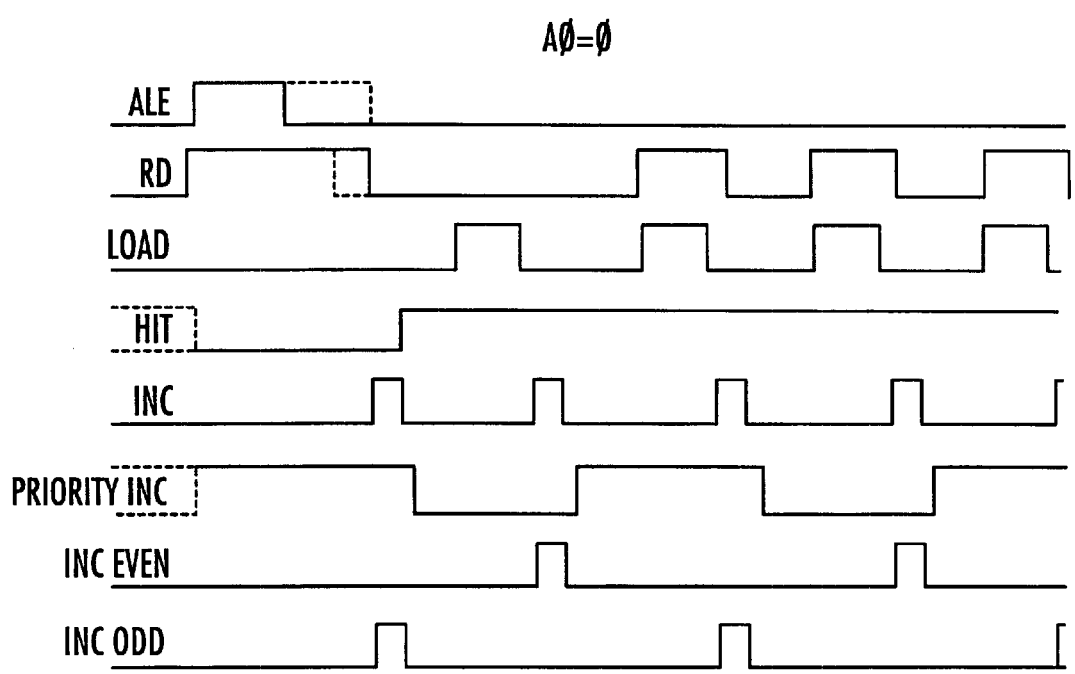
FIGS. 12 and 13 are timing diagrams of the signal of the functional block diagram of FIG. 11.
Figure 13:
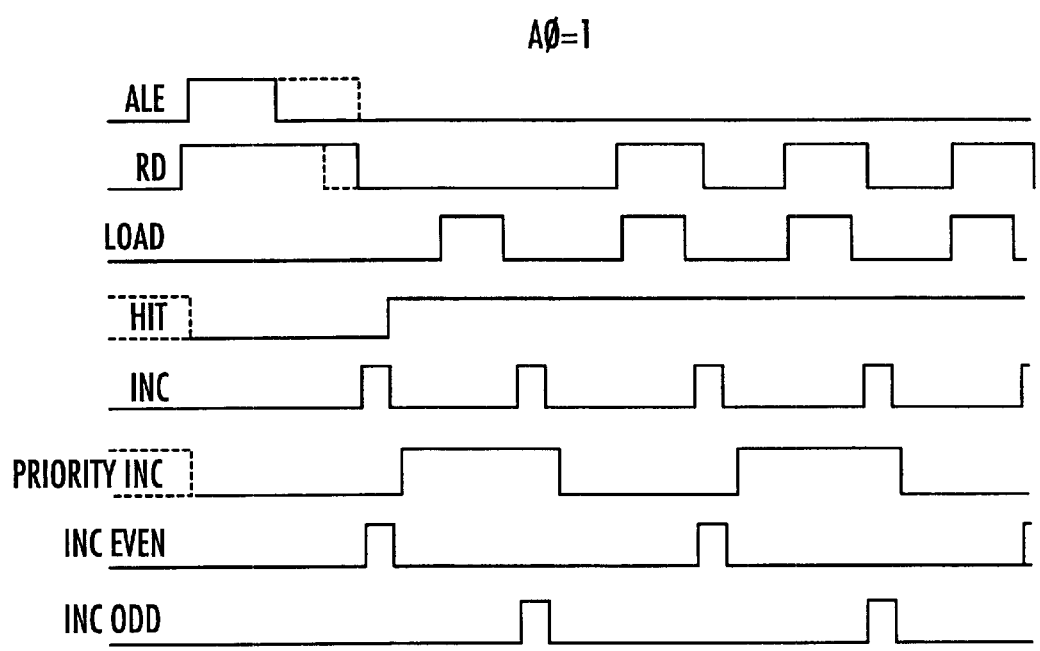

The sequence of the signals produced by the circuit from external (ALE and RD) and internal (LOAD, PRIORITY INC) stimulation signals when A0=0 is depicted in FIG. 12. The sequence when A0=1 is depicted in FIG. 13. The externally input address bit A0 points to the bank on which the first reading will be started: A0=0: first read cycle on the bank EVEN; and A0=1: first read cycle on the bank ODD.

The readings following the first one are automatically managed internally upon detection of a rising edge of the external (clock) signal RD. In particular, when a first reading has started, the increment of its internal address on the other bank is systematical and conditioned by the falling edges of ALE and RD. The increment determines the start of the second reading and, if it is to be done on the EVEN bank, the increment of the counter.

The end of the first increment determines a transition of the functioning of the memory to an interlaced mode (HIT=1) and the stimulation to the successive increments is determined by the falling edge of the signal LOAD. The latter is the signal that completes each reading cycle.

The signal HIT is used also in other blocks that for sake of simplicity have been omitted and, in general, contains the information relative to whether an interlaced reading phase has begun (HIT=1) or not (HIT=0). This information is very important for configuring the internal reading paths for the different modes in which the memory can function.

The circuit is inactive in case ALE or RD remains equal to a logic 1. In fact, these two conditions separately characterize particular functioning conditions of the memory such as the standard reading mode and data writing. In these situations no increment pulses are produced and the signal HIT is always at a logic 0.

Figure 14:
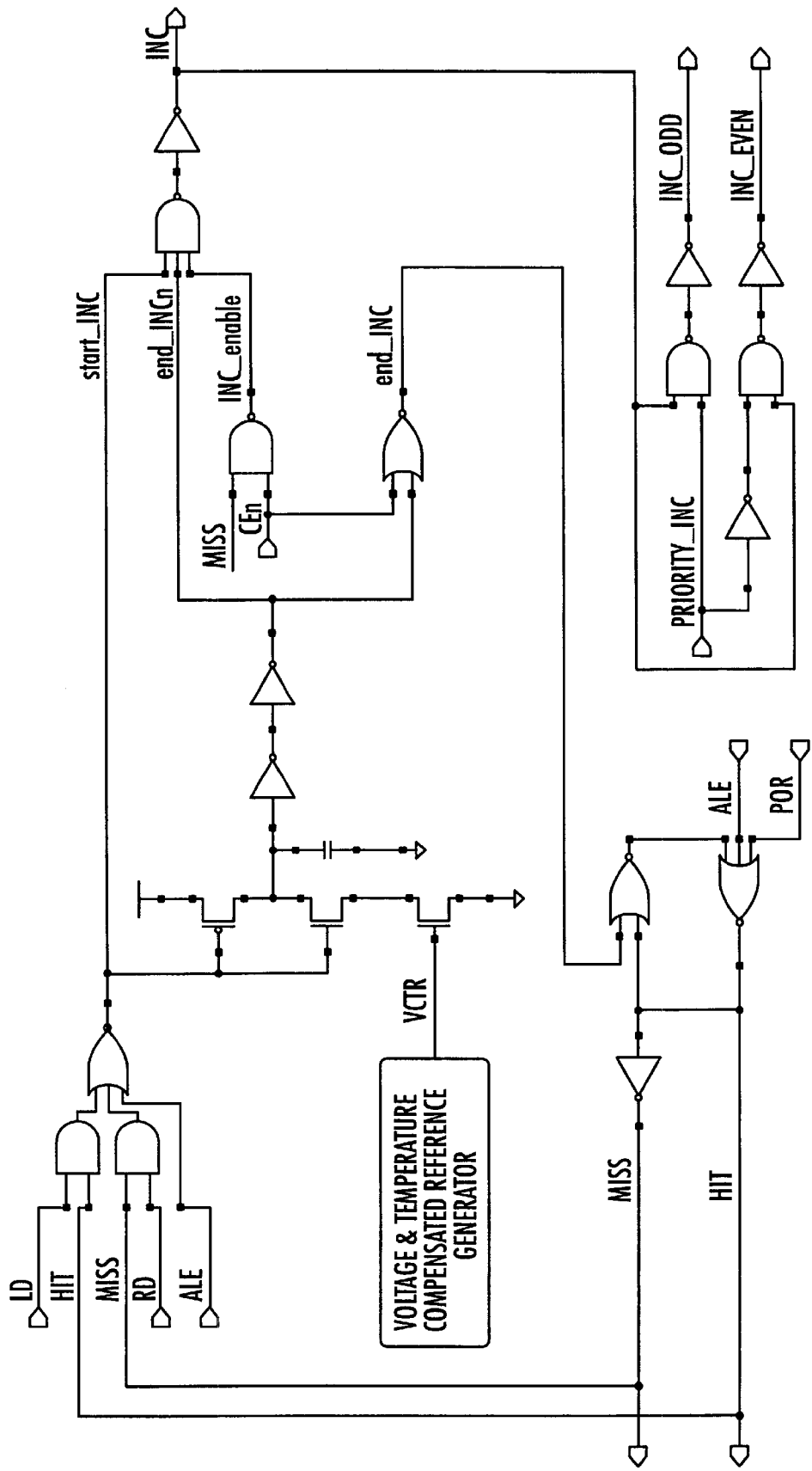
FIG. 14 is a circuit embodiment of the control blocks of FIG. 11.

A circuit embodiment of the block is depicted in FIG. 14. A natural n-channel transistor, coupled to the reference voltage VCTR, is employed in the monostable circuit. The voltage VCTR is compensated for variations of the supply voltage VDD and of the temperature in order to guarantee a high independence (i.e., a high stability) of the duration of the primary pulse INC from the supply voltage and from the temperature. The signal POR is equal to a logic 1 during the power-up of the memory and sets the start condition of the signal HIT to a logic 0.

Interlaced Data Stream Architecture

Figure 15:
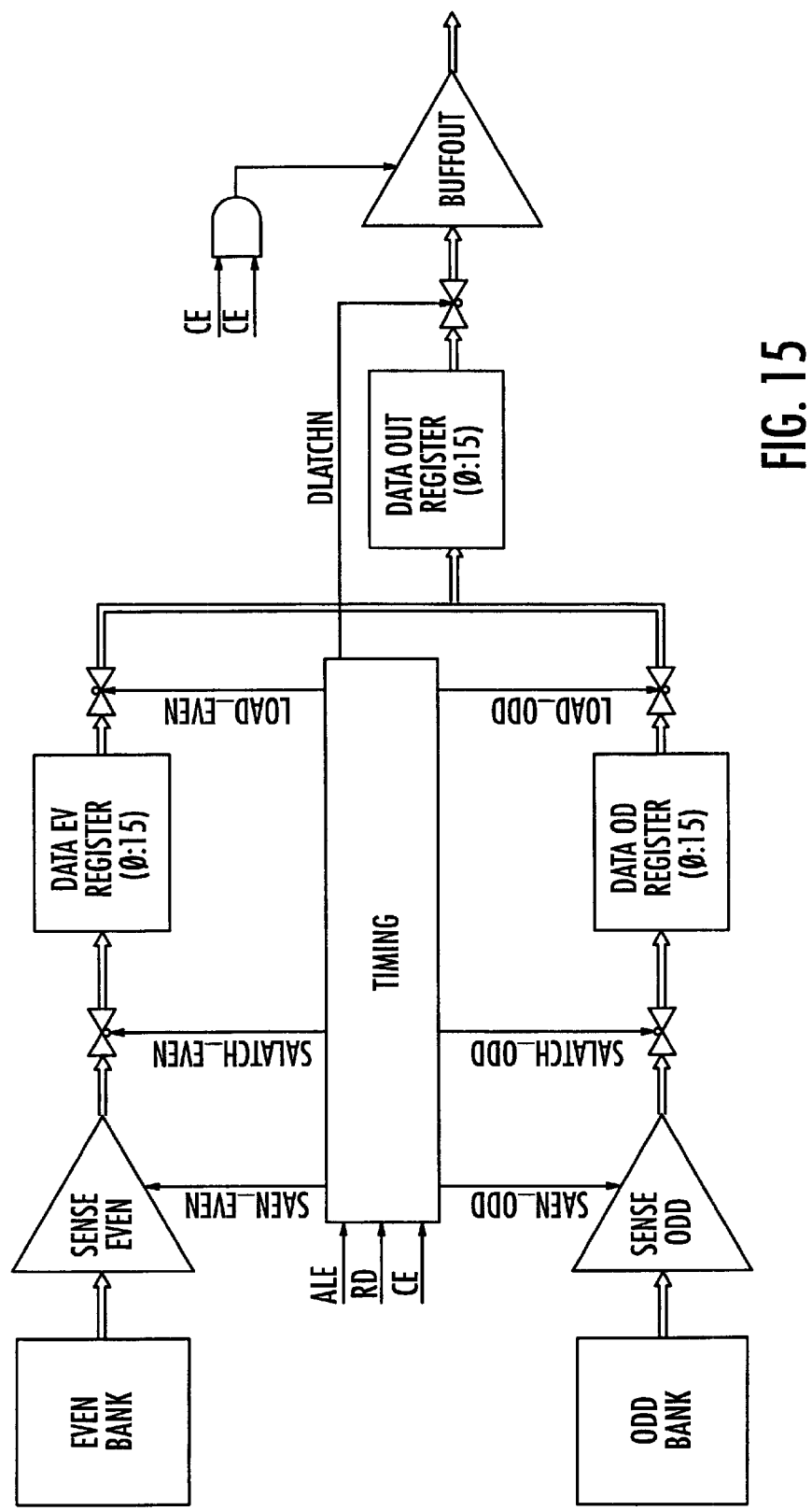
FIG. 15 is a functional scheme of the interleaved read path of data according to the present invention.

The reading of a standard memory is an asynchronous process starting from an initial stimulation, generated by the switching of at least an input address latch, evolves producing new data at the output. A functional diagram of the structure is depicted in FIG. 15, wherein the data path towards the output is highlighted.

According to a preferred embodiment, the structure uses three data registers allowing a relatively straightforward management of the memory in all situations contemplated by the protocol. The use of three distinct registers allows the carrying out of reading cycles uncorrelated from each other on the two banks. The readings can be outphased from each other or simultaneous depending on the starting stimulation. At the end of each cycle the sense amplifiers of each bank update the output register.

The signals SAEN and SAlatch are generated according to the common sequential logic structures of an interlaced memory, but the structures are duplicated for the two banks in the architecture of this invention. The protocol may contemplate even the possibility of interrupting a synchronous reading phase with a stand-by period (of a minimum duration equal to the duration of the single synchronous read cycle) after which the sequential reading restarts from the point in which it was interrupted by outputting either the last read data or the successive data. This is dependent on the state of the protocol signal RD at the instant of entering the stand-by.

Two situations are possible: 1) Recovery& Resume with RD=1 before the beginning of the stand-by. The last read data is made available at the output upon restarting; and 2) Recovery&Resume with RD=0 before the beginning of the stand-by. The data successive to the last read data is made available at the output upon restarting.

To satisfy the above distinct situations, the state machine of the control circuit TIMING of the memory controls the updating of the register DATA OUT REGISTER before the output buffer BUFFOUT even during the stand-by of the memory. In particular, if the stand-by cycle starts while RD=1, no LOAD signal is produced and in the output buffer register remains the last read data. In the case in which RD=0 when a stand-by period starts, the TIMING block produces a LOAD pulse that loads the successive data on the register DATA OUT REGISTER. In both cases, upon resuming operation after a stand-by (RESUME), the TIMING block produces a pulse DLATCHN that enables the visibility from outside (on BUFFOUT) of the data present on the output data register.

The presence of three distinct data registers in the output paths allows a great simplification of the state machine of the TIMING circuit that controls the updating of the output data and the start of a new reading cycle. Moreover the protocol may require that the minimum duration of any Resume cycle be equal to that of a synchronous read cycle (for example, around 25 ns). This time interval would be insufficient to carry out a new complete reading. The storing in advance of the next data when entering a stand-by overcomes the problem and satisfies even this protocol request.

Overall, the memory device of the invention has remarkable flexibility. It can manage a RECOVERY&RESUME cycle as any synchronous cycle. This enhances the robustness because normal asynchronous reading structures are preserved and simplifies to a great measure the internal state machine that controls the memory.

Pulser of the Interlaced Load Signals of Output Data

As mentioned above, a fundamental characteristic of the memory architecture of the invention is the discontinuity of the coupling between the sense amplifiers and the internal output data bus. The architecture contemplates a special control structure producing, only at appropriate instants, an enabling signal for loading read data on the internal output data bus and disconnecting again the sense amplifiers from the internal output data bus while waiting for a new cycle.

Such an enabling signal must fulfil fundamental requirements so that the sequential reading process takes place in a correct manner. In particular, it must coherently manage both the dependence from the communication protocol between the memory and the external world (thus the synchronization of the output of data), and the information coming from the sense amplifiers on the effective availability of a read data.

All interlaced memory systems, independently from the protocol, contemplate a first random access, in which a certain address is provided from the outside together with a control bit, i.e., the command ALE (Address Latch Enable), such that the memory acquires and stores it in its input address latches. Upon acquiring such an address, a first reading cycle, commonly defined MISS CYCLE begins.

Such a first read cycle will require a full access interval because it is an asynchronous cycle. Therefore, during this first read cycle, the LOAD signal must be generated by considering the time that is needed for the read data to be ready at the output of the sense amplifiers before allowing its transfer to the output buffers. Successively, it is possible to provide the output data in a fraction of the time of a complete reading, by virtue of a pipeline read approach, such as that of sequential (burst) cycles, commonly defined as HIT cycles.

In fact, with the first cycle, the mechanism of outphased readings of the two banks at successive addresses self-generated by the internal control circuit begins. Therefore, the other external control signal RD of the communication protocol effectively provides for the synchronization with the external system by virtue of an intrinsic function of such a signal for requesting data. In this mode of operation, the LOAD pulse must depend from such a synchronization.

Figure 16:
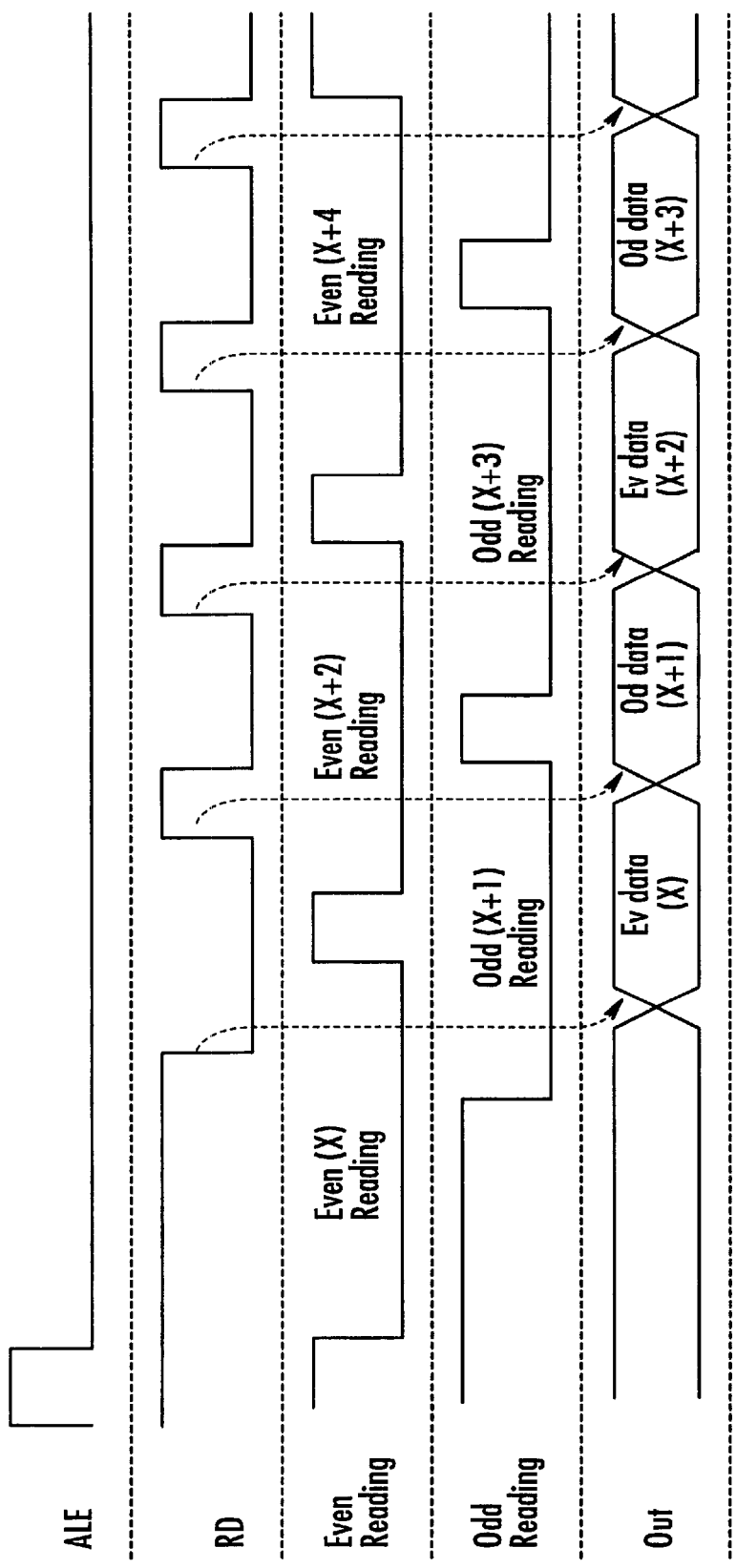
FIG. 16 shows the dependency of the readings on the two banks from the external control signals according to the present invention.
Figure 17:
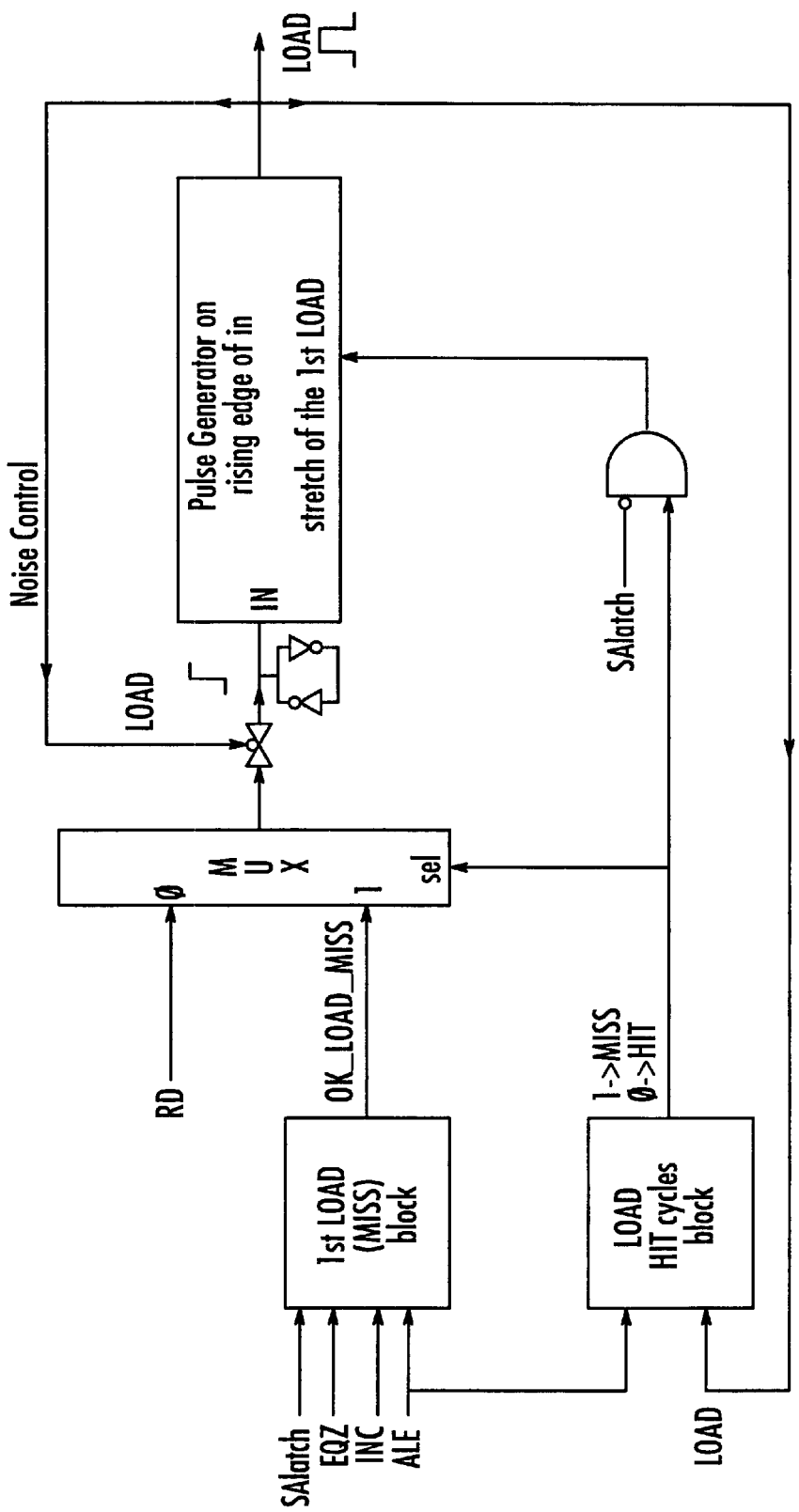
FIG. 17 is a global diagram of the circuit generating the LOAD pulses according to the present invention.

FIG. 16 illustrates what has been explained above. FIG. 17 depicts a global diagram of the structure that comprises a pulse generator on the rising edge of a stimulating input signal; a managing block of the LOAD for a first MISS cycle; a block controlling the HIT cycles; and a multiplexer.

MISS CYCLE Control Block

Once the first access to the memory has started and before generating the LOAD pulse, the system checks that the reading has evolved to the latching phase in order to avoid connecting the sense amplifiers to the data bus while they are still in an equalization phase. In which case incorrect data could be present at their outputs or, which is even worse, during the critical reading causing the input of switching noise to the output buffers.

Meanwhile, the control circuit TIMING, depending on the protocol of the system, will have produced an increment pulse INC for the counters of the internal addresses in order to generate the successive address at which the next reading is to be carried out. The presence of such an increment pulse INC confirms that a HIT cycle is going to take place.

The structure of FIG. 17 exploits this information for deciding the best instant for the production of the LOAD signal using the signals SAlatch and INC. Having waited for and detected that both events took place before generating the LOAD signal is not a sufficient condition to avoid errors. In fact, to ensure the independence from the protocol and from the operating frequency, also the general independence between the arrival instants of the two signals SAlatch and INC must be taken into consideration.

In fact, the SAlatch signal in generally of a monostable kind, that is, it enters in its active phase (in the example it is active low) to indicate the end of the reading by the sense amplifiers and after a certain time, or in case of aborted reading, returns to its rest level.

Thus, if because of a series of aborted readings (that occurs very often) or of eventual purely asynchronous accesses (which do not produce any increment) before getting the INC pulse, and if the SAlatch switched even only once during its active phase, such information would be registered and the INC pulse would be waited for while the MISS cycle reading has not taken place yet.

Figure 18:
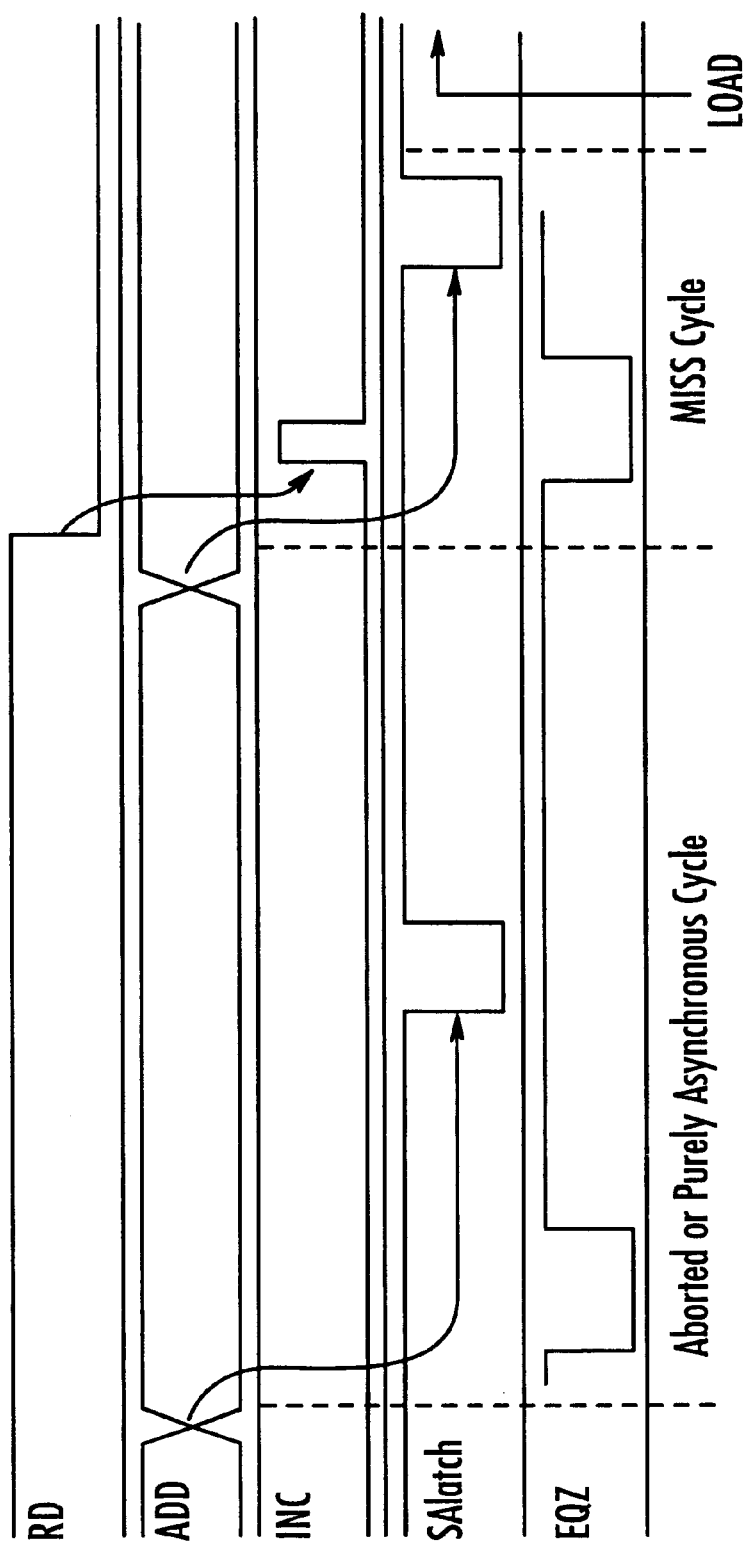
FIG. 18 shows the dependency of the LOAD pulse of the MISS cycle from the signals SAlatch and INC according to the present invention.

As depicted in FIG. 18, the first SAlatch is not related to the true MISS cycle. Therefore, the LOAD pulse must not be generated immediately after the INC pulse, but it is necessary to wait for a new SAlatch. It is evident that the possibility of operating in purely an asynchronous mode, a synchronous-miss and a synchronous-hit, besides the normal management of aborted reading cycles poses a great problem of recognizing the effective reading cycle in progress to manage it in the most appropriate manner.

Such a situation is solved by setting a flag when the signal SAlatch is detected and should a read cycle be restarted without having detected the INC signal, the flag is reset. In practice, the signals INC and SAlatch are used for sending the first LOAD pulse through a sequential structure and the equalization signal EQZ is used to reset the detection flag of Salatch. In fact, during each reading, the equalization phase precedes the latch phase.

The first LOAD (MISS cycle) is generated starting from the rising edge of the signal OK_LOAD, obtained as the logic AND of the two flags coming from two SR flip-flops, namely: the detection flag of INC and the detection flag of Salatch. The flip-flop related to the SAlatch signal is reset at each start of a read cycle by the signal EQZ (which precedes SAlatch just at the beginning of the readings), as far as an INC pulse is detected. From this instant onward it is necessary to leave free the latch to capture the forthcoming SAlatch.

On the contrary, the flip-flop related to the INC signal must reset (and remain reset) at each detection and for the whole duration of the ALE signal (Address Latch Enable). This is because only at the end of the latter the sequential cycles (burst) start, and must set at the end of the first INC pulse.

Finally, a last control on the pulser (which generally once stimulated should produce pulses of the same duration) allows a modulation of the duration of this first LOAD pulse making it at least equal to that of the SAlatch pulse. In fact, if between the two flags the one related to SAlatch was the second to arrive, it would be necessary to check that the pulse be sufficiently long to ensure the data transfer to the buffers. A stretching of the LOAD signal as far as the SAlatch switches can be advantageously carried out in consideration that the SAlatch signal is intended to support this function.

Figure 19:
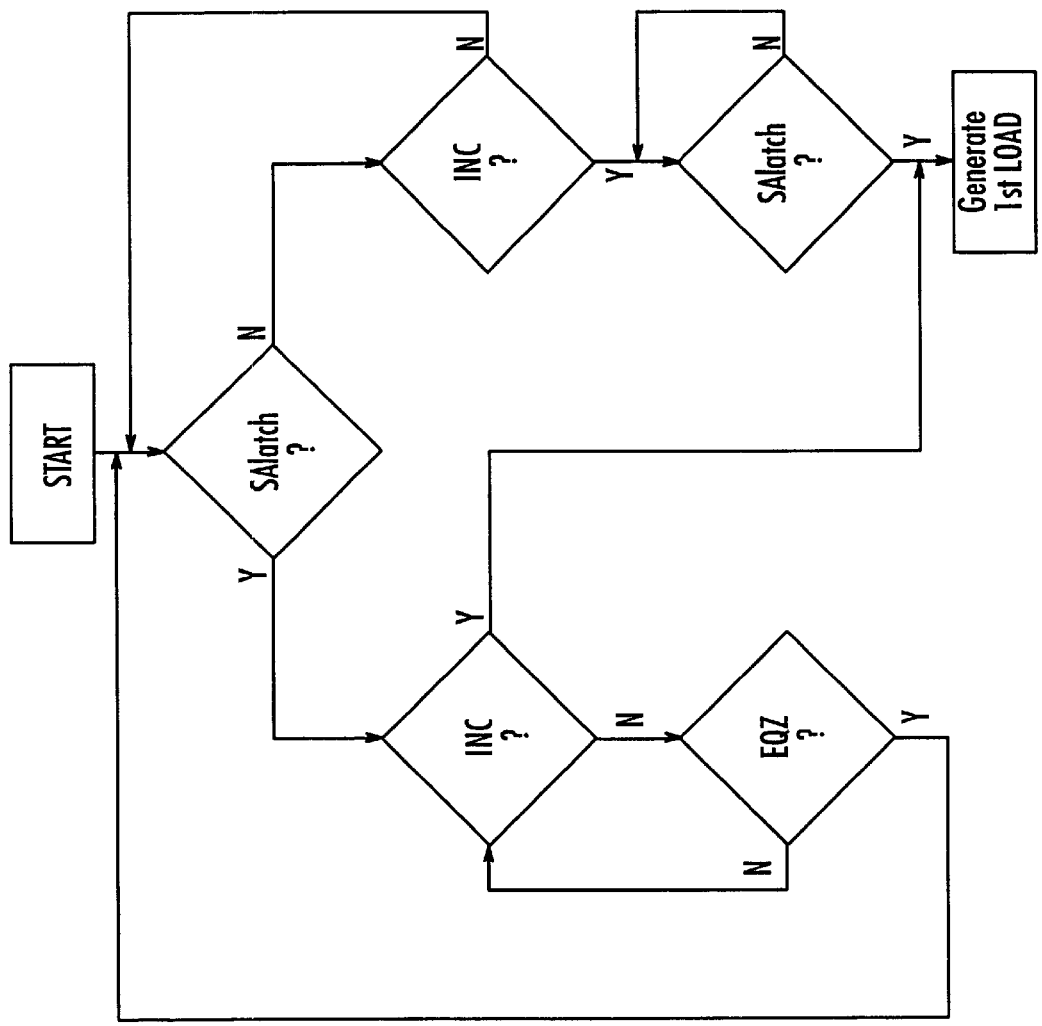
FIG. 19 is a flow chart of the steps for generating the LOAD pulse of a first MISS cycle according to the present invention.
Figure 20:
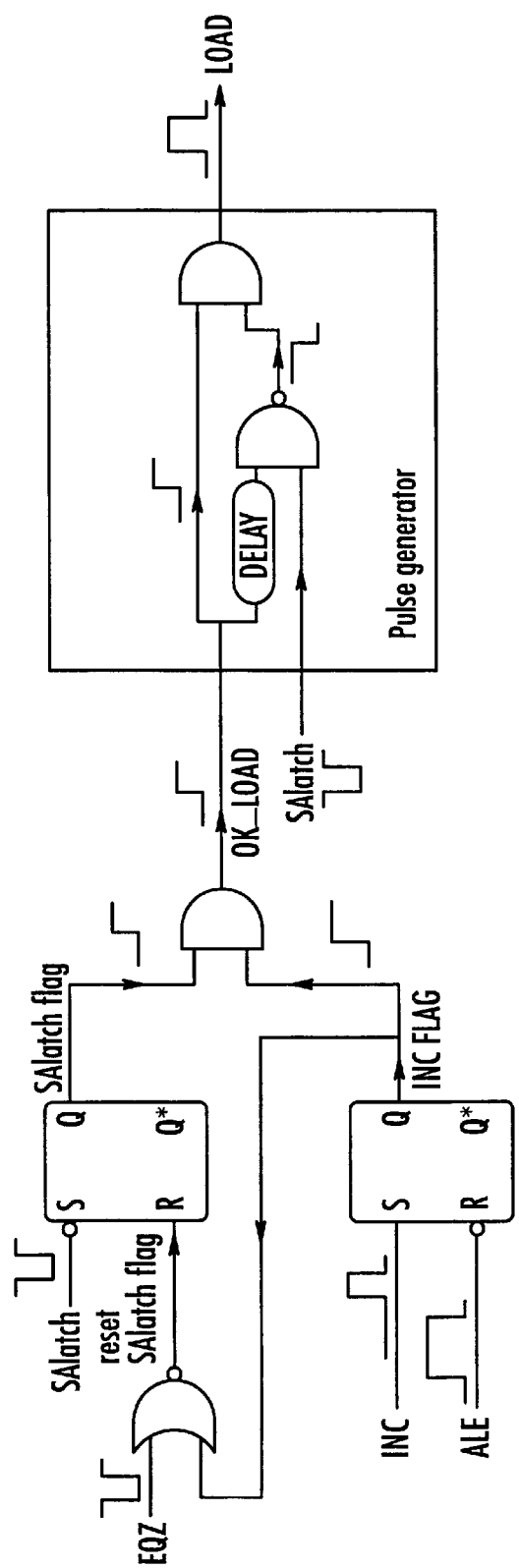
FIG. 20 shows the logic structure of the control block for generation of the LOAD pulse of the MISS cycle according to the present invention.

The flow-chart of the generation of the LOAD signal of the first MISS cycle is depicted in FIG. 19. The functional diagram of the relative circuital structure is depicted in FIG. 20.

HIT Cycle Control Block Detection of the End of the MISS Cycle

It has been remarked above that the control of the MISS cycle waits for events, INC and SAlatch, to verify before generating the first LOAD pulse. Once this phase has terminated it is necessary to free the pulser from signals coming from the sense amplifiers. This is because, for the HIT cycles, the timing is managed by the external signal RD. By this external command RD the system communicates from time to time its readiness to accept the read data.

In this mode the LOAD pulser is driven by the signal RD itself. In practice, a multiplexer is formed by a transfer-gate that is used to decouple the pulse generator from OK_LOAD_MISS and couple it directly to the signal RD, so that at each rising edge of the latter the required LOAD pulse is generated.

The management of the multiplexer may include a master-slave system resetting at the beginning of each MISS cycle with the signal ALE and waiting for the conclusion of the MISS cycle itself. Because, as already said, the first LOAD pulse may have a variable duration (since it depends on the duration of SAlatch), it is necessary to wait for the end of the LOAD pulse to change the signal input to the MUX.

Figure 21:
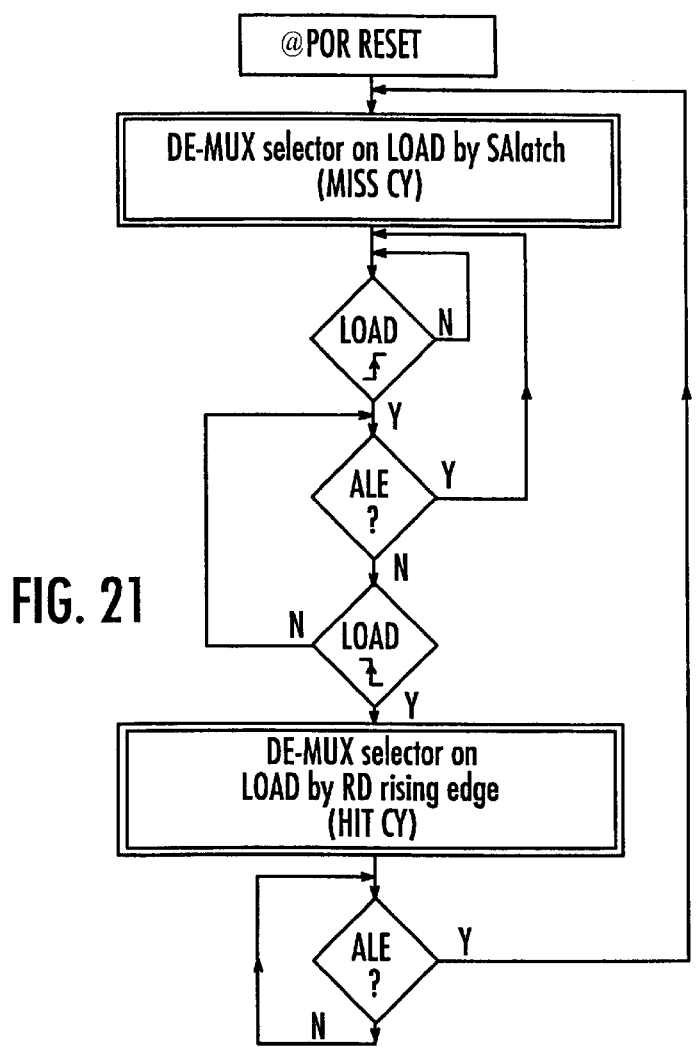
FIG. 21 is a flow chart of the steps for controlling the demultiplexing of the LOAD signals of the HIT cycles according to the present invention.
Figure 22:
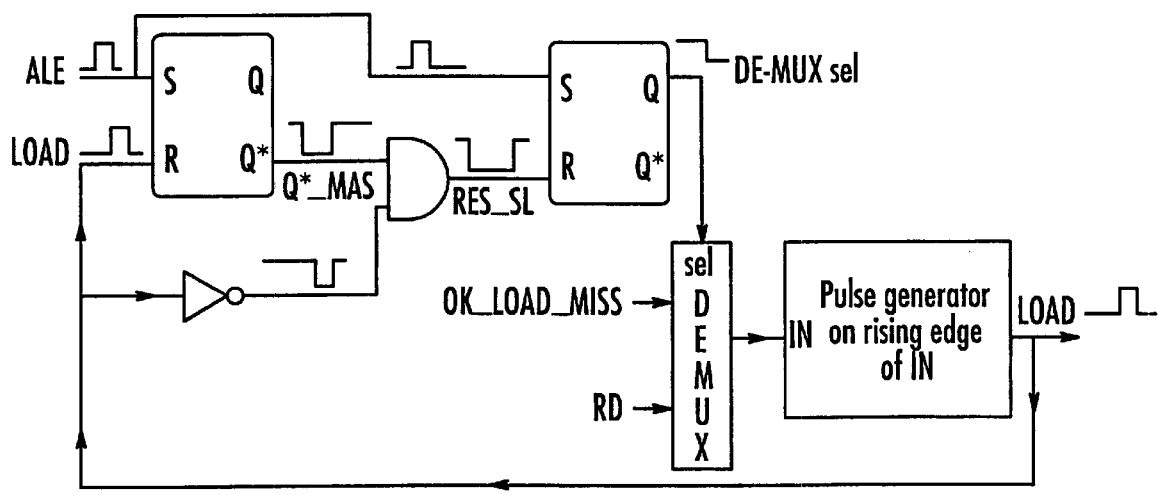
FIG. 22 shows the logic structure of the control block of the demultiplexing according to the present invention.

The relative flow chart is depicted in FIG. 21. From a circuit point of view, the described control is formed using a master-slave flip-flop system as depicted in FIG. 22.

Noise Control

A last consideration about the pulse generator is that the circuit is substantially a monostable circuit capable of deriving the rising edges of the input signal. It must be highlighted that, once the raising edge of RD has been detected, the pulse LOAD that is produced must have an appropriate duration coherent with the time needed to transfer the information from the sense amplifiers to the buffers. That is, it is important to make its duration independent from that of RD, but constant in order to make it manageable always in the same manner by the internal logic.

To ensure this, it is useful to introduce a last control which, once the generation of the signal LOAD has been detected, decouples the pulser from the rest of the upstream circuitry (i.e., from OK_LOAD_MISS or from RD), waits for the end of the pulse and finally couples again the structure to the mux, ready to be triggered again by a new rising edge.

Such an additional control avoids the burden of designing the pulser circuit as a function of the duty-cycle of the clock RD. In fact, should the active phase of the stimulating signal have a shorter duration than the delay of the generator itself, the generated pulse would be coincident with RD and it would not be easily manageable by the internal logic.

Figure 23:
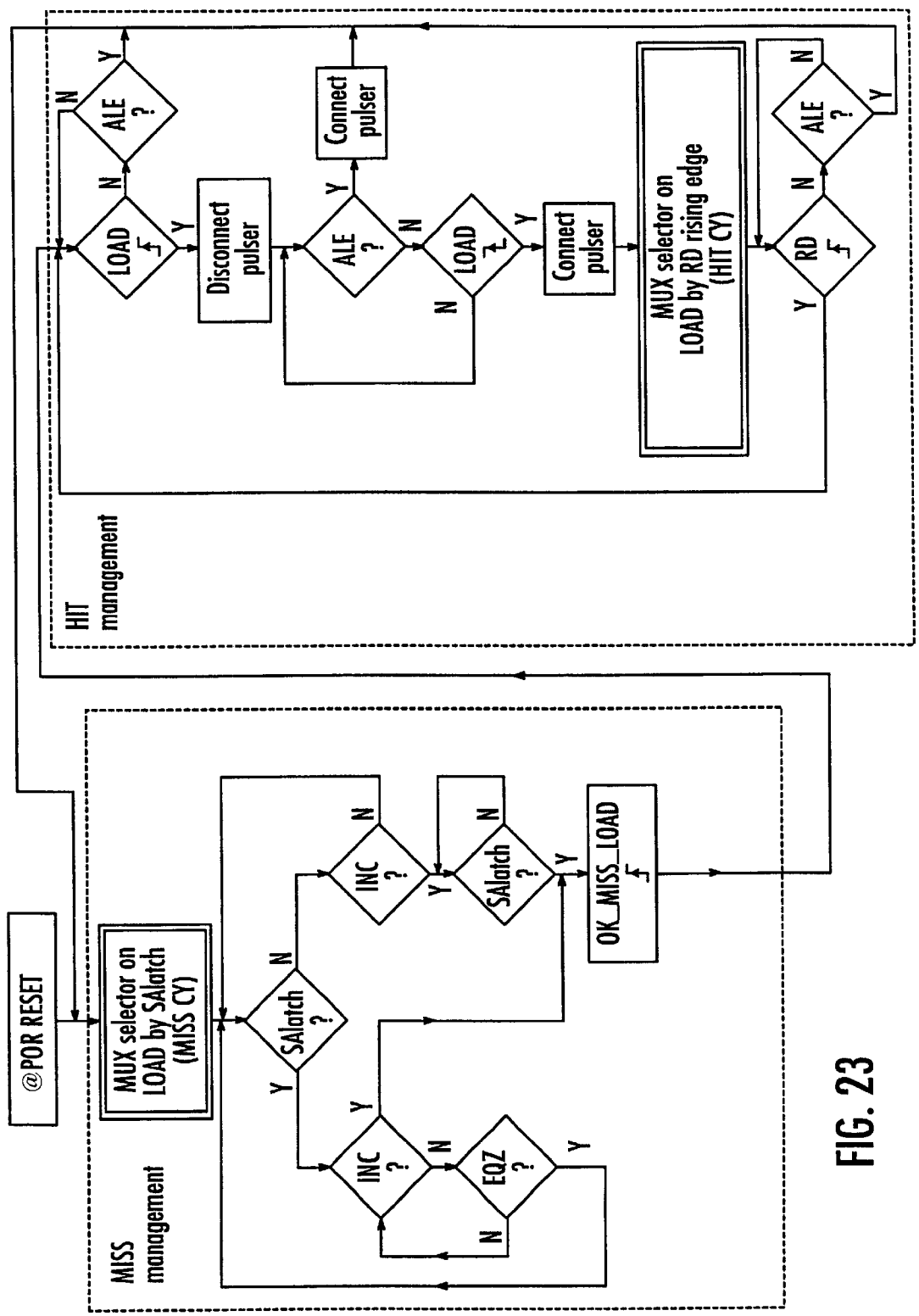
FIG. 23 is a global flow chart of the steps performed by the circuit generating the LOAD pulses according to the present invention.

Moreover, even if the active period of RD lasted sufficiently, the problem of the presence of eventual glitch on the RD signal that could stimulate an anticipated conclusion of the LOAD phase would not be eliminated. The flow chart of this additional control is depicted in FIG. 23.

Managing the Output of the Read Data

The LOAD and DLATCHN signals directly affect the reading time of the memory because they determine the update of the output. Starting from the generation of a primary LOAD pulse a processing as a function of the priority, and above all of the outphasing among the signals coming from the sense amplifiers and the external control signals is performed.

Such a processing is carried out by the block BUFFOUT_CTRL of the control circuit TIMING of the memory, whose function is to produce secondary signals. Namely LOAD_EV and LOAD_OD for a correct transfer of the data from the output latch of the respective array of sense amplifiers to the data output register, and for the generation of the DLATCH signal for transferring the data from the output register to the output buffers.

Figure 24:
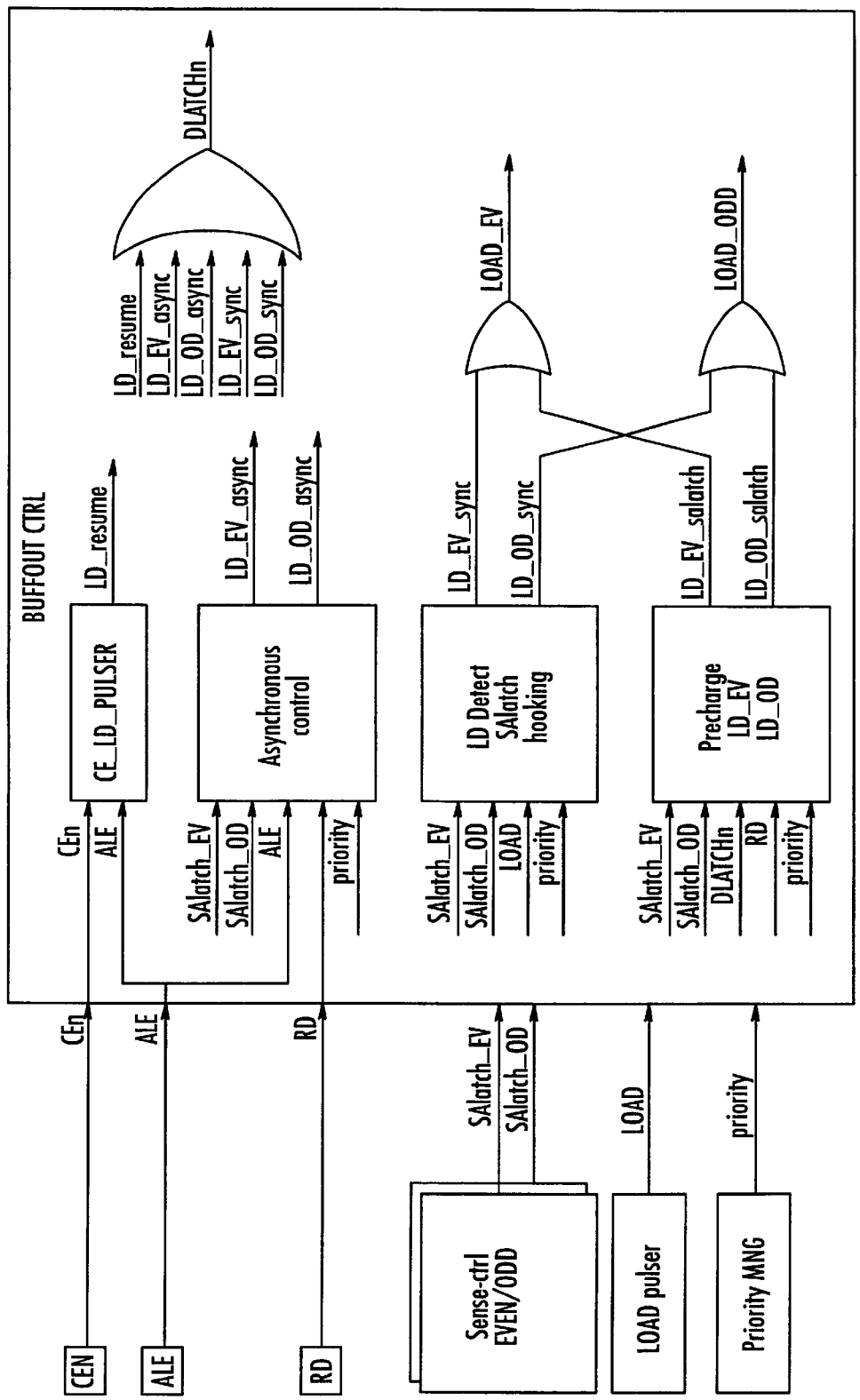
FIG. 24 is a block diagram of the data output control circuit according to the present invention.

The functional structure of the block BUFFOUT_CTRL is depicted in FIG. 24. The main blocks forming the structure of FIG. 24 and their functions are:
  the block managing the asynchronous functioning;
  the block detecting the primary LOAD signal with a locking function to the SAlatch signal;
  the block anticipating the signals, LOAD_EV and LOAD_OD, with respect to the DLATCH signal; and
  the block generating the DLATCH in case of RESUME.

Figure 25:
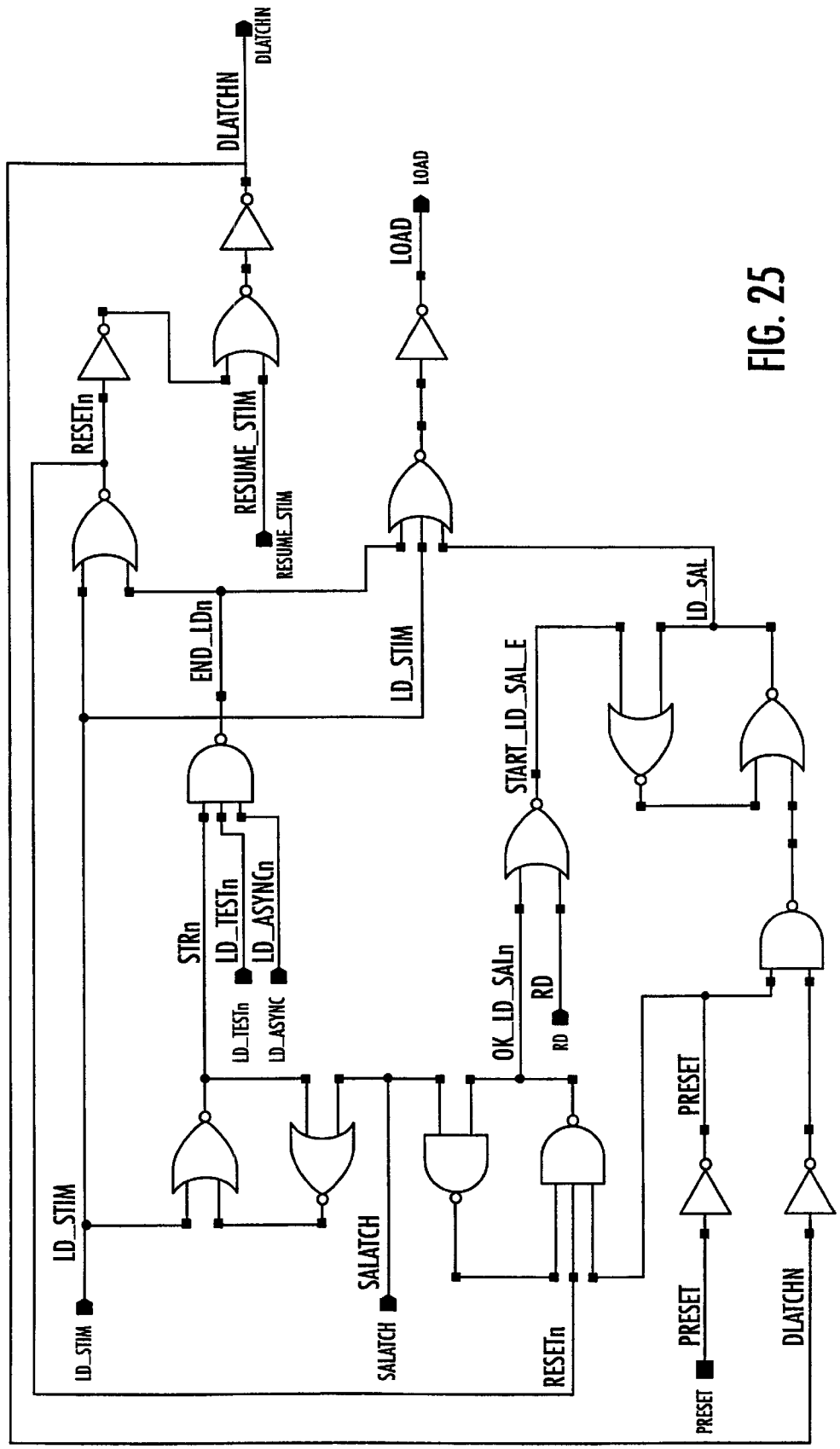
FIG. 25 is a diagram of the control circuit of the output buffers according to the present invention.

In the asynchronous mode, the signal DLATCH is generated by LOAD_EV_ASYNC and LOAD_OD_ASYNC, which are always exactly dependent in an exclusive manner from their respective signals SAlatch_EV and SAlatch_OD that are produced each time new data is ready to be output by the sense amplifiers. In the synchronous mode, the asynchronous control block is disabled and the relative LOAD signals (EV or OD) are produced by distinct functional blocks, a circuit embodiment of which is depicted in FIG. 25.

Detection of the LOAD Signal with SAlatch Locking: This block detects the presence of two simultaneous events (request of output data and updating in progress of the output latch of the sense amplifiers in progress). In particular, the block detects the delay condition for the closing of the second event with respect to the first one. In this case, the particular locking mechanism allows to advantageously extend the associated pulses LOAD and DLATCHN by conditioning them to the end of a complete and correct updating period of the output latches of the sense amplifiers.

Pre-load LOAD_EV and LOAD_OD: This block enables the transfer of the data present in the output latches of the sense amplifiers to the data output register if the current read cycle has terminated before a request of the data (rising edge of RD). It must be observed that the signal DLATCHN that remains tied to the effective request by the protocol is not generated.

Detection of the LOAD Signal with SAlatch Locking

This block detects the external request for the data being sensitive to the primary LOAD signal (produced by the LOAD_PULSER in coincidence with the leading edge of RD) and starts the generation of an effective specific command LOAD_EV_SYNC or LOAD_OD_SYNC, depending on the priority.

The width of such a pulse is modulated by the SAlatch signal. Therefore, the starting of the pulses LOAD_EV_SYNC or LOAD_OD_SYNC is established by the primary LOAD signal while their duration depends on the duration of the respective SAlatch signal.

Pre-load LOAD_EV and LOAD_OD

Figure 26:
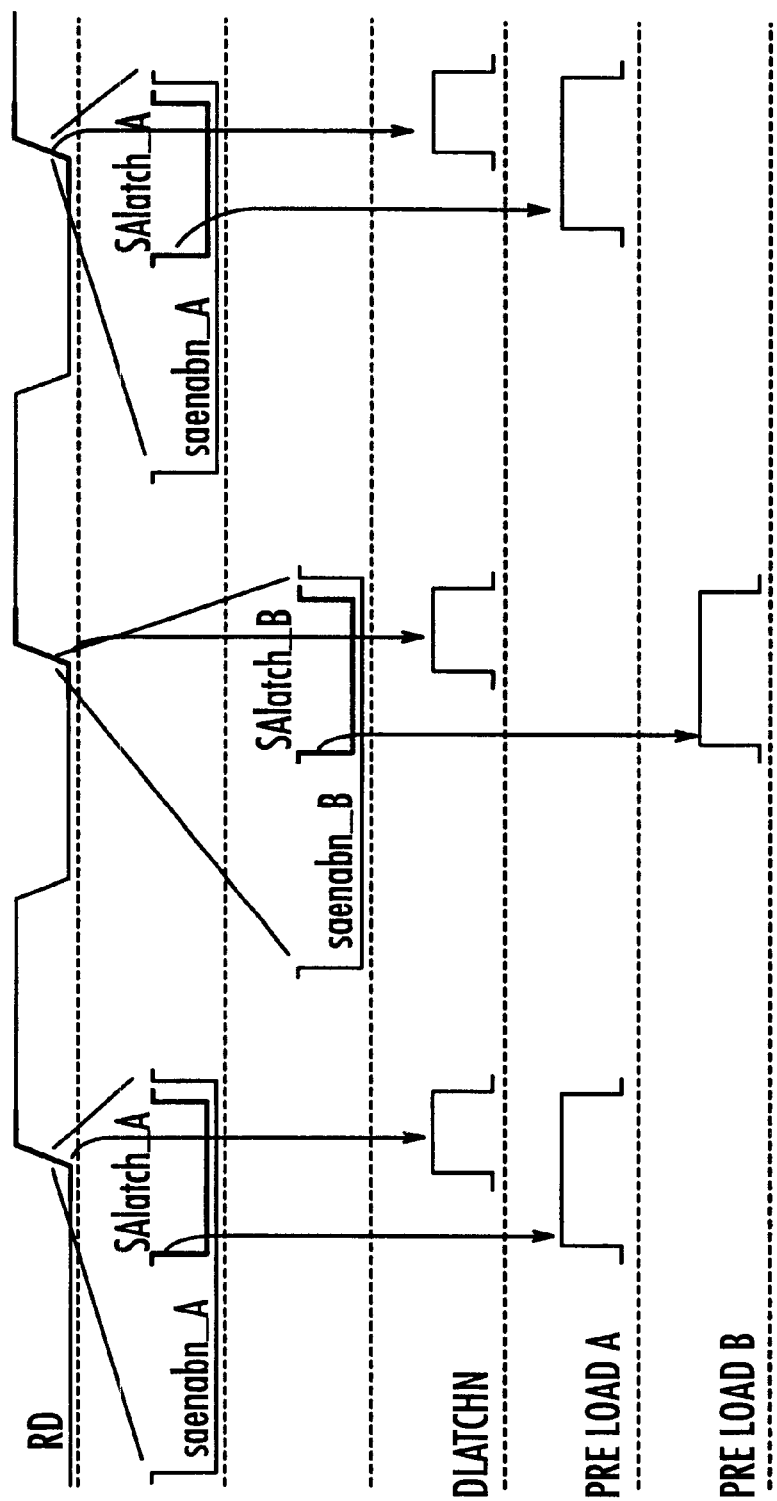
FIG. 26 shows the time evolution of the signals involved in preloading the data in the output data register according to the present invention.

The objective of this block is to anticipate, whenever possible, the transfer of the data from the output latches of the sense amplifiers to the output data register. By referring to FIG. 26 it is evident that if the external signal RD has returned to the logic zero, the pulse DLATCHN has ended (i.e., the path from the output data register latch to the output buffers is disabled), and the signal SAlatch has come from the SENSE_CRTL of the other bank (i.e., the successive data is ready in the output latches of the sense amplifiers of the other bank).

It is possible to transfer such new data in he output data register. In other words, the updating f the output register is advantageously anticipated even if the effective request for new data established by a new rising edge of the external command RD has not yet been detected. This anticipation allows the gain of precious nanoseconds for the so-called $TOE_{sync}$ (Time Output Enable).

It must be emphasized that the anticipated updating of the output data register latch has no effects on the output buffers, the coupling of which to the output pipeline depends solely on the signal DLATCHN. In other words, the new read data is not made visible to the outside until requested by the external clock RD.

ATD Signal Generator

Differently from the case of functioning as a random access standard memory, in the case of burst access synchronous functioning it is necessary to start the sequential readings, successive to the first one and synchronize them with the internal generation of addresses. A common ATD pulse generator is unsuitable because the external address lines do not switch (or are not accessible to the memory) during synchronous cycles.

It is also true that if a generic signal untied from the internal addresses generated were used for starting sequential readings, the sensing circuit would become independent from the decoding circuitry. This is with the risk of anticipating or delaying the start of the reading with respect to the correct selection of the memory cells to be sensed. As mentioned above, these problems are effectively overcome by still using for starting sequential readings an ATD signal, although generated when the start of a new synchronous cycle is detected.

According to an aspect of the memory architecture of the invention, an ATD pulse generator conventionally sensitive to the external address lines enabled by the fundamental protocol signal ALE (Address Latch Enable) is used. The presence of such a signal ALE establishes that it is necessary to start a read cycle from an external address. The ATD signal produced by the switching of external address lines is sent to both banks that may then enable the respective reading structures. Such a cycle is either the first random access cycle of a sequence of burst readings or a generic asynchronous access.

If the access were purely asynchronous, both banks will terminate the readings, but only the bank effectively addressed by the external address shall output its data. The bank priority is defined by the least significant bit A<0> of the address, as already explained.

In contrast, because of the switching back to a low level of the signal ALE, the read cycles were interpreted as the first random cycle of a burst sequence. The control logic of the memory would generate a first increment pulse for the address counter of the bank that is not in priority, as pointed by the input external address. For example, the bank ODD would be generated by way of a respective pulse INC_O, to generate the address on which to carry out the following or second reading.

Using as a stimulation such an increment pulse INC_O, intended to one of the internal address counters, a new dummy ATD pulse is generated to start a new read cycle on the ODD bank, i.e., on the bank whose internal address is being incremented. In this way, the reading on the bank EVEN is left to evolve and by way of a new dummy ATD pulse, following the generation of an internal address counter increment pulse, the reading on the other bank ODD is restarted for the updated internal address.

At the end of a first random access cycle a new increment pulse INC_E, intended for the address counter of the EVEN bank on which the reading has just terminated, will be generated. This is only after having delivered to the output the data read during the first random access cycle from the EVEN bank. Again, by using the address counters increment pulse, a new ATD pulse dedicated to the bank EVEN will be generated to restart a new reading, while the ODD bank, having acquired priority from the control logic, will be completing the reading cycle as far as to the outputting of the read data.

Basically, by continuing to produce increment pulses alternately for the respective address counters, dedicated ATD pulses are coordinately generated to start the readings on the two banks in an alternate fashion.

Figure 27:
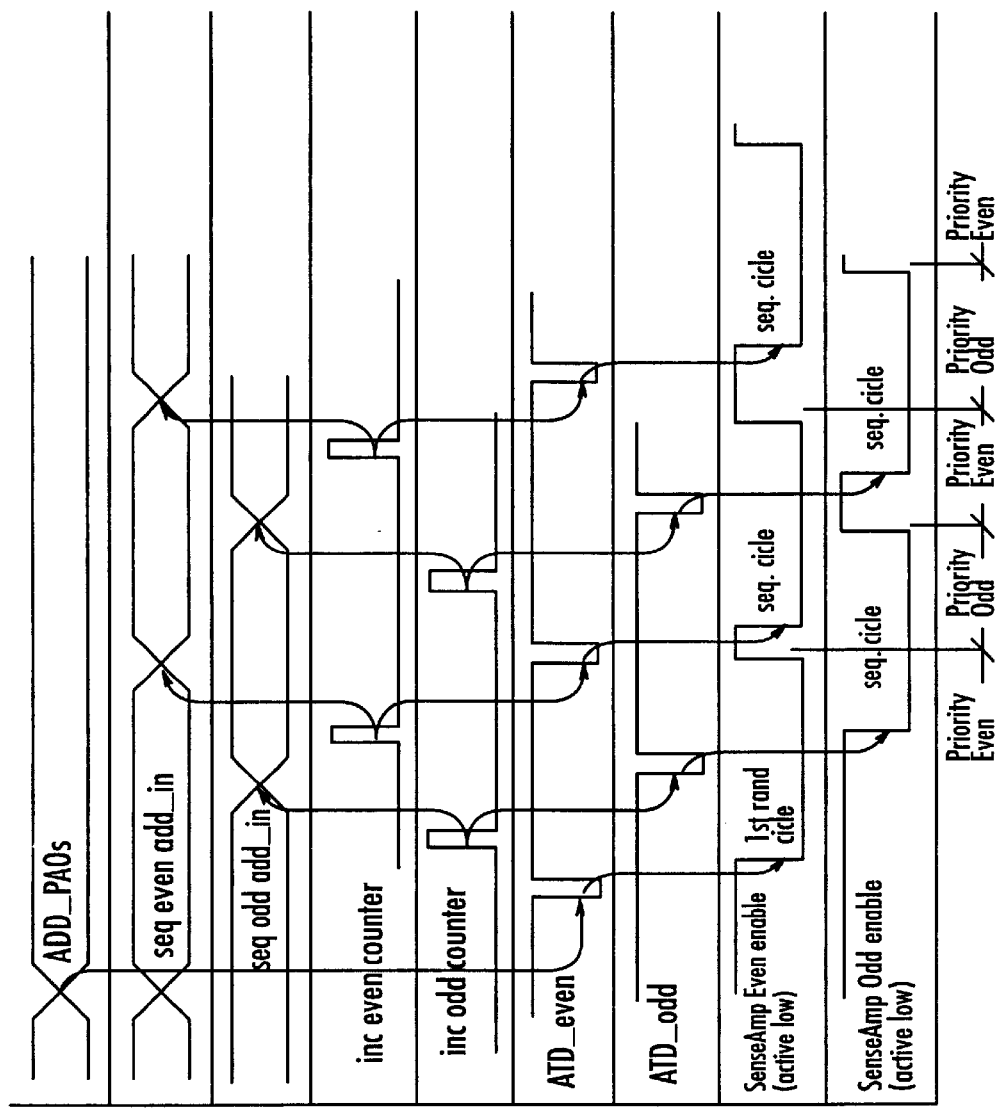
FIG. 27 shows the time evolution of the signals involved in generating the ATD signals according to the present invention.
Figure 28:
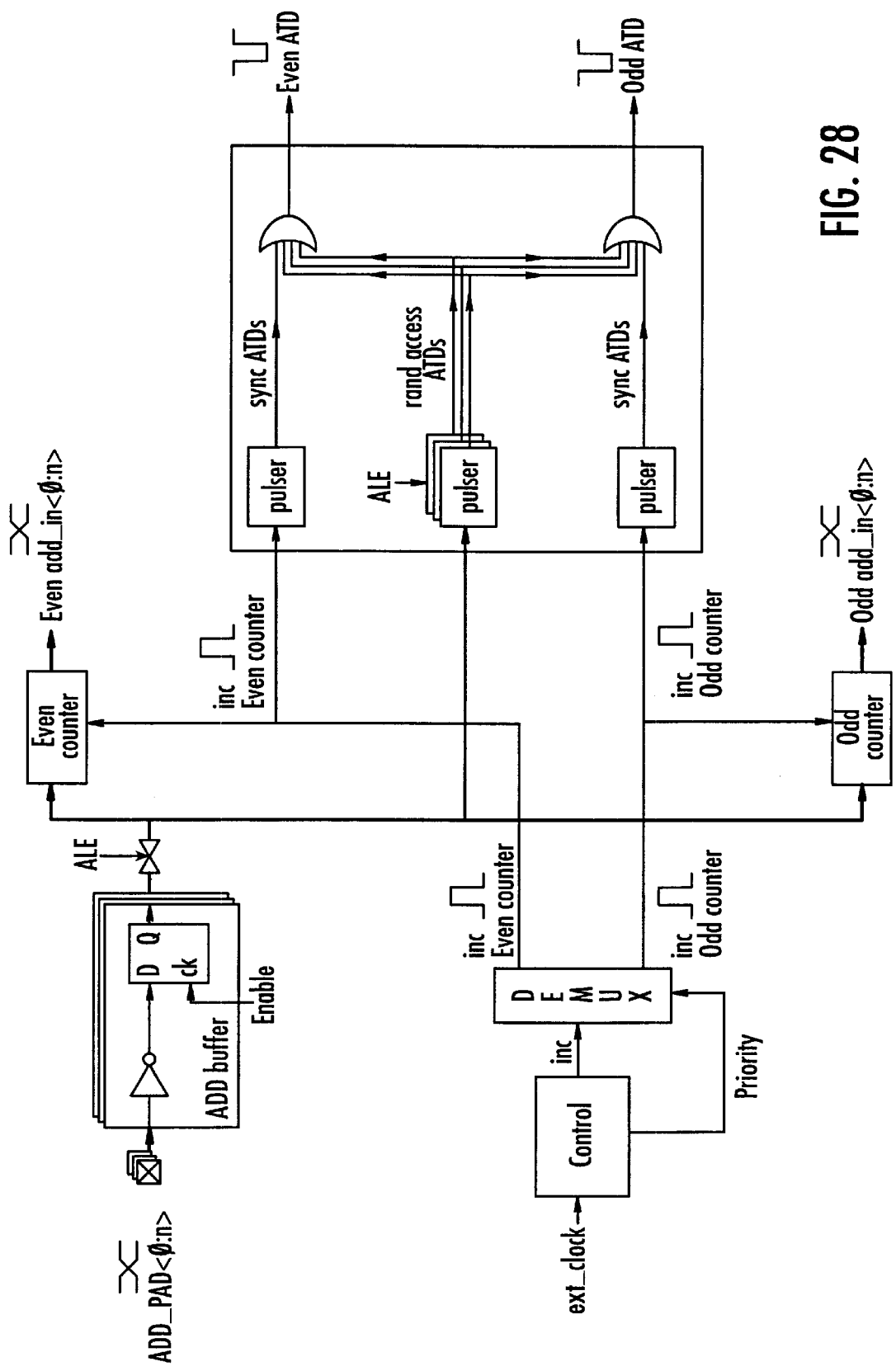
FIG. 28 is a basic diagram of the circuit that generates the ATD pulses according to the present invention.

Timing diagrams of the main signals are shown in FIG. 27. A block diagram of the ATD GEN block is shown in FIG. 28. It includes the classic structure of an ATD generator based on circuits sensitive to the switching on the external address input lines. The ATD pulses that are generated upon the sensing of a switching in the external address lines are common for both banks and are used for all the standard random access cycles.

According to the present invention, the ATDGEN block includes also two auxiliary PULSER blocks, respectively stimulated by address counter increment pulses specific for the address counter of the bank EVEN and for the address counter of the ODD bank. These blocks determine the generation of specific EVEN ATD and ODD ATD pulses for one of the two banks for carrying out sequential readings (synchronous mode of operation). During a burst access synchronous mode of operation, the generation of ATD pulses common to both banks by the switching of external address lines is prevented by the protocol signal ALE.

A fundamental advantage includes making the path of the control signals (starting from the ATD pulse) in case of a sequential reading the same as in case of random access asynchronous readings. In fact, the generation of the ATD pulses takes place in the same logic phase of a reading, that is, when the latches that form the internal address counter are stabilizing themselves. This is whether the address is input from outside or it is internally generated through an incrementing of the counter itself.

In this way, the same propagation delay of the ATD pulses in case of a standard random access read cycle is ensured. This equality of propagation delays resolves in a simple and effective manner the problem of a synchronized start on the two banks of the burst access readings without requiring the introduction of any further control logic. By virtue of the fact that burst access readings take place through the same mechanisms (starting from the increment pulses) and using the same circuits as the random access readings, there is a further guarantee of correctness of the operation and of robustness of the architecture.

An additional advantage is represented by the exploitation of the distinct increment pulses of the internal address counters of the two banks. In this way, no further processing is necessary for correctly conveying the dummy ATD pulse to one bank without affecting the other bank. The alternative of generating a common ATD pulse for the two banks and successively permit propagation only toward the correct bank would require in fact a further control signal for implementing the required multiplexing (for example, a priority signal).

Internal Reconditioning of the ALE Command

In complex systems, the ALE signal is often shared by several devices of the system, and therefore it is filtered by a second fundamental control signal of the protocol such as the chip enable signal CEn, specific for the particular device.

At high operating frequencies, the intrinsic delays that are introduced by the propagation lines of the signals cannot easily be predicted and controlled. This may create criticalities due to possible non-synchronizations between the two signals that must be avoided in order to correctly discriminate the ALE pulses intended for the memory device from those intended to other devices of the system.

Figure 29:
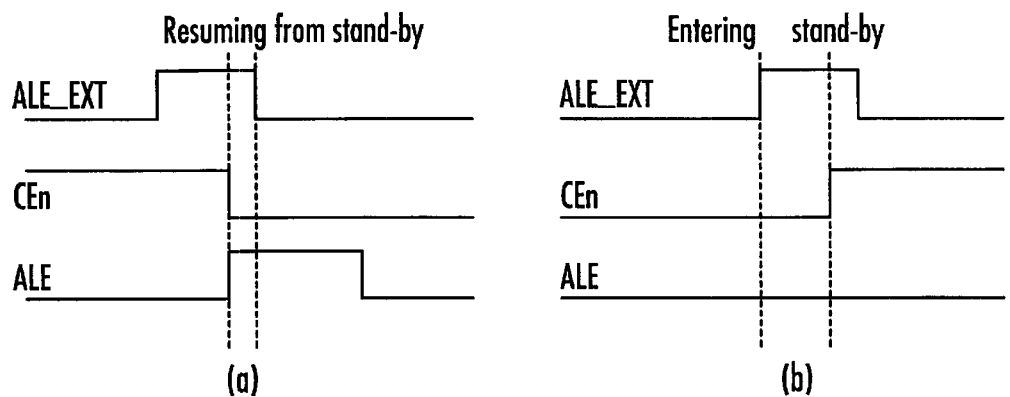
FIG. 29 shows the criticality due to possible nonsynchronization between the two external commands ALE and CEn according to the present invention.

Moreover, the synchronous mode of operation may often contemplate the possibility of resuming the sequential readings at the end of a stand-by period from the point in which the sequence of readings had been interrupted (Recovery&Resume). However, if in passing from the active phase to the stand-by phase, the ALE pulse anticipates the switching of the chip enable signal CEn, as illustrated in FIG. 29b, an incorrect capture of external addresses could occur with a consequent loss of the internal address autonomously calculated by the address counters of the two banks.

During the stand-by phase, the external ALE signal must be filtered, while upon reentering from stand-by and applying an external ALE pulse, the capture of the new address must take place with utmost speed in order not to lengthen the time. Usually, there is an ample combination of instances contemplated by the protocol that may make difficult interpreting the ALE signal. For example, if at high frequency, an ALE pulse of reduced duration is sliced by the CEn signal (1→0) there will be a consequent reduction of its effective duration, as depicted in FIG. 29a. This may not permit the new address to be acquired correctly.

In order to ensure a correct functioning of the memory device under any conditions, even at particularly high frequencies, the use of a conventional input buffer that reproduces faithfully the external ALE signal, may not be sufficiently reliable. According to an important aspect of this invention, a special structure overcomes the above noted problems by producing internal replicas of the ALE signal having a duration sufficient to guarantee the correct functioning of the memory device in all situations and to tolerate possible misalignments with external protocol signals.

Figure 30:
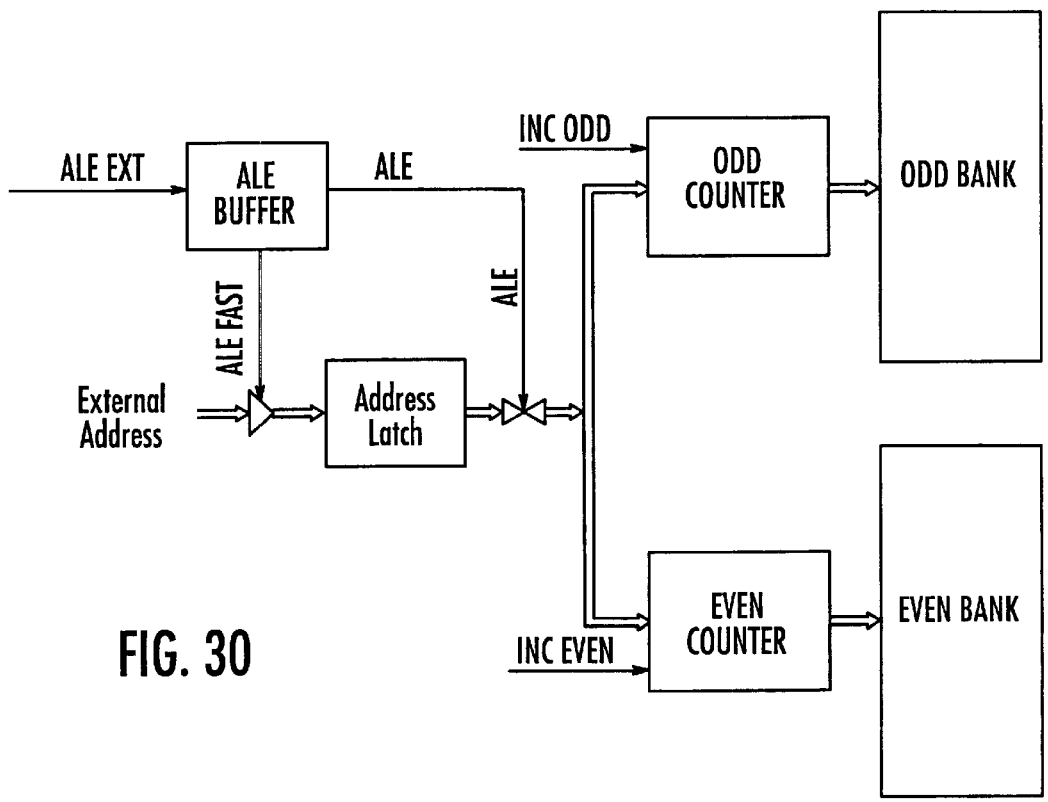
FIG. 30 is a basic diagram of a preferred embodiment of a circuit for internal regeneration of the external command ALE according to the present invention.

In order to illustrate this, it is useful to observe the elementary scheme of the input signal paths of the memory, depicted in FIG. 30. The signals output by the circuit are two, namely: ALE_FAST and ALE. The first of the two signals, ALE_FAST, controls the acquisition of the external address in the input latches in cascade of the input buffers. The second signal, ALE, controls and validates the acquisition of the address contained in the internal latches toward the counters EVEN COUNTER and ODD COUNTER of the respective banks. The output of the counters point directly to the memory locations and each time they are updated, a new reading cycle starts.

Figure 31:
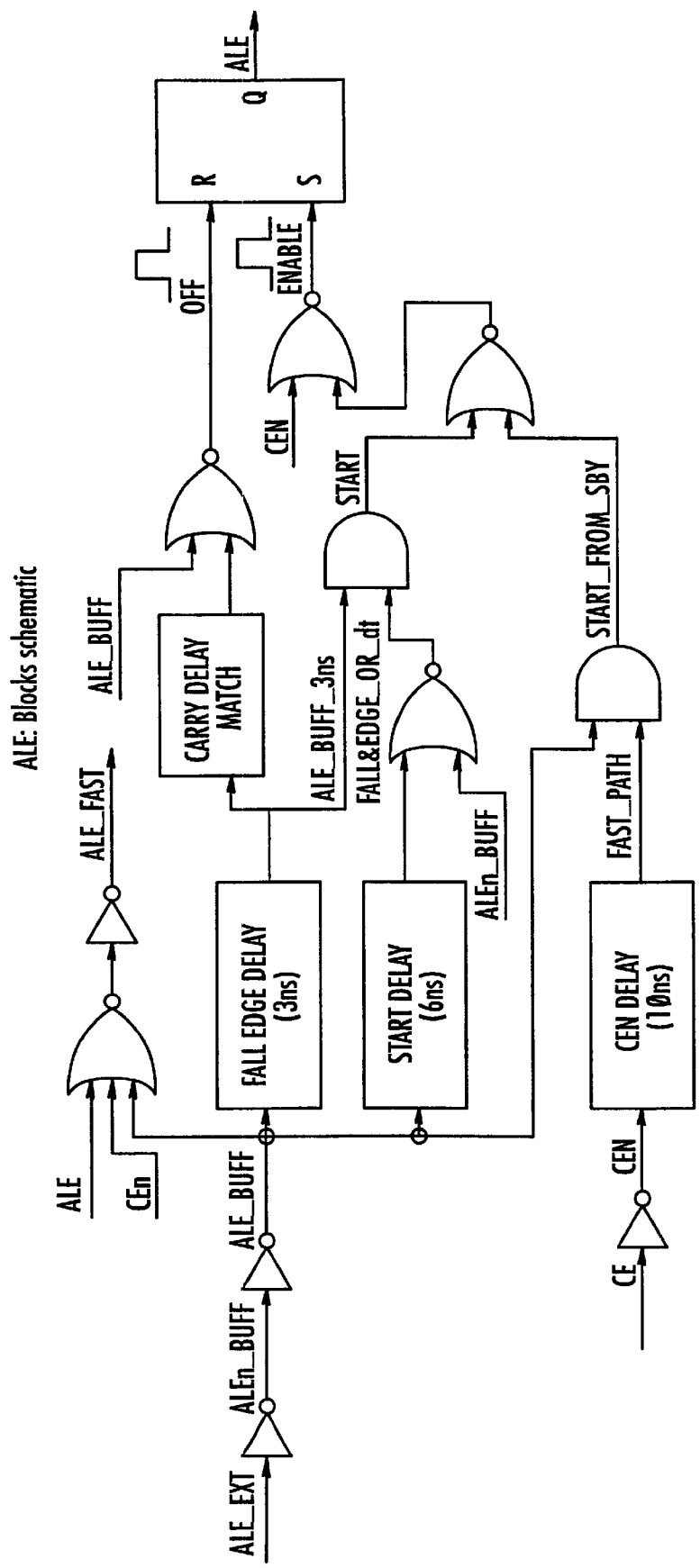
FIG. 31 is a diagram of the circuit illustrated in FIG. 30.

The circuit structure of the invention is depicted in FIG. 31. The input latch of the external command, referred to as ALE_EXT, introduces a certain hysteresis. The network that generates the replica signal ALE_FAST is designed to produce it directly and substantially without any appreciable delay.

The circuit structures (START_DELAY and relative logic) that control the setting of the SR latch permit validation of the acquisition of the external address in a definitive manner at the end of a filtering action such to prevent false updating of the external address.

The structure CEn_DELAY permits the filtering action to be suspended by the external command CEn upon reentering from a stand-by phase (start_from_sby=1). The structure 3 ns_DELAY limits the filtering action if the external ALE pulse is excessively narrow by permitting an immediate updating of the counters with a fair margin. The structure CARRY_DELAY_MATCH permits the construction of an internal pulse of minimum duration equal to the maximum time of propagation of the carry bit in the counters. This ensures a correct propagation of the first carry.

Figure 32:
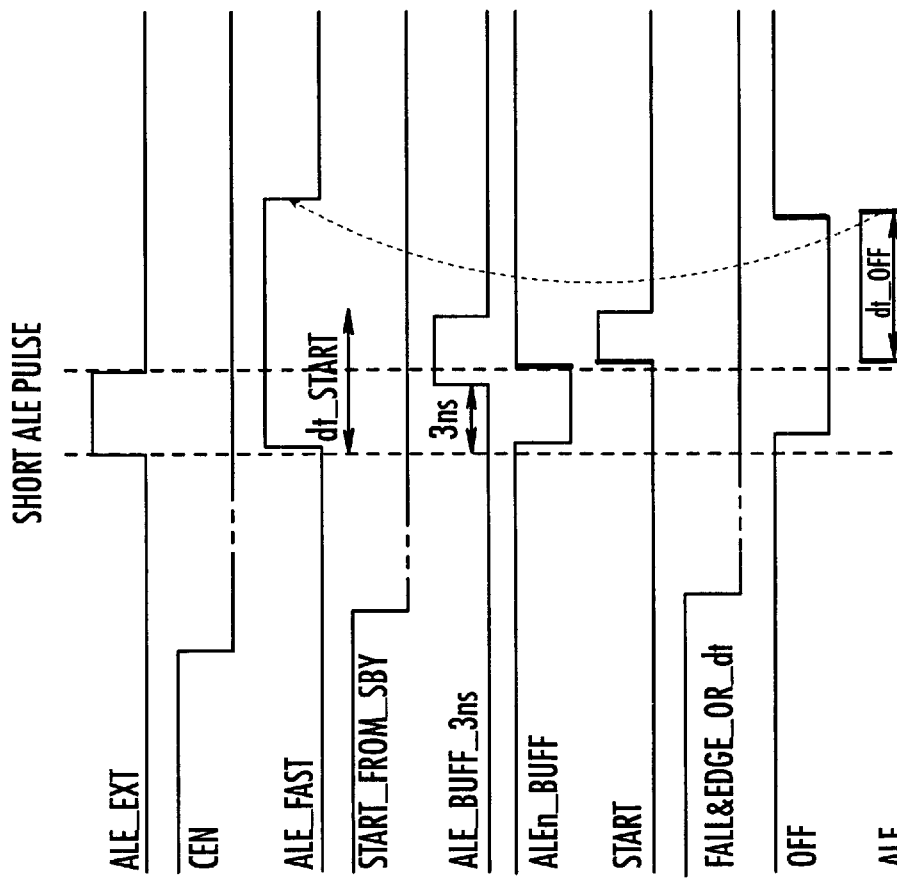
FIGS. 32, 33 and 34 illustrate the behavior of the circuit of FIG. 30 under different situations.
Figure 33:
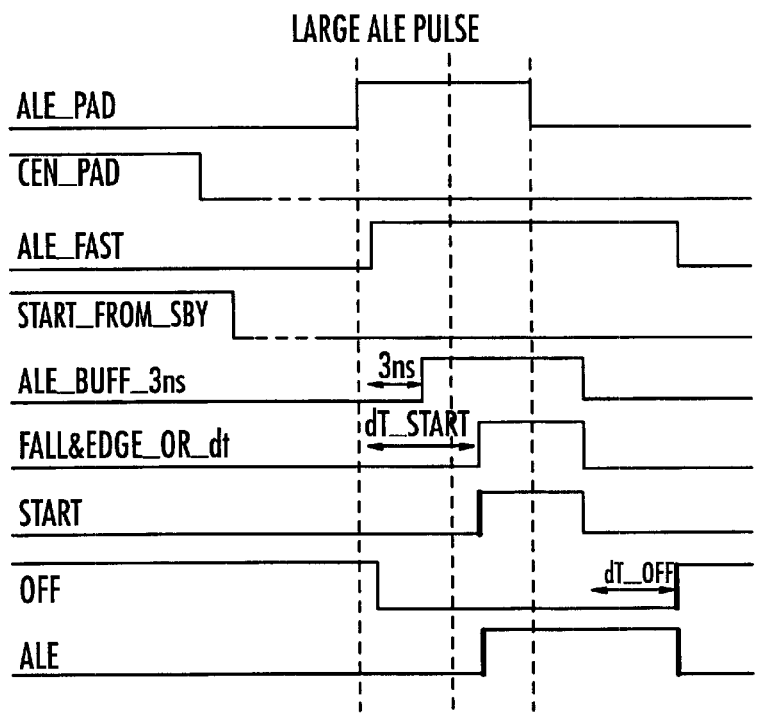
Figure 34:
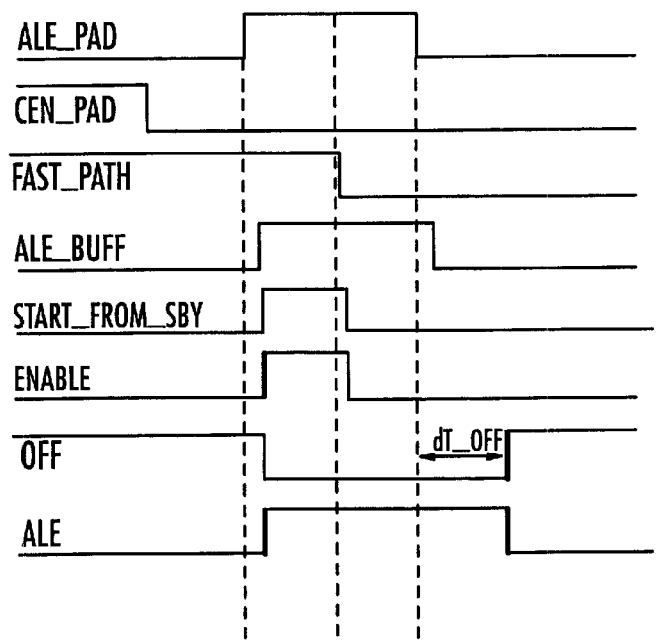

In the circuit of the invention, three distinct paths leading to the enabling of internal replicas of the ALE signal are present. They are alternatively enabled as a function of the state of the asynchronous state machine. In particular, four distinct situations may be defined:

a) narrow external ALE pulse during an active phase (CEn=0), as depicted in FIG. 32;

b) broad external ALE pulse during an active phase (CEn=0), as depicted in FIG. 33;

c) passage from an active phase to a stand-by phase; and d) resuming from a phase of stand-by with slicing of the external ALE pulse, as depicted in FIG. 34.

In the above noted four situations, the circuit generates in completely different manners the two internal replica signals: ALE_FAST and ALE. The communication protocol contemplates that if the memory is in a synchronous mode of operation, the existing output data should not absolutely be corrupted unless the user intentionally wants it.

Such a condition rests on the falling edge of the external ALE circuit or in the fact that after a certain time the CEn signal has not yet switched from a 0 to a 1. Therefore, it is necessary to delay the internal propagation of the ALE signal as long as and not beyond the falling edge of the externally applied ALE signal (case A, FIG. 32), or wait a certain time before producing the internal replica pulse (case B, FIG. 33).

The evolution of the internal signals of the circuit of FIG. 31 is illustrated in FIGS. 32 and 33. In case A illustrated in FIG. 32, the start of an internal ALE pulse is stimulated by the falling edge of the external signal ALE_EXT. In case B illustrated in FIG. 33, a specified time interval (dt_START) is let to elapse before stimulating the generation of the internal ALE replica pulse. This analog delay may be realized by using a reference voltage source provided with a suitable stabilizing network. This is done in order to make the delay as much as possible stable upon the varying of the supply voltage, of temperature and in relation to the fabrication process spread.

In fact, in normal operation conditions the delay introduced in generating the internal replica of the external ALE command determines an expansion of the read time of the memory. This effect of expansion of the read time is reduced due to the immediate generation of the other internal replica signal ALE_FAST that immediately enables the input circuits. This reduces the overall propagation time according to the scheme of FIG. 24. In all situations, the ALE_FAST signal is immediately issued upon sensing the rising edge of an external ALE pulse.

In case C illustrated in FIG. 29b, the internal ALE pulse is not generated because of the switching CEn signal (0→1) that keeps the memory device in a stand-by condition and inhibits the set of the output latch of the circuit of FIG. 31. In case D, the memory is in a phase of resuming operation at the end of a stand-by period, and therefore it is necessary to generate as fast as possible both an internal replica of the external ALE_EXT pulse, that is both the ALE and the ALE_FAST pulses. In this case, by exploiting the delay CEn_DELAY, the asynchronous state machine recognizes this situation and enables the fastest circuit path that sets the issuing of the internal pulses, as depicted in FIG. 34.

Substantially, the circuit of the invention implements and uses different possible circuit paths (relatively slow and fast paths) for issuing the internally generated replica pulses, thus satisfying contrasting requirements. Another function of the circuit is to control the width of the ALE pulse. This is particularly important when starting a phase of the synchronous mode of operation of the memory.

The internally generated ALE pulse, beside incrementing the address in the counters, starts in coincidence with its falling edge, the subsequent synchronous phase of operation of the memory. In this phase, it is necessary to increment the address counter of the bank on which the next reading must take place. In particular, by introducing an external address pointing to the ODD bank (A0=1), it is necessary to increment the counter of the EVEN bank before effecting the successive synchronous read cycle. The internally produced ALE pulse must be such to allow for the capture of the updated address by the counter of the EVEN bank and permit the propagation of the carry of the counter to make it ready for a subsequent increment.

By observing the block diagram of FIG. 31, the purpose of the 3ns delay coupled to the CARRY_DELAY_MATCH may easily be understood in determining the width of the pulse and controlling the OFF node. The delay may be compared with the delay of the carry in the address counter, and is enabled starting from the falling edge of the external ALE pulse. This ensures a certain minimum duration of the internally regenerated ALE pulses.

Optionally, the circuit may further include forcing devices useful in test modes or during the execution of internal algorithms; anti-noise protections activated during the transitions of the outputs; and trimming devices of the analog delays, implementable in metal 1. Of course, the delay network used must ensure a constancy of the introduced delay with the varying of the conditions of operation, such as temperature and supply voltage, in addition to being precise.

Compensated Delay Circuit

The delay circuits commonly used are normally based on controlling the discharge time of a capacitor through an n-channel transistor biased with a constant reference voltage $V_{ref}$ independent of temperature, typically derived by a common band-gap circuit. Such a circuit has drawbacks. The discharge time of the capacitor is directly proportional to the supply voltage $V_{dd}$ (which is the level from which the discharge starts), and is inversely proportional to the discharge current $I_{sc}$. Because $I_{sc}$ is constant, there is a direct dependence of the discharge time, and therefore of the delay introduced from the supply voltage.

Figure 35:
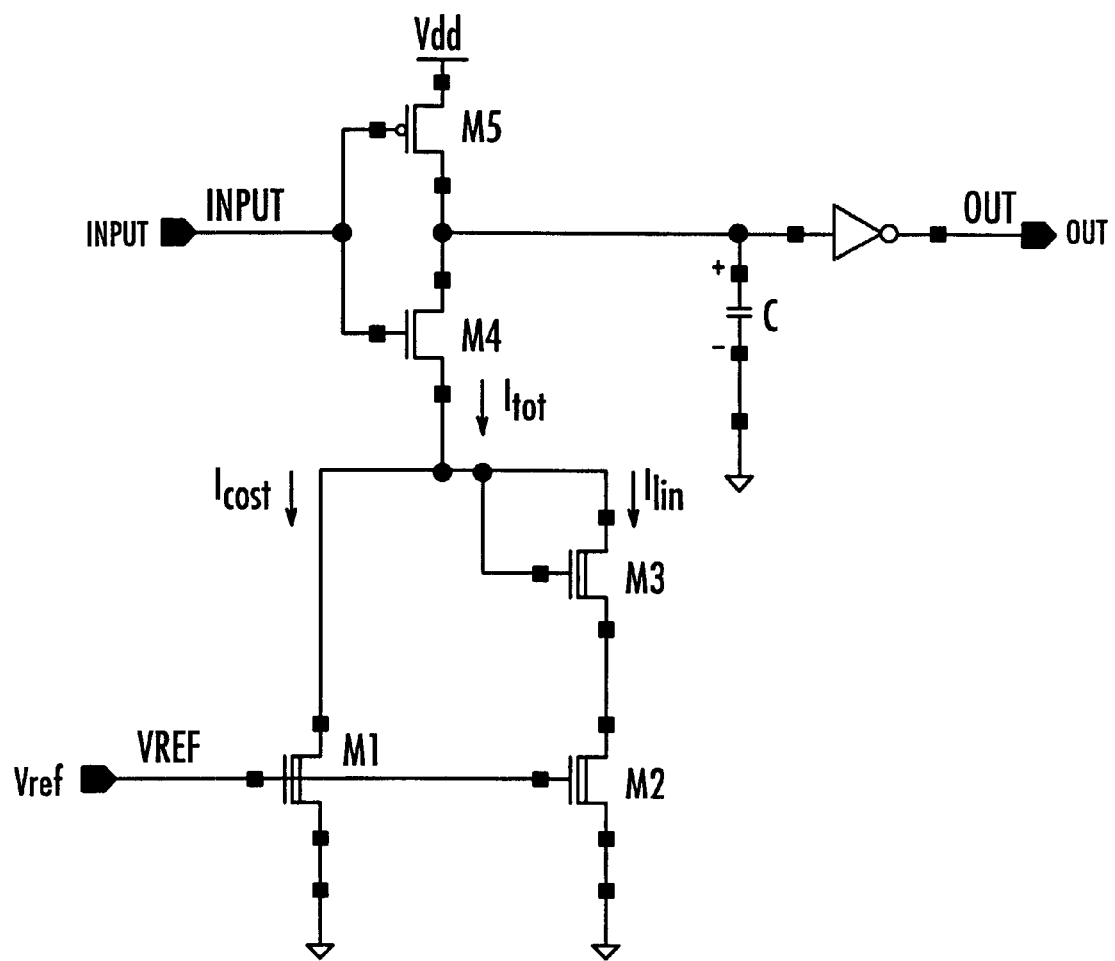
FIG. 35 is a diagram of a compensated delay circuit from temperature and supply voltage variations according to the present invention.

This type of drawback may be effectively overcome by using a circuit as the one depicted in FIG. 35, wherein the discharge network of the capacitor includes two branches. The first branch is formed by an n-channel transistor $M_1$, biased with the temperature compensated voltage $V_{ref}$, which behaves as a generator of a constant current $I_{const}$. The second branch is composed of a diode-connected n-channel transistor $M_3$, with the function of maintaining in a triode zone of the operating characteristic of the third transistor $M_2$, also biased with $V_{ref}$.

With $V_{ds2}=V_{in}-V_{gs4}-V_{gs3}$ and $V_{in}=V_{dd}$ (in a discharge phase of the capacitor), $M_2$ provides a current contribution $I_{1in}$ that increases with the supply voltage. Therefore, if the supply voltage $V_{dd}$ increases, the initial charge stored in the capacitor increases, but also the current contribution $I_{1in}$ increases with the resulting effect of maintaining substantially constant the time necessary for the voltage on the capacitor to drop to the triggering threshold of the output inverter (also dependent from the supply voltage). Therefore, the overall delay introduced by the circuit is maintained constant.

Figure 36:
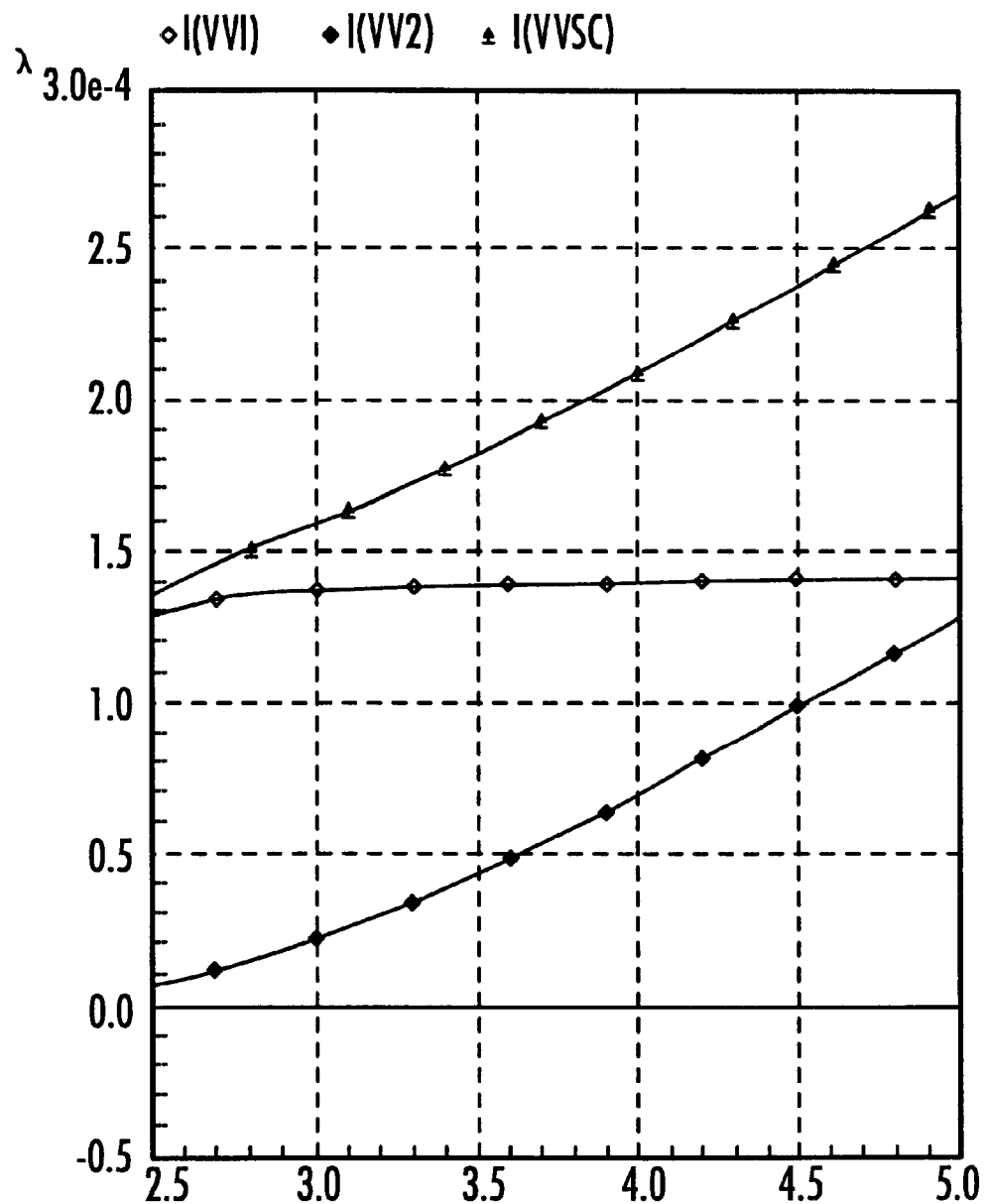
FIG. 36 shows the evolution of the currents in the circuit of FIG. 29 as a function of the supply voltage.

The change of the currents with the varying of the supply voltage $V_{dd}$ is shown in FIG. 36. By properly sizing the natural transistors of the second branch, it is possible to modulate the current Ilin such that its effect will be that of precisely counterbalancing, in terms of stabilizing the delay, the effect due to the variation of the supply voltage $V_{dd}$. The use of natural transistors that have a relatively stable threshold makes the delay less sensible to process spread.

Control of the Time of Equalization of the Sense Amplifiers

A known approach for the problem of controlling the equalization time includes using a dummy structure which, triggered upon the starting of the read cycle, produces a delay congruent with that of the decoding structure of the memory location, with the latter being critical.

Figure 37:
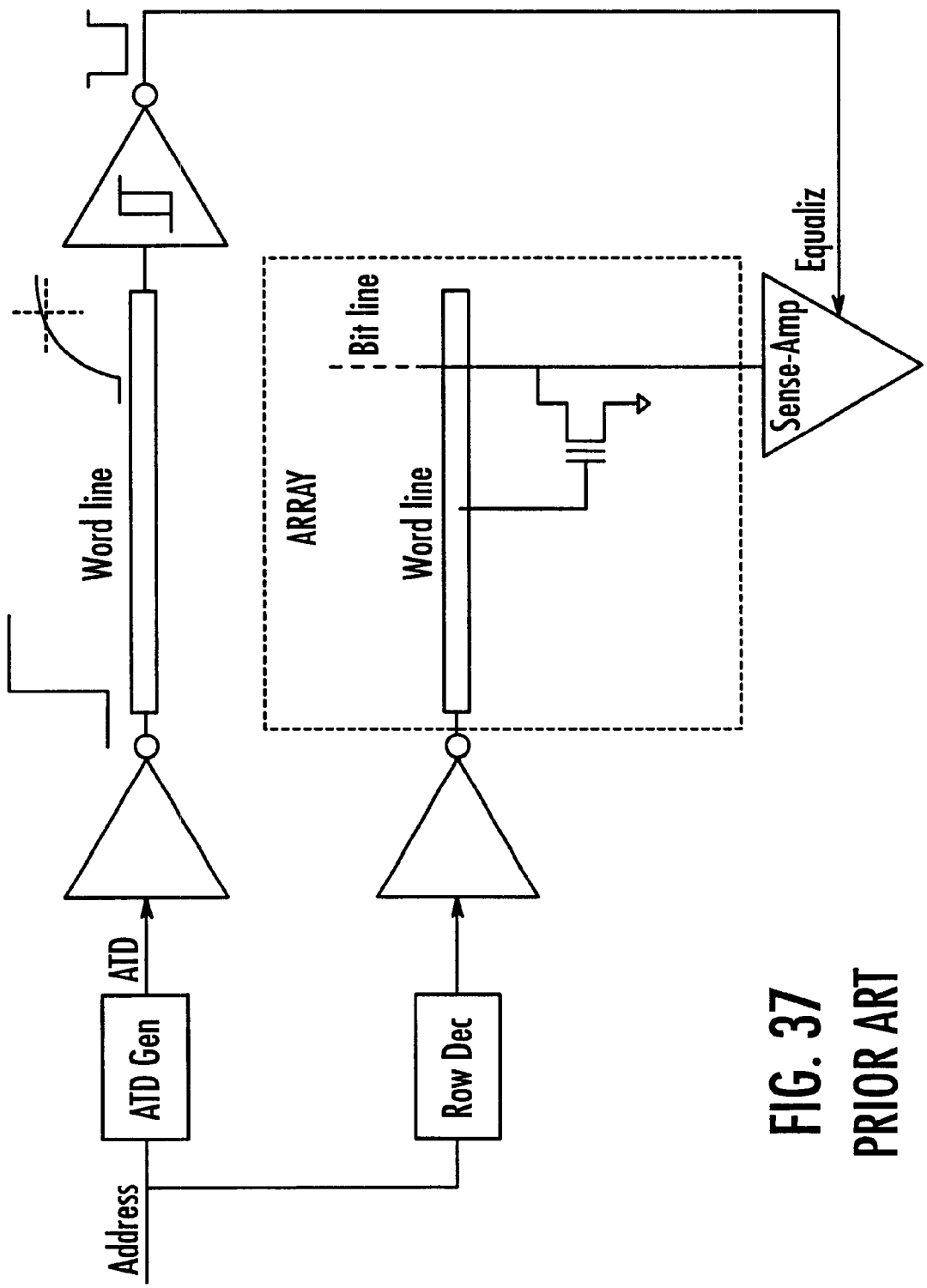
FIG. 37 is a known scheme of a dummy structure for controlling equalization according to the prior art.

By charging a dummy wordline, a more reliable estimation of the charging time of the actually selected wordline can be obtained. As depicted in FIG. 37, upon starting a read cycle such a dummy wordline is charged by way of a driver identical to the ones of the decoding circuitry, and through a threshold detector placed at the opposite end of the dummy wordline, the reaching of the required voltage level is detected. By releasing the equalization at such an instant, there is the certainty that even though the selected cell may be at the last location of the selected wordline, the voltage on its control gate would have reached a sufficient level.

In a memory device characterized by interleaved streams of the read data, it is necessary to trigger the start of sequential read cycles following a first random access read cycle and to synchronize them with the internal generation of sequentially incremented interleaved addresses. Moreover, because of the presence of two distinct banks, it is fundamental to distinguish the triggering of one bank from the other in order to implement a pipeline structure as described above and be able to outphase the consecutive readings.

Figure 38:
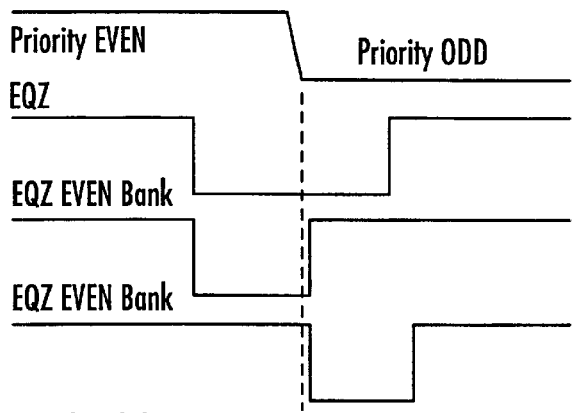
FIG. 38 shows the time diagrams of the control signals for the equalization phase according to the present invention.

With the decoding structures of the two banks separate and independent from each other, it is necessary to ensure that the sense amplifiers of one bank be equalized upon a selection of memory locations (cells) of the bank. Such a requirement could be managed the same way it outphases the readings. That is by using the PRIORITY signal and commuting at every read cycle to provide information on which bank is to be started, and from which to extract the data by generating the EQUALIZATION signal at every new cycle. This is done whether relative to the EVEN or ODD bank, and by conveying it to the appropriate bank as a function of the priority signal, as depicted in FIG. 38.

A drawback to this approach is the possibility of a change of priority while the dummy wordline is still charging. For example, occurring because of the forcing from outside a restart of the operation starting from a new address. This causes a slicing of the equalization signal, i.e., the initial portion for one bank and the end portion for the other bank.

Figure 39:
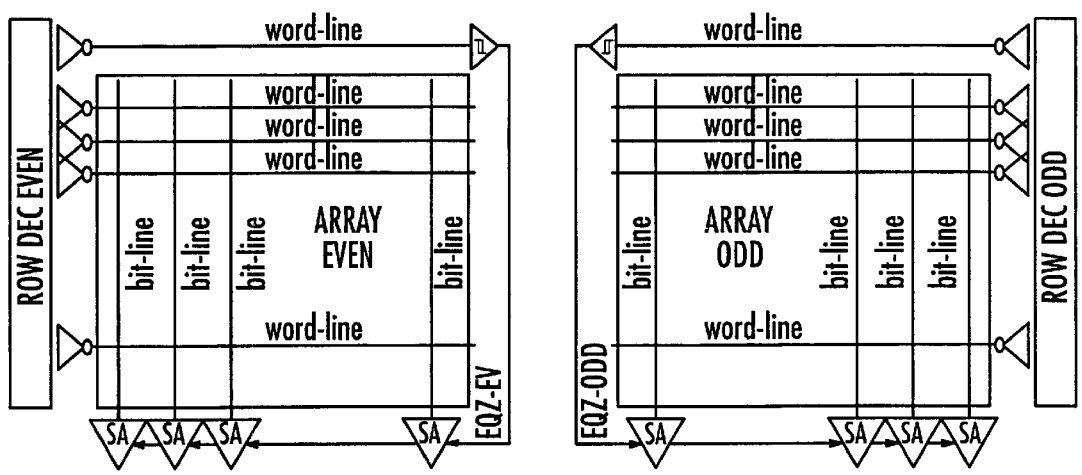
FIG. 39 is a diagram of the equalization structures duplicated for the two banks according to the present invention.

A most preferable and reliable approach is to use two dummy structures completely independent from the priority signal, but each dependent from the decoding circuitry of its respective bank. In this way, the specific equalization signal is always coherent with the start of the read cycle on the corresponding bank, as depicted in FIG. 39.

The fundamental advantage is to completely free the control of equalization from the type of access and from the signals used to manage the burst phases. The only determining factor for triggering equalization is the start of a read cycle on a certain bank, independently from what is happening on the other bank. The release of the equalization depends solely on verification that all the gates of the selected wordline of the specific bank in question have reached a correct read voltage.

Accelerated Carry Bit Propagation in the Address Counters

According to yet another preferred embodiment, the architecture of the invention adopts a peculiar approach for accelerating the propagation of the carry bit in the address counters of the two banks. This permits a faster incrementing of the address during a burst access synchronous mode of operation.

Figure 40:
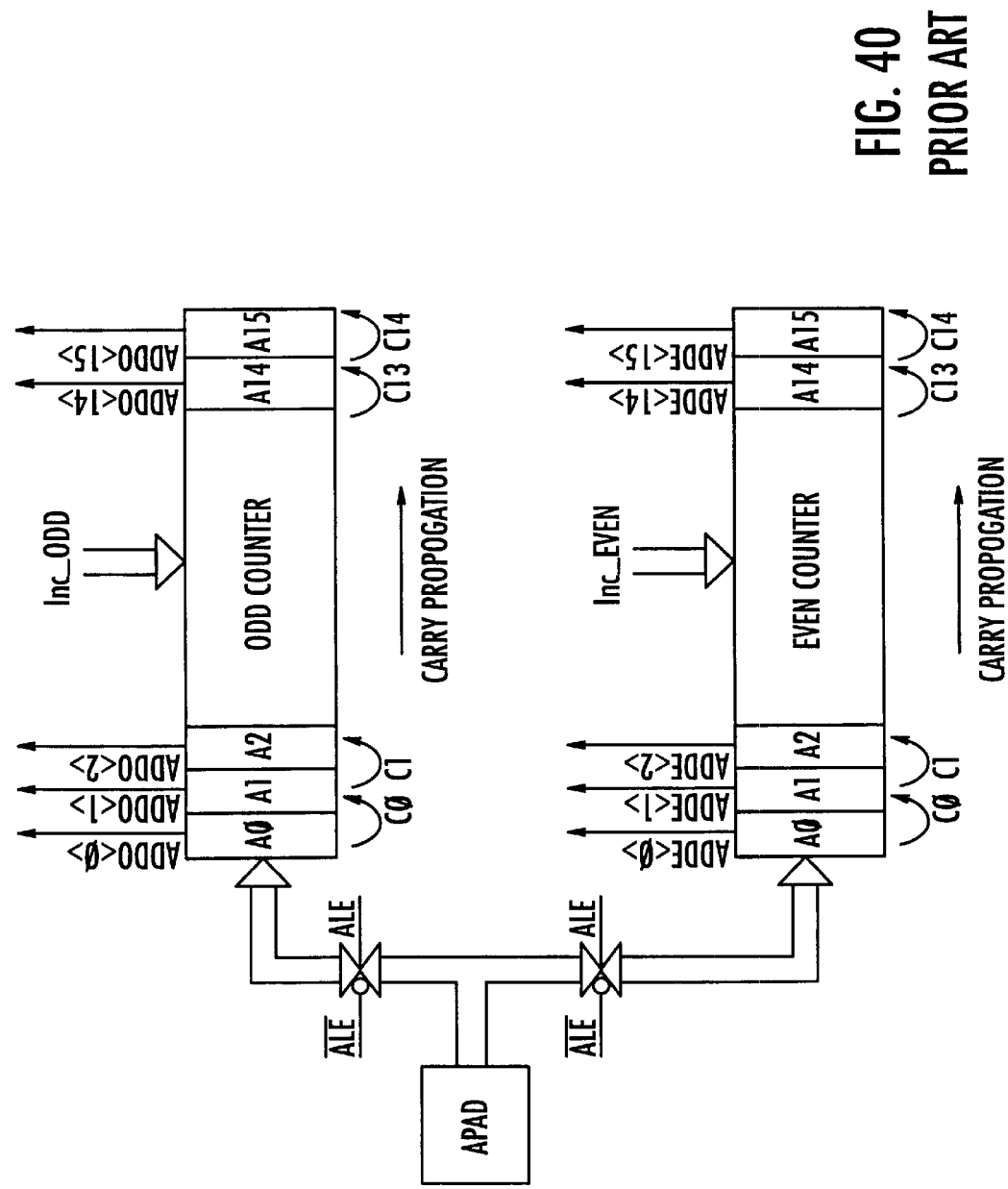
FIG. 40 is a conventional scheme of the address counters for the two banks of an interleaved memory according to the prior art.
Figure 41:
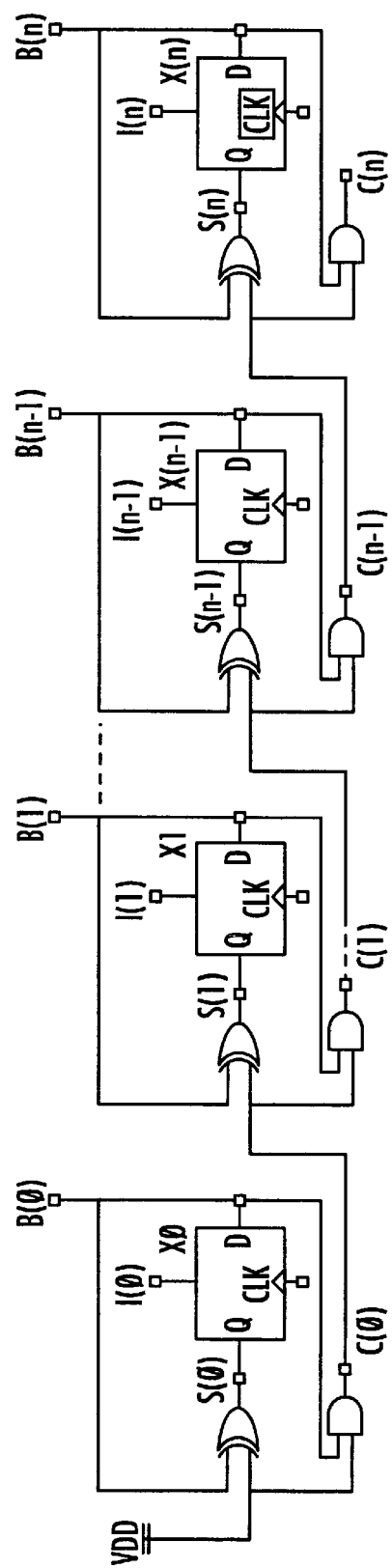
FIG. 41 is a circuit diagram of a binary counter according to the present invention.

A conventional diagram of a counter of addresses for the two banks of the interleaved memory is depicted for comparison purposes in FIG. 40. In the chain of propagation of the carry bit for binary counters that are commonly used as address counters, the carry bits are generated by carrying out a NAND operation (for example using a NAND gate followed by an nverter) between the address bits and the carry bit coming from the preceding stage. This is based upon the circuit diagram depicted in FIGS. 41 and 42.

This means that it is necessary to wait for the propagation of the signals through n-1 stages before having information on the carry bit of the $n^{th}$ stage. In case of counters with a large number of stages, the delay of such a propagation may be intolerable with high speed requirements.

Figure 42:
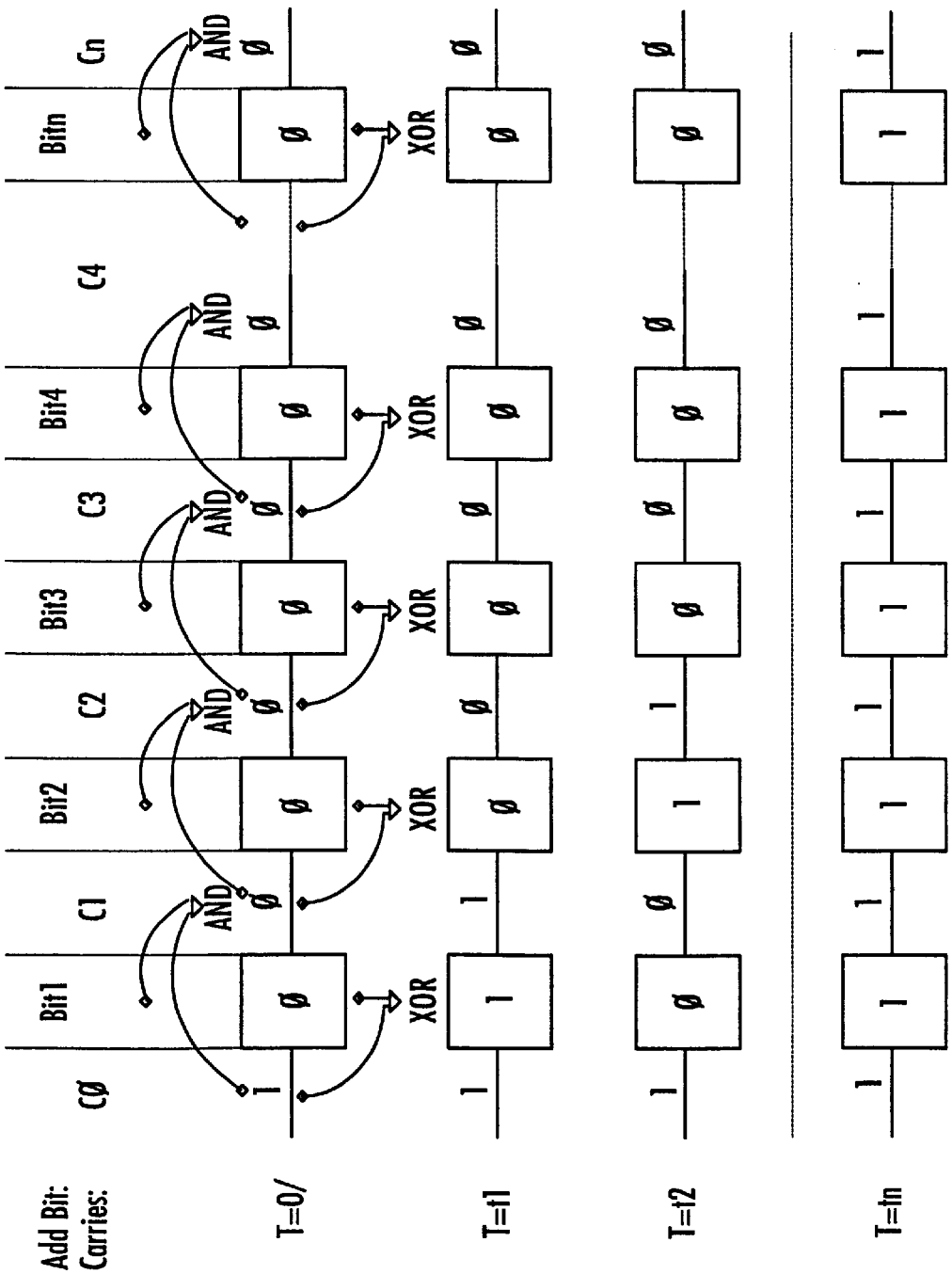
FIG. 42 shows the scheme of propagation of the carry signal in a conventional binary counter according to the prior art.
Figure 43:
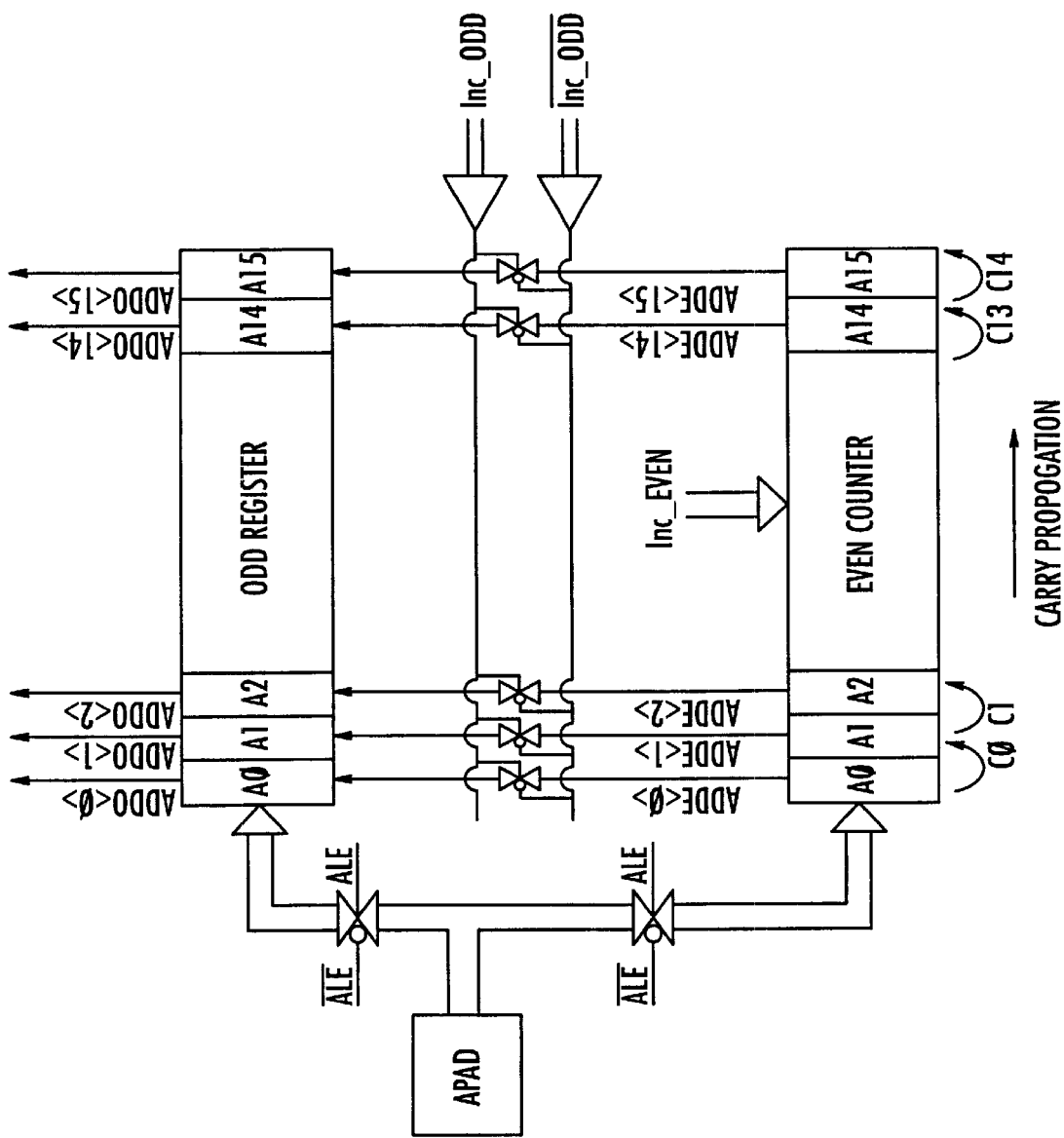
FIG. 43 shows the alternative scheme of the invention replacing the binary counter of the odd bank with a register according to the present invention.

In order to reduce such a delay in the architecture of the invention, a modified structure of the binary counter as depicted in FIGS. 42 and 43 may be advantageously used. Fundamentally, the propagation delay is used by dividing the propagation path between the first and the last stage of the counter. In this way, the delay that would occur if the CARRY should cross conventionally all the stages may be reduced.

On the other hand, the structure itself of the internal address counter of the two banks of the interleaved memory of the invention may be greatly simplified by recognizing that during a burst access phase of operation, the succession of read stimulation pulses (RD) is interleaved between the EVEN and ODD banks.

Moreover, according to an aspect of the architecture of the invention, the incrementing of the address counters of the EVEN bank and of the ODD bank are produced by distinct increment pulses, namely INC_EVEN and INC_ODD. These are generated by the respective timing circuits EVEN READ TIMING and ODD READ TIMING and fundamentally it is always the EVEN bank that is the first to receive address incrementing pulses. The latter recognition is crucial to permit a hardware simplification.

According to a burst access protocol, the memory does not actually need two distinct counters for separately incrementing the internal addresses of the bank EVEN and of the bank ODD, because, when an increment of address of the bank EVEN occurs, the successive increment of the address of the bank ODD does not produce anything else than the same address of the bank EVEN because of the outphasing.

This permits the hardware simplification of using instead of a distinct address counter for the ODD bank, a much simpler register in which to systematically copy and store the content of the address counter of the EVEN bank as addresses for the ODD bank, according to the scheme of FIG. 43.

In practice, the content of the EVEN COUNTER of the EVEN bank are copied on the ODD REGISTER of the addresses of the ODD bank, each time an increment pulse INC_ODD of the internal addresses of the bank ODD arrives. The content is copied in the register and remains stored until the next incrementing pulse.

The number of transistors necessary for implementing the register is less than the number necessary to form a binary counter. Moreover, the increment of the address counter of the ODD bank may be carried out at a higher speed because the delay of propagation of the carry bit associated to a conventional counter is no longer influencing the incrementing of addresses of the ODD bank. Other advantages are obtained by avoiding a duplication of the address bus as it is necessary when using two binary counters.

Precharge Circuit for the Output Buffers

While in a standard memory device, the reading of the new data by the sense amplifiers and the transfer thereof to the output takes place in distinct instants. Therefore, the effect of the switching noise is more easily controlled in an interleaved memory as the one of the present invention. Each output buffer serves two distinct banks of the memory array that alternatively transfer thereto the read data.

Through a common internal data bus, the sense amplifiers of one of the two banks transfer a new read data toward the output. Therefore, reading performed by the sense amplifiers of one of the banks and the loading of a previously read data in the output buffers may be simultaneous. It is evident the importance of exerting a refined control of the internal switching noise.

An appreciable reduction of the noise may be obtained by limiting the maximum current that is absorbed by the system during the output switching. However, this may slow down the response of the system in contrast to specification. A particularly effective approach is adopted in the device of the invention that permits reduction of the noise peak on the supply rails without altering the time of response of the memory by spreading its potential intensity over different reading phases.

Figure 44:
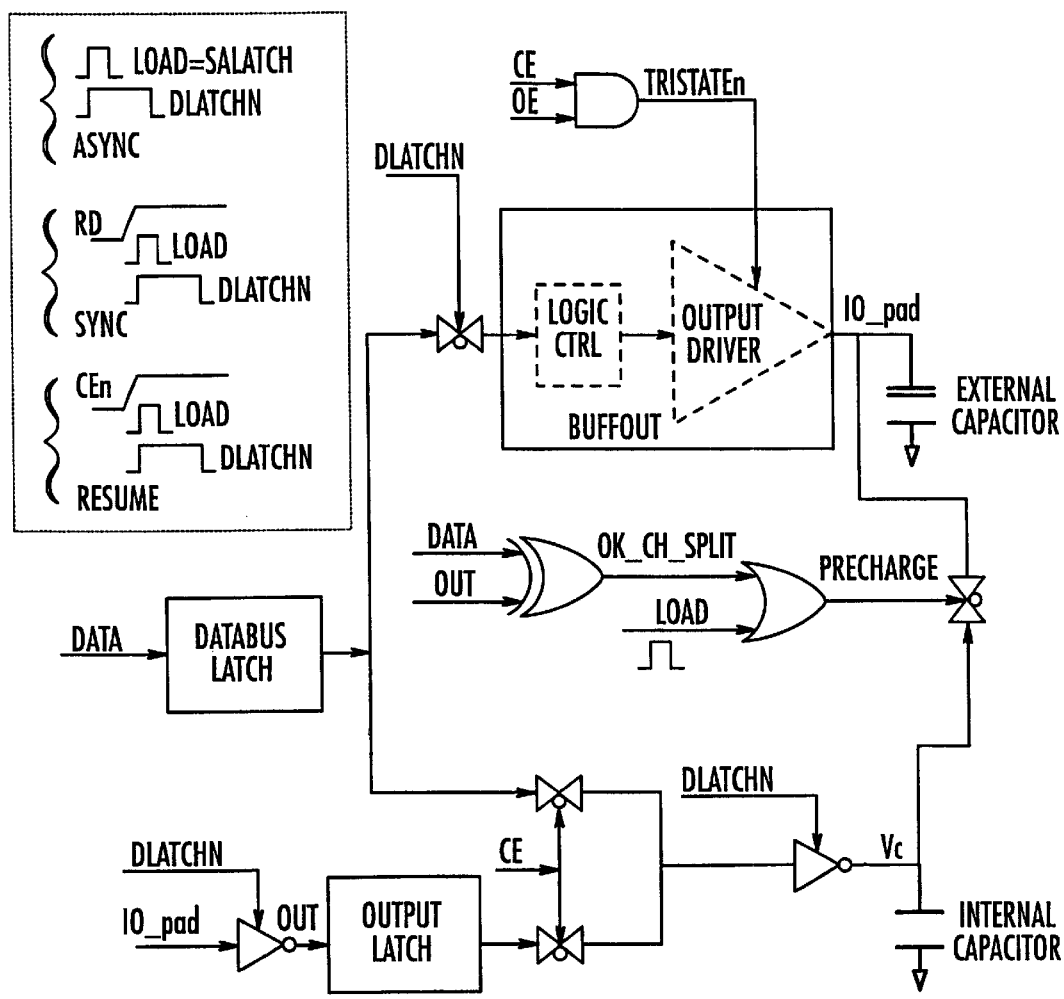
FIG. 44 is a precharging scheme of the data output nodes according to the present invention.

This approach is that of a charge splitting between two capacitors for accumulating the electrical charge necessary to charge or discharge the output capacitor without increasing the peak current flowing in the supply lines at the switching instants. FIG. 44 shows a functional logic scheme of the approach. The internal capacitor is used for assisting the charging and discharging of the output capacitance under the different modes of operation of the memory device.

In asynchronous and synchronous modes, the control logic permits charging or discharging of the output capacitance to a level opposite to that of the outputs in a phase in which the outputs do not switch (DLATCH=0).

Every time a new data is ready to be output, two signals LOAD and DLATCHN of different duration are generated, as already described above. The LOAD signal is used for precharging the output capacitance if the new bit value is different from the preceding one (OK_CH_SPLIT=1). Such a precharging is done only in the initial phase of the switching in order to bring the output node to an intermediate voltage level. Simultaneously, the new data propagates in the BUFFOUT block and turns on the output drivers. Soon after this precharge phase, the pass-gate is turned off to permit the driver to charge only the output capacitance.

Figure 45:
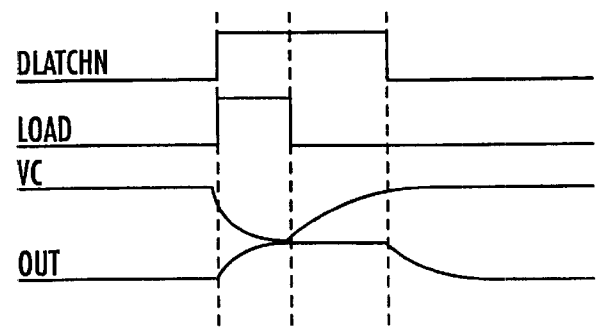
FIG. 45 shows the signals of the precharge circuit according to the present invention.

Moreover, the DLATCHN signal is used for disabling the driver that charges the internal capacitance during the switching of the outputs. The buffer that picks up the output bit is re-enabled whenever there may be doubt that the output has switched. The time diagram of FIG. 45 illustrates the above described mechanisms.

When the memory device is in stand-by phase, the internal capacitance is precharged to the logic level of the data. In such a phase, the output bus is not managed by the memory but may be accessed by other external devices. Upon resuming from a stand-by, the data present internally must be loaded in the output. Even in this situation, the system generates the LOAD and DLATCHN signals and the above described output mechanism is reproduced.

As may be observed in FIG. 44, the updating of the output is directly correlated to the end of the reading. This is besides the external control exerted by the protocol signals CEn and OEn that may disable the output circuit bringing it in a tristate condition (high impedance).

That which is claimed is:

1. An interleaved memory for operating in a sequential access synchronous read mode and in a random access asynchronous read mode and comprising:

an array of memory cells divided into a first bank of memory cells and a second bank of memory cells;

first and second address counters respectively coupled to said first and second banks of memory cells;

an address transition detector circuit for generating an address transition detecting signal based upon a change of an address acquired during the random access asynchronous read mode and upon generation of an increment pulse by one of said first and second address counters in the sequential access synchronous read mode;

first and second decoding circuits respectively coupled to said first and second banks of memory cells and being functionally independent from each other;

first and second reading circuits respectively coupled to said first and second banks of memory cells and being functionally independent from each other;

a plurality of output data buffers coupled to said first and second reading circuits;

an internal data bus connected to said first and second reading circuits for transferring data stored therein to said plurality of output data buffers based upon a load signal specific to one of said first and second banks of memory cells; and a control circuit connected to said plurality of output data buffers and having inputs for receiving a first external command signal and a second external command signal for enabling the interleaved memory, for generating the load signal and for discriminating a reading mode requested from a protocol of use.

2. An interleaved memory according to claim 1, wherein a transition to a first logic state for the first external command signal enables acquisition of an input address and starts a new random access asynchronous read mode with a simultaneous activation of said respective reading circuits, and wherein the first external command signal maintains the interleaved memory in the random access asynchronous read mode when in the first logic state.

3. An interleaved memory according to claim 2, wherein a second logic state for the first external command signal causes switching to the sequential access synchronous read mode by generating within said control circuit a first increment pulse for one of said first and second address counters not in priority, for implementing an outphasing between said first and second banks of memory cells from a first sequential access synchronous read mode and generating the address transition detecting signal for said first or second bank of memory cells not in priority.

4. An interleaved memory according to claim 1, wherein the second external command signal functions as a clock for transferring data read from said first or second bank of memory cells currently in priority, and is established by a value of a least significant bit of the acquired address.

5. An interleaved memory according to claim 1, wherein a sequential and interleaved reading of data stored in said first and second banks of memory cells progresses under control of the second external command signal for stimulating reading and for the load signal.

6. An interleaved memory according to claim 1, wherein said first and second reading circuits each comprises:

an array of sense amplifiers coupled to a respective bank of memory cells; and a dummy wordline and a dummy sense amplifier connected thereto for controlling an equalization phase of said array of sense amplifiers for said respective bank of memory cells.

7. An interleaved memory according to claim 6, wherein each reading circuit further comprises:

a plurality of latches coupled in cascade to outputs of said array of sense amplifiers; and a logic circuit for enabling sensing, terminating the sensing and latching read data in said respective plurality of latches.

8. An interleaved memory according to claim 1, wherein said address transition detector circuit comprises at least three monostable circuits, with a first monostable circuit being enabled by the first external command signal for generating the address transition detecting signal directed to said first and second banks of memory cells, and a second and third monostable circuit being driven respectively by the increment pulse from said first and second address counters for generating respective address transition detecting signals for said first and second banks of memory cells.

9. An interleaved memory according to claim 1, further comprising a regeneration circuit for internal regeneration of the first external command signal.

10. An interleaved memory according to claim 9, wherein said regeneration circuit comprises:

at least one input latch for storing the first external command signal;

at least one logic gate for combining an output signal from said at least one input latch with the second external command signal for producing a first internal replica signal;

an input pad for receiving the second external command signal;

delay circuits coupled in cascade to an output of said at least one input latch and to said input pad;

a logic circuit for combining the first internal replica signal and the output signal from said at least one input latch with signals delayed by said delay circuits for producing set and reset signals; and an output flip-flop circuit having inputs for receiving the set and reset signals and an output for producing a second internal replica signal having a leading edge that is delayed with respect to a leading edge of the first external command signal and a duration that is increased to prevent non-synchronization between the first and second external command signals under the different read modes of the interleaved memory.

11. An interleaved memory according to claim 1, wherein said first and second address counters each comprises a plurality of stages; and wherein propagation of a carry bit through said first and second address counters is accelerated by reducing an effective number of stages of propagation of the carry bit by anticipating each $n^{th}$ carry bit by coupling together two or more stages of a respective first or second address counter.

12. An interleaved memory according to claim 11, wherein a function of said second address counter for said second bank of memory cells comprises a register onto which contents of said first address counter of said first bank of memory cells are copied and stored upon each increment pulse of the address of said second bank of memory cells.

13. An interleaved memory according to claim 1, wherein said control circuit comprises an increment pulse circuit for generating the increment pulse for said first and second banks of memory cells.

14. An interleaved memory according to claim 13, wherein said increment pulse circuit comprises:
   a first multiplexer having inputs for receiving a signal based upon a logic function of the first external control signal, the second external control signal and the load signal for new read data in said plurality of output data buffers;
   a selection circuit connected to said first multiplexer for selecting between the sequential access synchronous read mode and the random access asynchronous read mode as a function of a combination of the first external command signal, the second external command signal and a trailing edge of the increment pulse;
   a pulse generator being enabled by the second external control signal and being driven by an output of said first multiplexer for generating the increment pulses for said first and second address counters of said first and second banks of memory cells with a constant duty cycle independently from variation of a supply voltage and temperature; and
   an output demultiplexer receiving the increment pulses for providing each increment pulse toward said first or second banks of memory cells as a function of a control signal representing a state of priority of at least one of said first or second banks of memory cells, and switching at an end of each increment pulse sent to one of said first or second banks of memory cells.

15. An interleaved memory according to claim 7, further comprising a pass-gate for enabling transfer of read data stored in said latches to said plurality of output data buffers based upon a signal generated by said control circuit; and wherein said plurality of output data buffers are enabled based upon a logic function of the second external command signal and a third external command signal.

16. An interleaved memory comprising:
   an array of memory cells divided into a first bank of memory cells and a second bank of memory cells;
   first and second address counters respectively coupled to said first and second banks of memory cells;
   an address transition detector circuit for generating an address transition detecting signal based upon a change of an address acquired during a random access asynchronous read mode and upon generation of an increment pulse by one of said first and second address counters in a sequential access synchronous read mode;
   first and second decoding circuits respectively coupled to said first and second banks of memory cells;
   first and second reading circuits respectively coupled to said first and second banks of memory cells;
   a plurality of output data buffers coupled to said first and second reading circuits, and having inputs for receiving data therefrom based upon a load signal specific to one of said first and second banks of memory cells; and
   a control circuit connected to said plurality of output data buffers and having inputs for receiving a first external command signal and a second external command signal for enabling the interleaved memory, for generating the load signal and for discriminating a reading mode requested from a protocol of use, and
   a transition to a first logic state for the first external command signal enables acquisition of an input address and starts a new random access asynchronous read mode with a simultaneous activation of said respective reading circuits, and a transition to a second logic state for the first external signal causes switching to the sequential access synchronous read mode by generating within said control circuit a first increment pulse for one of said first and second address counters not in priority, and the second external command signal functions as a clock for transferring data read from said first or second bank of memory cells currently in priority.

17. An interleaved memory according to claim 16, wherein the first external command signal maintains the interleaved memory in the random access asynchronous read mode when in the first logic state.

18. An interleaved memory according to claim 17, wherein the second logic state for the first external signal implements an outphasing between said first and second banks of memory cells from a first sequential access synchronous read mode and generates the address transition detecting signal for said first or second bank of memory cells not in priority.

19. An interleaved memory according to claim 16, wherein the second external command signal is established by a value of a least significant bit of the acquired address.

20. An interleaved memory according to claim 16, wherein a sequential and interleaved reading of data stored in said first and second banks of memory cells progresses under control of the second external command signal for stimulating reading and for the load signal.

21. An interleaved memory according to claim 16, wherein said first and second reading circuits each comprises:
   an array of sense amplifiers coupled to a respective bank of memory cells; and
   a dummy wordline and a dummy sense amplifier connected thereto for controlling an equalization phase of said array of sense amplifiers for said respective bank of memory cells.

22. An interleaved memory according to claim 21, wherein each reading circuit further comprises:
   a plurality of latches coupled in cascade to outputs of said array of sense amplifiers; and
   a logic circuit for enabling sensing, terminating the sensing and latching read data in said respective plurality of latches.

23. An interleaved memory according to claim 16, wherein said address transition detector circuit comprises at least three monostable circuits, with a first monostable circuit being enabled by the first external command signal for generating the address transition detecting signal directed to said first and second banks of memory cells, and a second and third monostable circuit being driven respectively by the increment pulse from said first and second address counters for generating respective address transition detecting signals for said first and second banks of memory cells.

24. An interleaved memory according to claim 16, further comprising a regeneration circuit for internal regeneration of the first external command signal.

25. An interleaved memory according to claim 24, wherein said regeneration circuit comprises:
- at least one input latch for storing the first external command signal;
- at least one logic gate for combining an output signal from said at least one input latch with the second external command signal for producing a first internal replica signal;
- an input pad for receiving the second external command signal;
- delay circuits coupled in cascade to an output of said at least one input latch and to said input pad;
- a logic circuit for combining the first internal replica signal and the output signal from said at least one input latch with signals delayed by said delay circuits for producing set and reset signals; and
- an output flip-flop circuit having inputs for receiving the set and reset signals and an output for producing a second internal replica signal having a leading edge that is delayed with respect to a leading edge of the first external command signal and a duration that is increased to prevent non-synchronization between the first and second external command signals under the different read modes of the interleaved memory.

26. An interleaved memory according to claim 16, wherein said first and second address counters each comprises a plurality of stages; and wherein propagation of a carry bit through said first and second address counters is accelerated by reducing an effective number of stages of propagation of the carry bit by anticipating each $n^{th}$ carry bit by coupling together two or more stages of a respective first or second address counter.

27. An interleaved memory according to claim 26, wherein a function of said second address counter for said second bank of memory cells comprises a register onto which contents of said first address counter of said first bank of memory cells are copied and stored upon each increment pulse of the address of said second bank of memory cells.

28. An interleaved memory according to claim 16, wherein said control circuit comprises an increment pulse circuit for generating the increment pulse for said first and second banks of memory cells.

29. An interleaved memory according to claim 28, wherein said increment pulse circuit comprises:
- a first multiplexer having inputs for receiving a signal based upon a logic function of the first external control signal, the second external control signal and the load signal for new read data in said plurality of output data buffers;
- a selection circuit connected to said first multiplexer for selecting between the sequential access synchronous read mode and the random access asynchronous read mode as a function of a combination of the first external command signal, the second external command signal and a trailing edge of the increment pulse;
- a pulse generator being enabled by the second external control signal and being driven by an output of said first multiplexer for generating the increment pulses for said first and second address counters of said first and second banks of memory cells with a constant duty cycle independently from variation of a supply voltage and temperature; and
- an output demultiplexer receiving the increment pulses for providing each increment pulse toward said first or second banks of memory cells as a function of a control signal representing a state of priority of at least one of said first or second banks of memory cells, and switching at an end of each increment pulse sent to one of said first or second banks of memory cells.

30. An interleaved memory according to claim 22, further comprising a pass-gate for enabling transfer of read data stored in said latches to said plurality of output data buffers based upon a signal generated by said control circuit; and wherein said plurality of output data buffers are enabled based upon a logic function of the second external command signal and a third external command signal.

31. An interleaved memory for operating in a sequential access synchronous read mode and in a random access asynchronous read mode and comprising:
- an array of memory cells divided into a first bank of memory cells and a second bank of memory cells;
- first and second decoding circuits respectively coupled to said first and second banks of memory cells;
- first and second reading circuits respectively coupled to said first and second banks of memory cells;
- a plurality of output data buffers coupled to said first and second reading circuits, and having inputs for receiving data therefrom based upon a load signal specific to one of said first and second banks of memory cells; and
- a control circuit connected to said plurality of output data buffers and having inputs for receiving a first external command signal and a second external command signal for enabling the interleaved memory, for generating the load signal and for discriminating a reading mode requested from a protocol of use.

32. An interleaved memory according to claim 31, wherein said first and second decoding circuits are functionally independent from each other; and wherein said first and second reading circuits are functionally independent from each other.

33. An interleaved memory according to claim 31, further comprising:
- first and second address counters respectively coupled to said first and second banks of memory cells; and
- an address transition detector circuit for generating an address transition detecting signal based upon a change of an address acquired during the random access asynchronous read mode and upon generation of an increment pulse by one of said first and second address counters in the sequential access synchronous read mode.

34. An interleaved memory according to claim 31, wherein a transition to a first logic state for the first external command signal enables acquisition of an input address and starts a new random access asynchronous read mode with a simultaneous activation of said respective reading circuits, and wherein the first external command signal maintains the interleaved memory in the random access asynchronous read mode when in the first logic state.

35. An interleaved memory according to claim 34, wherein a second logic state for the first external signal causes switching to the sequential access synchronous read mode by generating within said control circuit a first increment pulse for one of said first and second banks of memory cells not in priority, for implementing an outphasing between said first and second banks of memory cells from a first sequential access synchronous read mode and generating an address transition detecting signal for said first or second bank of memory cells not in priority.

36. An interleaved memory according to claim 31, wherein the second external command signal functions as a clock for transferring data read from said first or second bank of memory cells currently in priority, and is established by a value of a least significant bit of the acquired address.

37. An interleaved memory according to claim 31, wherein a sequential and interleaved reading of data stored in said first and second banks of memory cells progresses under control of the second external command signal for stimulating reading and for the load signal.

38. An interleaved memory according to claim 31, wherein said first and second reading circuits each comprises:
   an array of sense amplifiers coupled to a respective bank of memory cells; and
   a dummy wordline and a dummy sense amplifier connected thereto for controlling an equalization phase of said array of sense amplifiers for said respective bank of memory cells.

39. An interleaved memory according to claim 38, wherein each reading circuit further comprises:
   a plurality of latches coupled in cascade to outputs of said array of sense amplifiers; and
   a logic circuit for enabling sensing, terminating the sensing and latching read data in said respective plurality of latches.

40. An interleaved memory according to claim 33, wherein said address transition detector circuit comprises at least three monostable circuits, with a first monostable circuit being enabled by the first external command signal for generating the address transition detecting signal directed to said first and second banks of memory cells, and a second and third monostable circuit being driven respectively by the increment pulse from said first and second address counters for generating respective address transition detecting signals for said first and second banks of memory cells.

41. An interleaved memory according to claim 31, further comprising a regeneration circuit for internal regeneration of the first external command signal.

42. An interleaved memory according to claim 41, wherein said regeneration circuit comprises:
   at least one input latch for storing the first external command signal;
   at least one logic gate for combining an output signal from said at least one input latch with the second external command signal for producing a first internal replica signal;
   an input pad for receiving the second external command signal;
   delay circuits coupled in cascade to an output of said at least one input latch and to said input pad;
   a logic circuit for combining the first internal replica signal and the output signal from said at least one input latch with signals delayed by said delay circuits for producing set and reset signals; and
   an output flip-flop circuit having inputs for receiving the set and reset signals and an output for producing a second internal replica signal having a leading edge that is delayed with respect to a leading edge of the first external command signal and a duration that is increased to prevent non-synchronization between the first and second external command signals under the different-read modes of the interleaved memory.

43. An interleaved memory according to claim 33, wherein said first and second address counters each comprises a plurality of stages; and wherein propagation of a carry bit through said first and second address counters is accelerated by reducing an effective number of stages of propagation of the carry bit by anticipating each $n^{th}$ carry bit by coupling together two or more stages of a respective first or second address counter.

44. An interleaved memory according to claim 43, wherein a function of said second address counter for said second bank of memory cells comprises a register onto which contents of said first address counter of said first bank of memory cells are copied and stored upon each increment pulse of the address of said second bank of memory cells.

45. A method for reading an interleaved memory in a sequential access synchronous read mode and in a random access asynchronous read mode, the interleaved memory comprising an array of memory cells divided into a first bank of memory cells and a second bank of memory cells; first and second address counters respectively coupled to the first and second banks of memory cells; first and second decoding circuits respectively coupled to said first and second banks of memory cells; first and second reading circuits respectively coupled to said first and second banks of memory cells; and a plurality of output data buffers coupled to the first and second reading circuits; the method comprising:
   generating an address transition detecting signal based upon a change of an address acquired during the random access asynchronous read mode and upon generation of an increment pulse by one of the first and second address counters in the sequential access synchronous read mode;
   transferring data stored in the first and second reading circuits to the plurality of output data buffers based upon a load signal specific to one of the first and second banks of memory cells; and
   enabling the interleaved memory, generating the load signal and discriminating a reading mode requested from a protocol of use based upon a first external command signal and a second external command signal.

46. A method according to claim 45, wherein a transition to a first logic state for the first external command signal enables acquisition of an input address and starts a new random access asynchronous read mode with a simultaneous activation of the respective reading circuits, and the first external command signal maintains the interleaved memory in the random access asynchronous read mode when in the first logic state.

47. A method according to claim 46, wherein a second logic state for the first external signal causes switching to the sequential access synchronous read mode by generating within the control circuit a first increment pulse for one of the first and second address counters not in priority, for implementing an outphasing between the first and second banks of memory cells from a first sequential access synchronous read mode and generating the address transition detecting signal for the first or second bank of memory cells not in priority.

48. A memory according to claim 45, wherein the second external command signal functions as a clock for transferring data read from the first or second bank of memory cells currently in priority, and is established by a value of a least significant bit of the acquired address.

49. A method according to claim 45, wherein a sequential and interleaved reading of data stored in the first and second banks of memory cells progresses under control of the second external command signal for stimulating reading and for the load signal.

50. An interleaved memory according to claim 45, wherein the address transition detector circuit comprises at least three monostable circuits, with a first monostable circuit being enabled by the first external command signal for generating the address transition detecting signal directed to the first and second banks of memory cells, and a second and third monostable circuit being driven respectively by the increment pulse from the address counter for one of the first and second banks of memory cells and by the increment pulse from the first and second address counters for generating respective address transition detecting signals for the first and second banks of memory cells.

51. A method according to claim 45, further comprising regenerating the first external command signal within the interleaved memory.

52. A memory according to claim 45, wherein the first and second address counters each comprises a plurality of stages; and wherein propagation of a carry bit through the first and second address counters is accelerated by reducing an effective number of stages of propagation of the carry bit by anticipating each $n^{th}$ carry bit by coupling together two or more stages of a respective first or second address counter.

53. A method according to claim 52, wherein a function of the second address counter for the second bank of memory cells comprises a register onto which contents of the first address counter of the first bank of memory cells are copied and stored upon each increment pulse of the address of the second bank of memory cells.

* * * * *